(12) United States Patent
Takuma et al.

(10) Patent No.: US 11,844,222 B2
(45) Date of Patent: Dec. 12, 2023

(54) THREE-DIMENSIONAL MEMORY DEVICE WITH BACKSIDE SUPPORT PILLAR STRUCTURES AND METHODS OF FORMING THE SAME

(71) Applicant: SANDISK TECHNOLOGIES LLC, Addison, TX (US)

(72) Inventors: Shunsuke Takuma, Yokkaichi (JP); Yuji Totoki, Yokkaichi (JP); Seiji Shimabukuro, Yokkaichi (JP); Tatsuya Hinoue, Yokkaichi (JP); Kengo Kajiwara, Yokkaichi (JP); Akihiro Tobioka, Yokkaichi (JP)

(73) Assignee: SANDISK TECHNOLOGIES LLC, Addison, TX (US)

( * ) Notice: Subject to any disclaimer, the term of this patent is extended or adjusted under 35 U.S.C. 154(b) by 254 days.

(21) Appl. No.: 17/146,866

(22) Filed: Jan. 12, 2021

(65) Prior Publication Data
US 2022/0223614 A1     Jul. 14, 2022

(51) Int. Cl.
| | |
|---|---|
| *H10B 43/50* | (2023.01) |
| *H01L 23/522* | (2006.01) |
| *H01L 23/00* | (2006.01) |
| *H10B 41/27* | (2023.01) |
| *H10B 41/50* | (2023.01) |
| *H10B 43/27* | (2023.01) |

(52) U.S. Cl.
CPC ......... *H10B 43/50* (2023.02); *H01L 23/5226* (2013.01); *H01L 23/562* (2013.01); *H10B 41/27* (2023.02); *H10B 41/50* (2023.02); *H10B 43/27* (2023.02)

(58) Field of Classification Search
None
See application file for complete search history.

(56) References Cited

U.S. PATENT DOCUMENTS

| | | |
|---|---|---|
| 5,915,167 A | 6/1999 | Leedy |
| 9,543,318 B1 | 1/2017 | Lu et al. |

(Continued)

OTHER PUBLICATIONS

Endoh et al., "Novel Ultra High Density Memory with a Stacked-Surrounding Gate Transistor (S-SGT) Structured Cell," IEDM Proc. (2001) 33-36.

(Continued)

*Primary Examiner* — Sarah K Salerno
(74) *Attorney, Agent, or Firm* — THE MARBURY LAW GROUP PLLC

(57) ABSTRACT

At least one vertically alternating sequence of continuous insulating layers and continuous sacrificial material layers is formed over a substrate. Rows of backside support pillar structures are formed through the at least one vertically alternating sequence. Memory stack structures are formed through the at least one vertically alternating sequence. A two-dimensional array of discrete backside trenches is formed through the at least one vertically alternating sequence. Contiguous combinations of a subset of the backside trenches and a subset of the backside support pillar structures divide the at least one vertically alternating sequence into alternating stacks of insulating layers and sacrificial material layers. The sacrificial material layers are replaced with electrically conductive layers while the backside support pillar structures provide structural support to the insulating layers.

3 Claims, 60 Drawing Sheets

(56) References Cited

U.S. PATENT DOCUMENTS

| | | | |
|---|---|---|---|
| 9,679,906 | B2 | 6/2017 | Lu et al. |
| 10,115,681 | B1 | 10/2018 | Ariyoshi |
| 2017/0358593 | A1 | 12/2017 | Yu et al. |
| 2019/0259881 | A1 | 8/2019 | Kim et al. |
| 2019/0371809 | A1 | 12/2019 | Yun et al. |
| 2020/0235120 | A1 | 7/2020 | Kai et al. |
| 2020/0251485 | A1 | 8/2020 | Kakazu et al. |

OTHER PUBLICATIONS

U.S. Appl. No. 16/547,971, filed Aug. 22, 2019, SanDisk Technologies LLC.
U.S. Appl. No. 16/675,459, filed Nov. 6, 2019, SanDisk Technologies LLC.
U.S. Appl. No. 16/782,307, filed Feb. 5, 2020, SanDisk Technologies LLC.
U.S. Appl. No. 16/627,990, filed Mar. 24, 2020, SanDisk Technologies LLC.
U.S. Appl. No. 16/876,370, filed May 18, 2020, SanDisk Technologies LLC.
U.S. Appl. No. 16/881,346, filed May 22, 2020, SanDisk Technologies LLC.
U.S. Appl. No. 16/881,401, filed May 22, 2020, SanDisk Technologies LLC.
U.S. Appl. No. 16/921,146, filed Jul. 6, 2020, SanDisk Technologies LLC.
U.S. Appl. No. 17/036,070, filed Sep. 29, 2020, SanDisk Technologies LLC.
U.S. Appl. No. 17/039,160, filed Sep. 30, 2020, SanDisk Technologies LLC.
U.S. Appl. No. 17/116,093, filed Sep. 30, 2020, SanDisk Technologies LLC.
U.S. Appl. No. 17/134,938, filed Dec. 28, 2020, SanDisk Technologies LLC.
Notification of Transmittal of the International Search Report and the Written Opinion of the International Searching Authority for International Patent Application No. PCT/US2021/035784, dated Nov. 11, 2021, 11 pages.

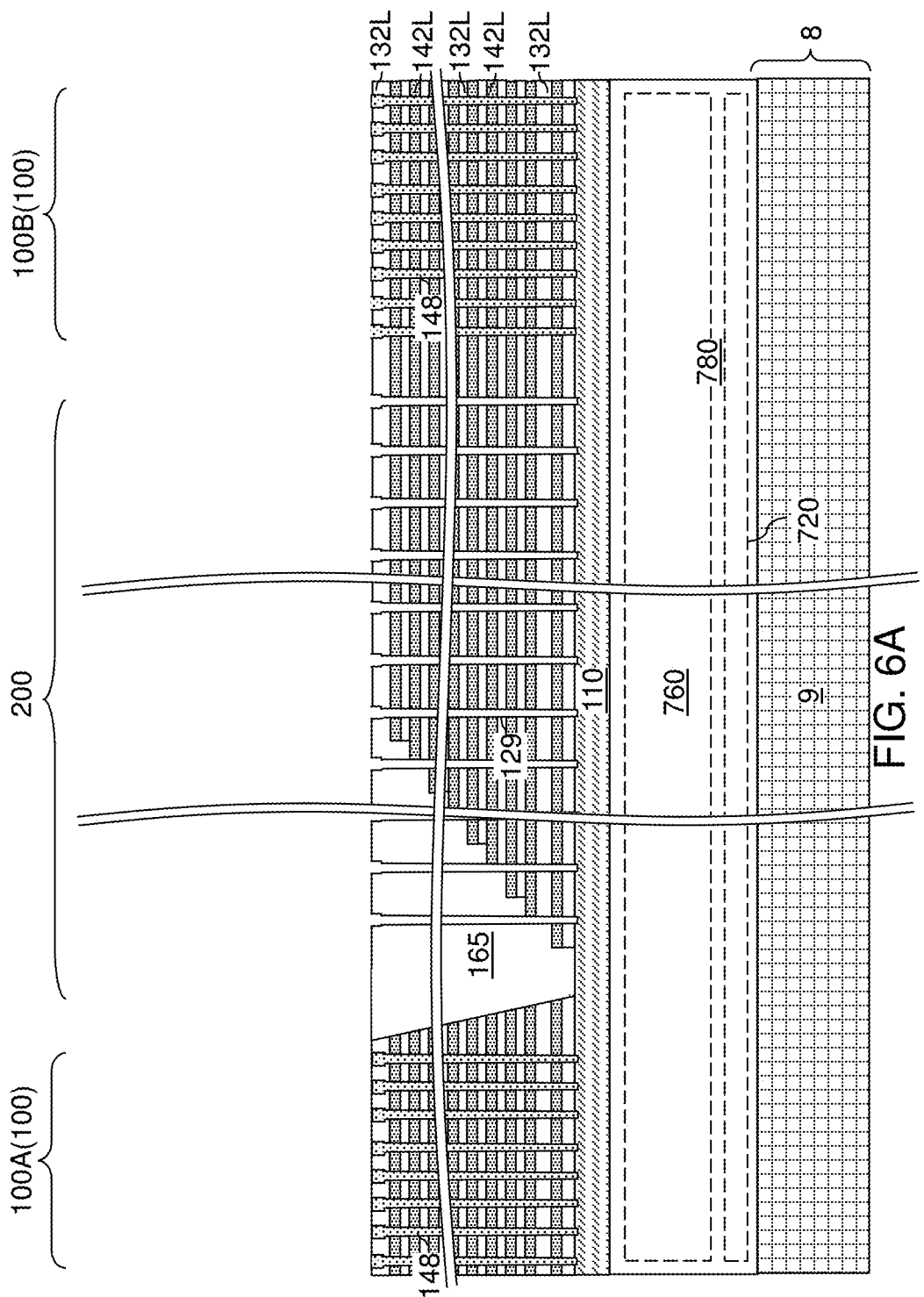

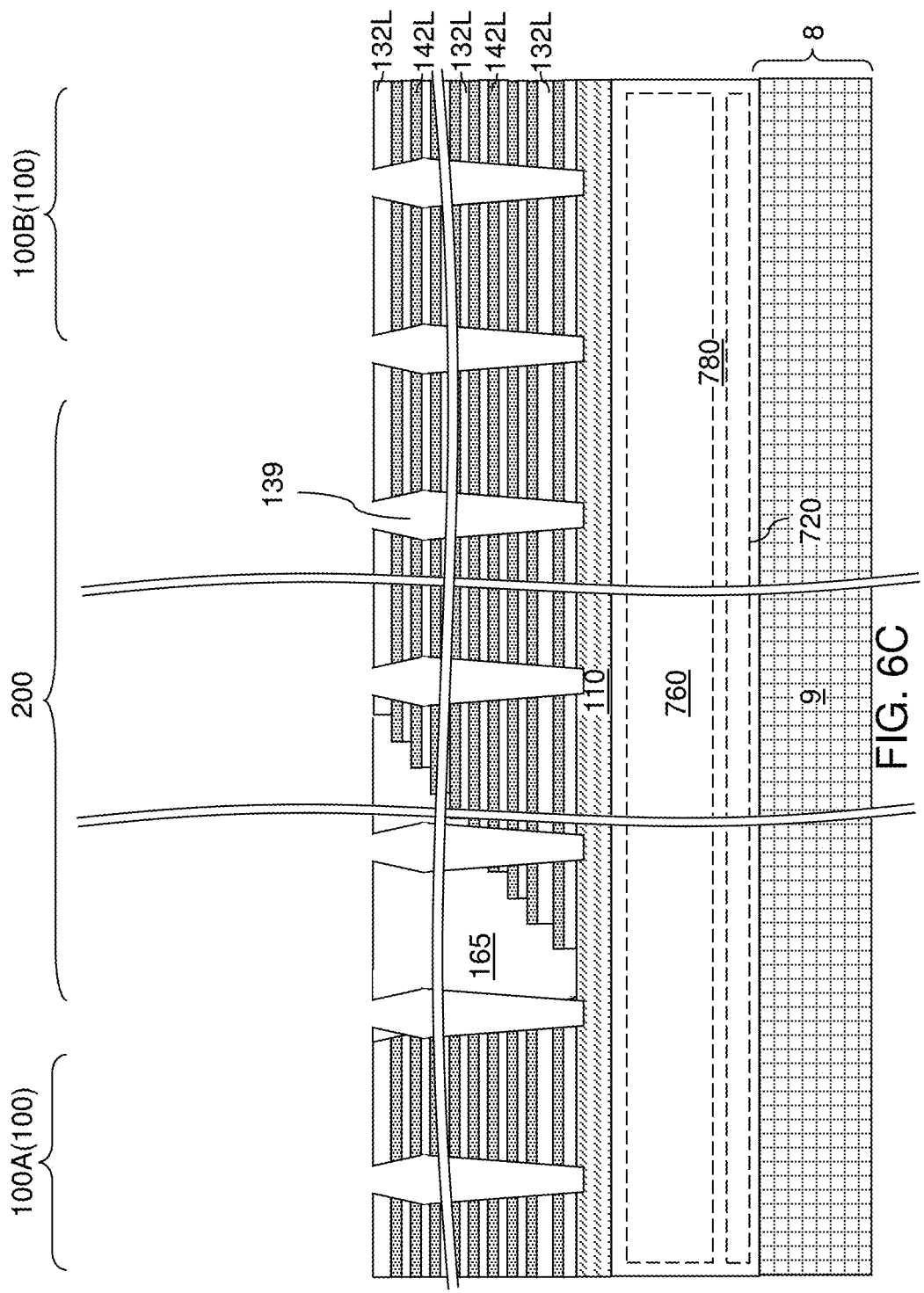

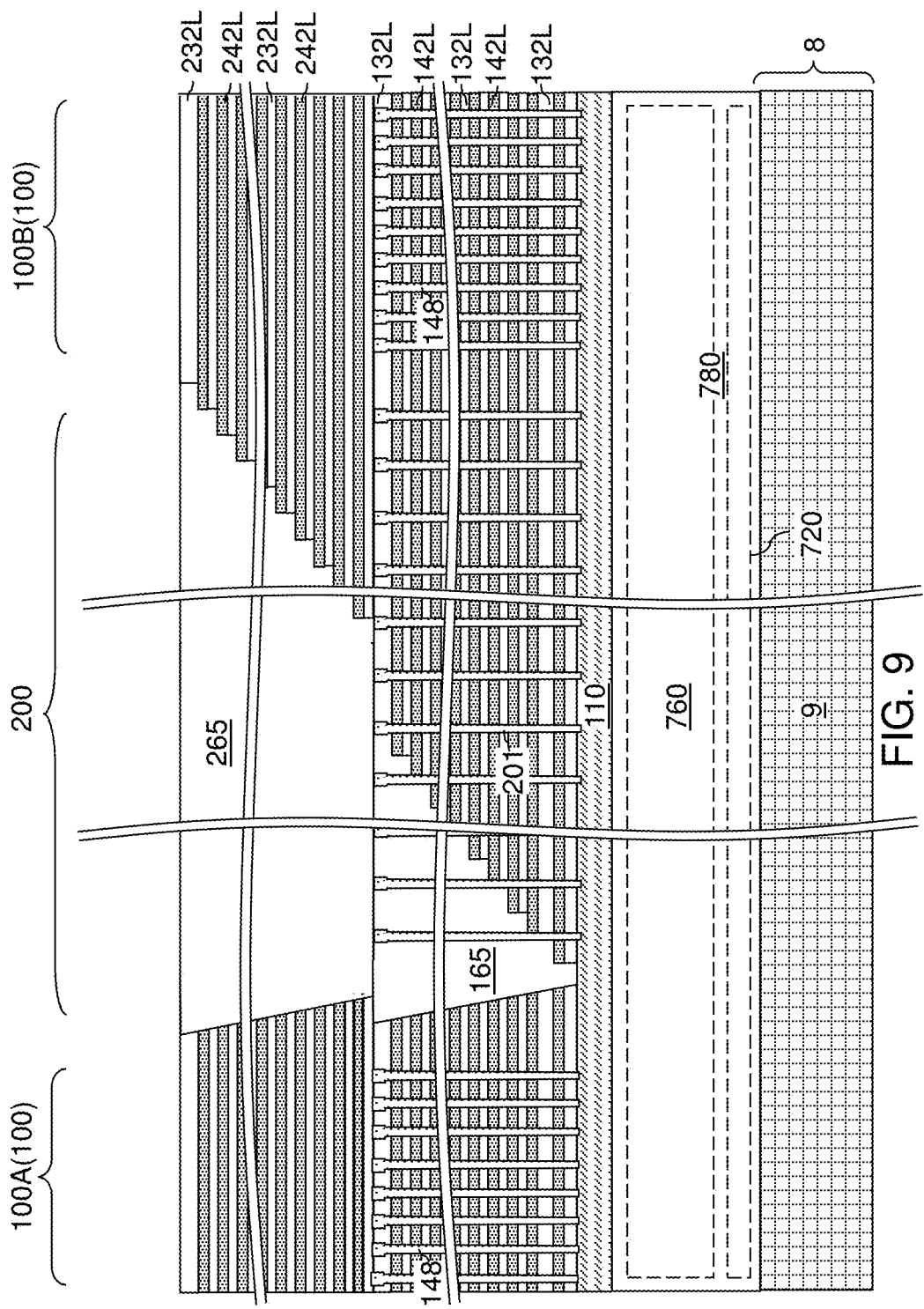

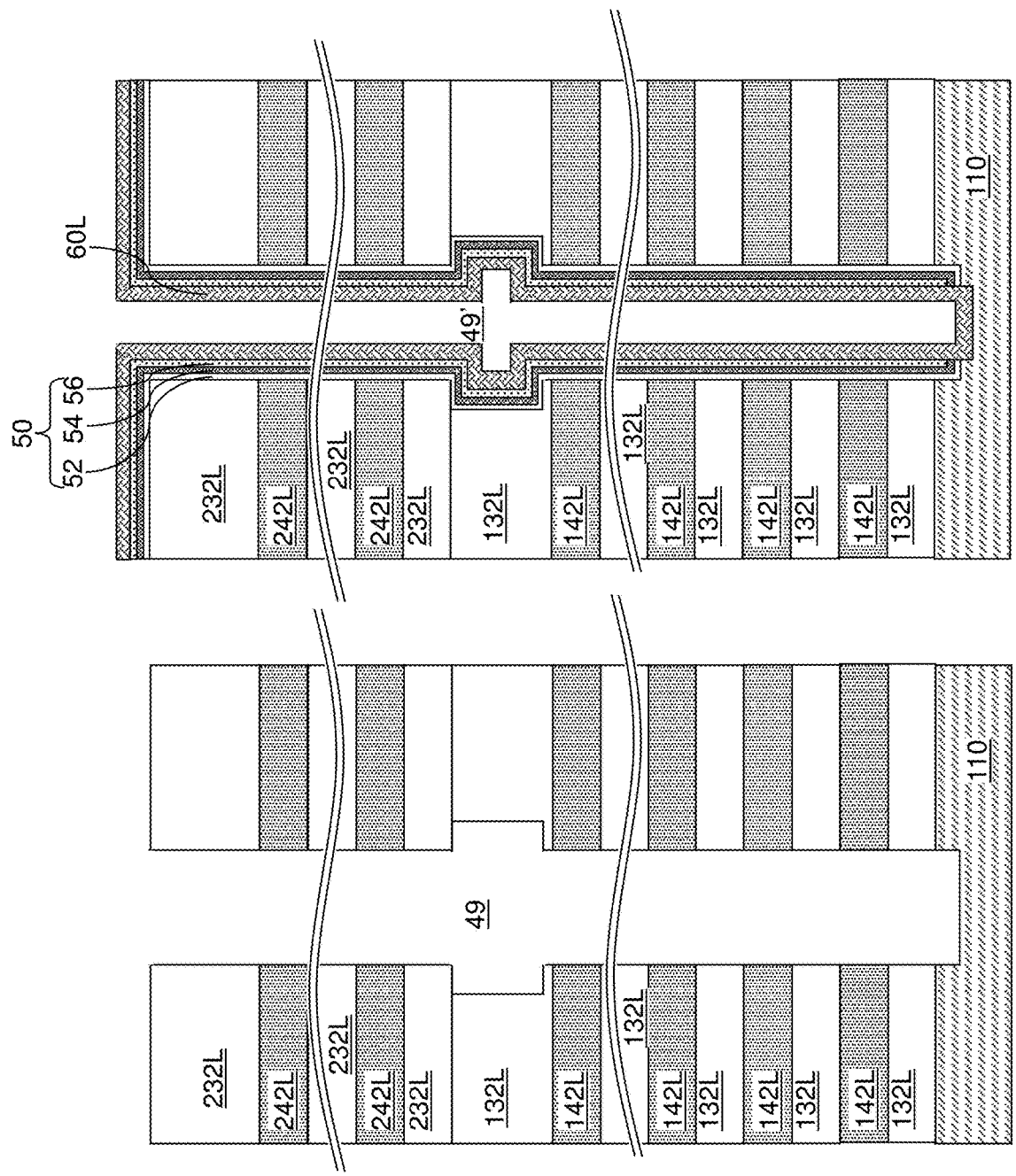

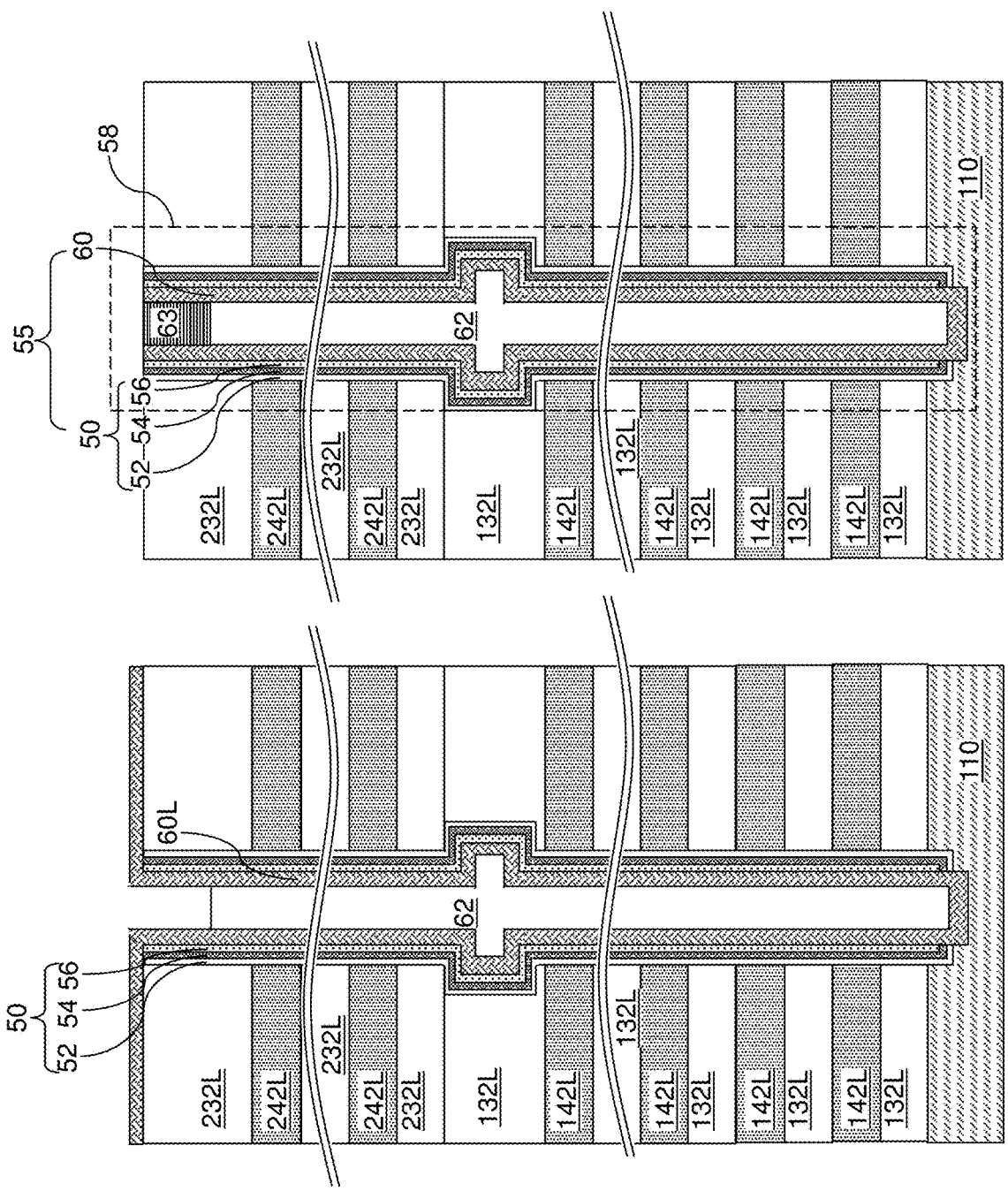

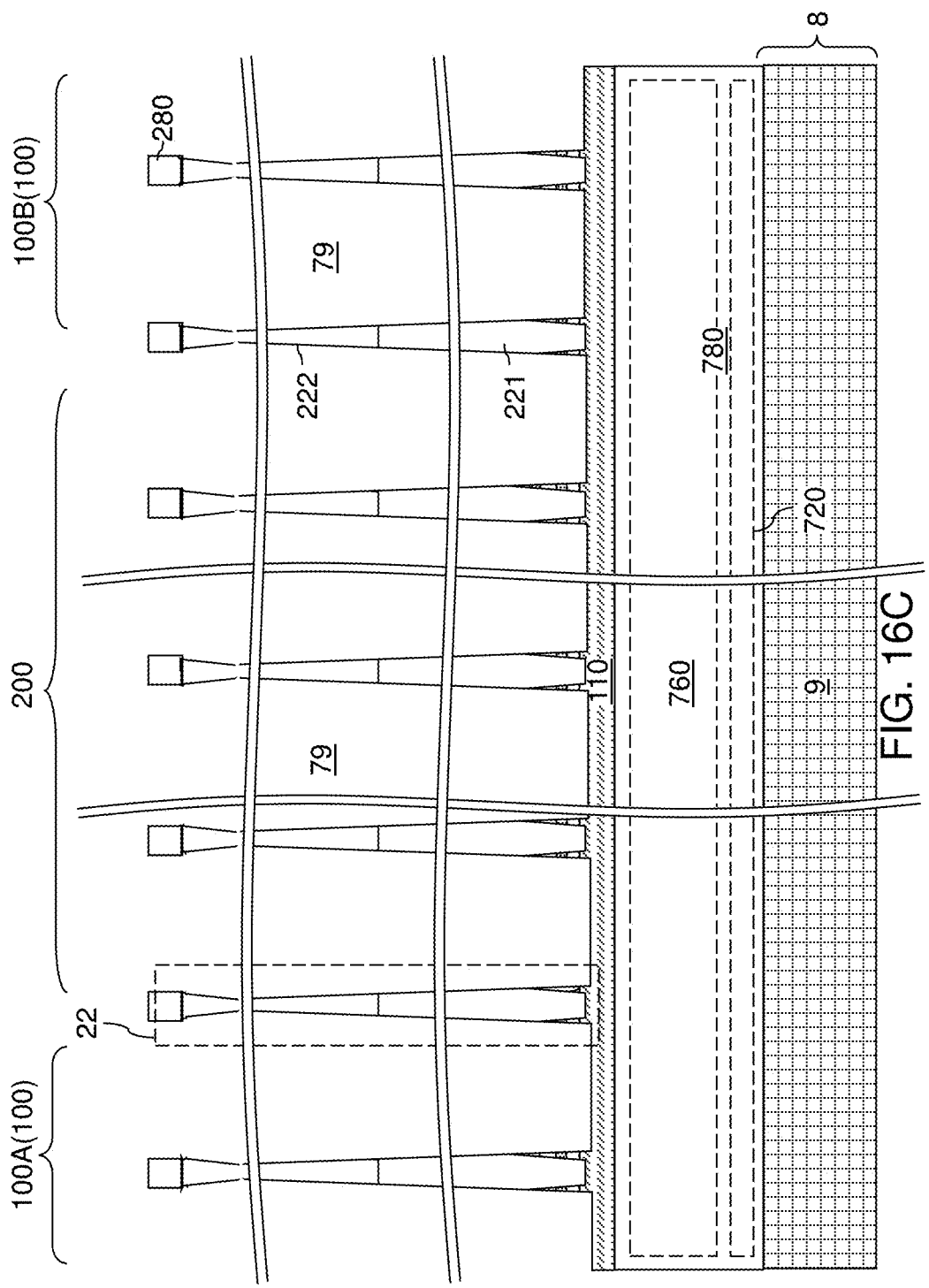

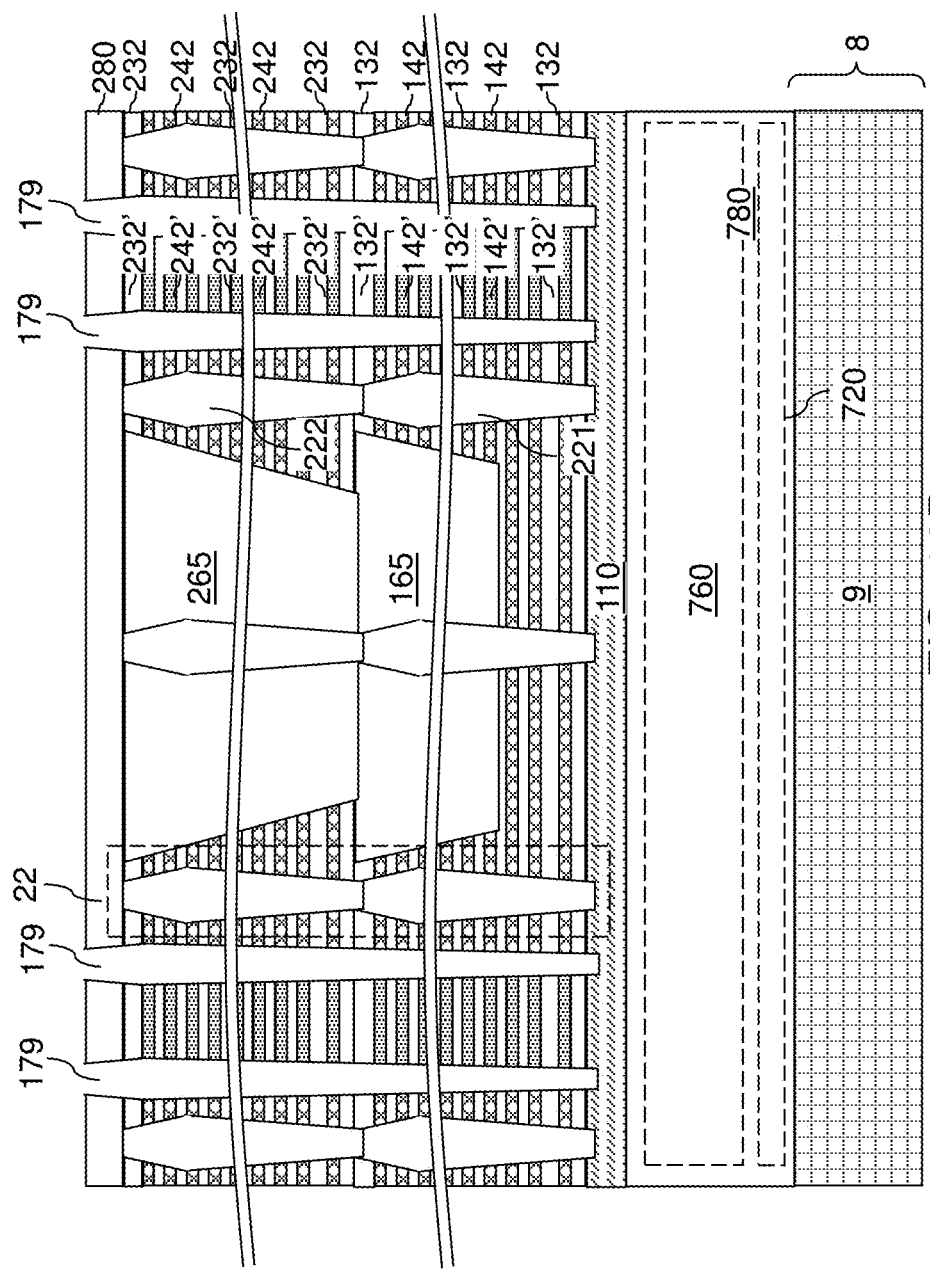

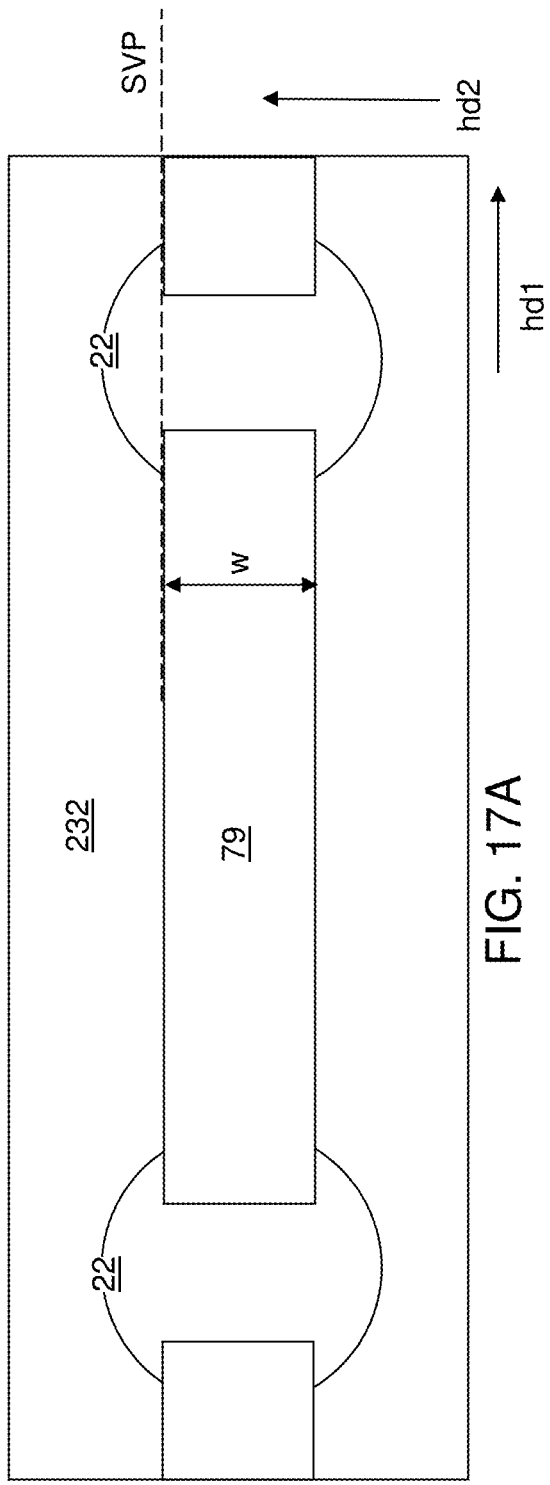
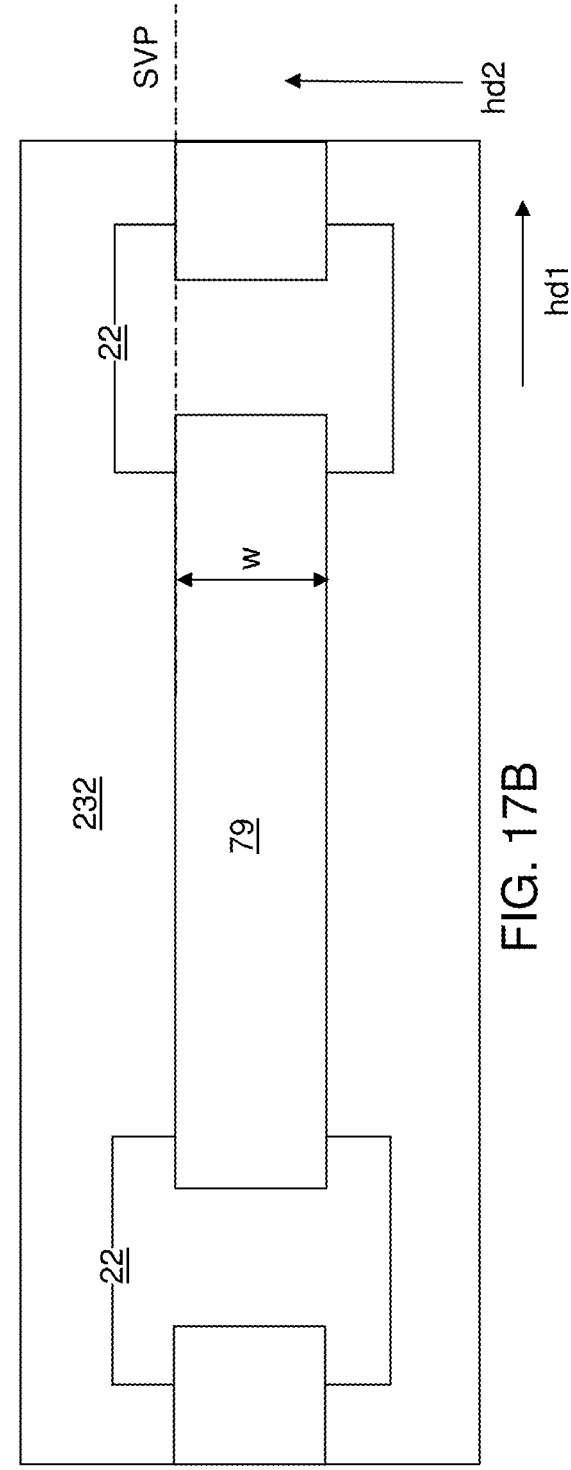

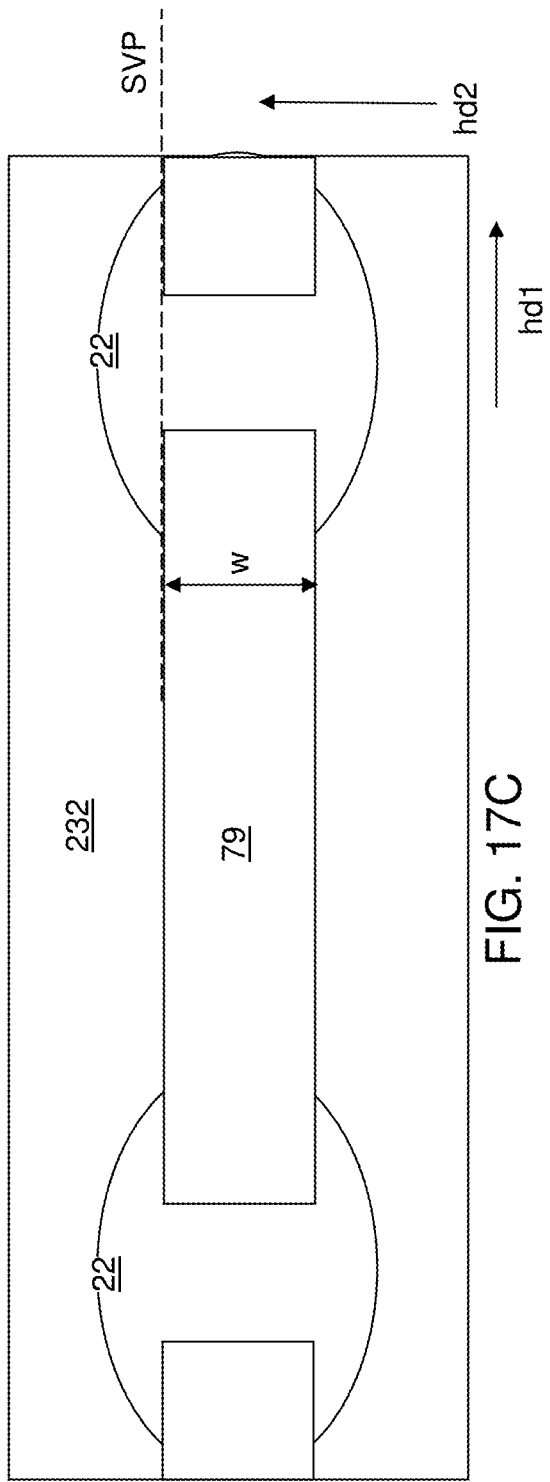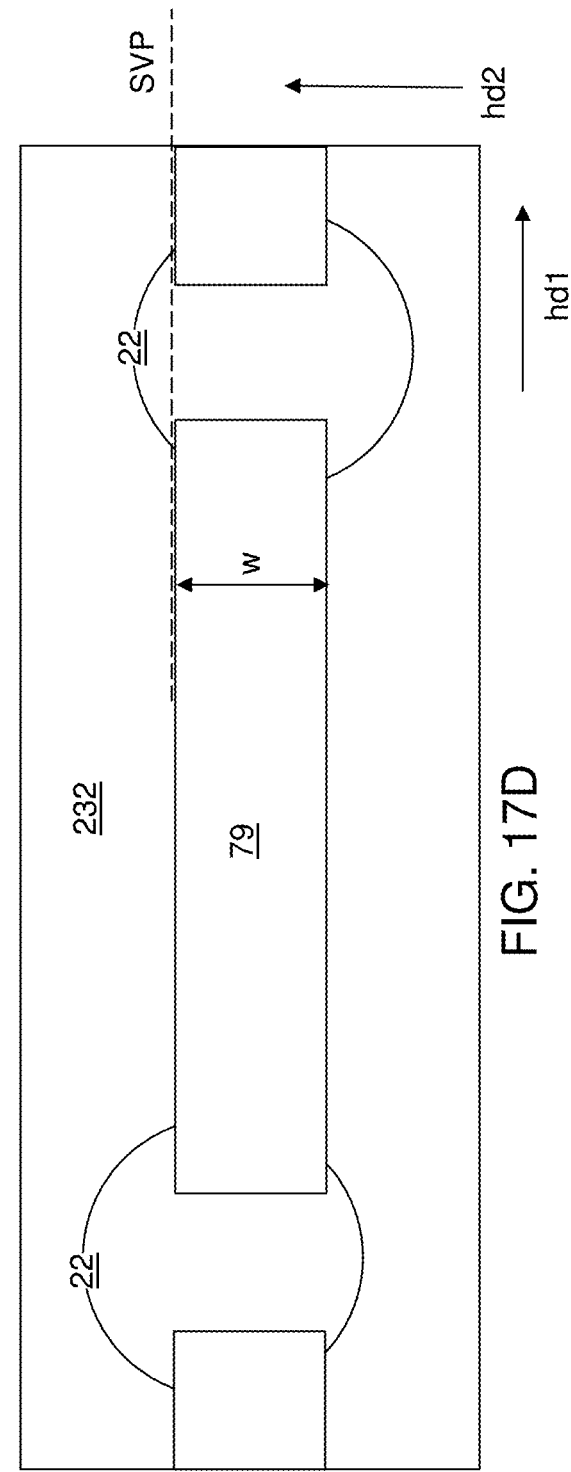

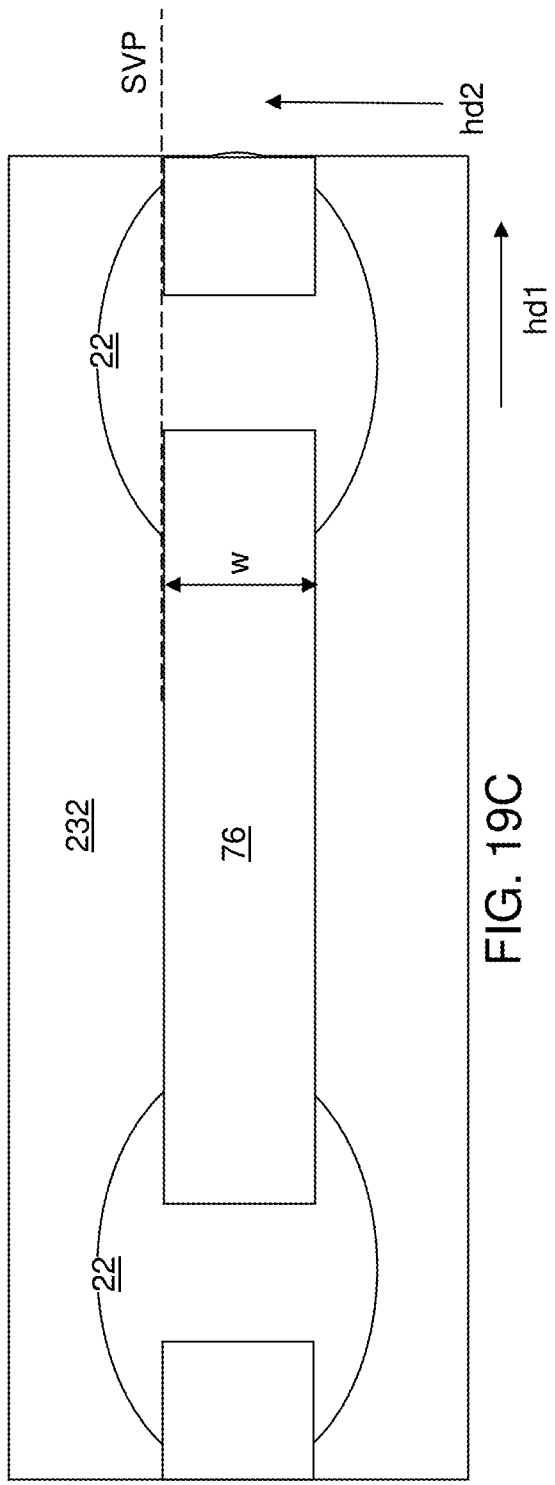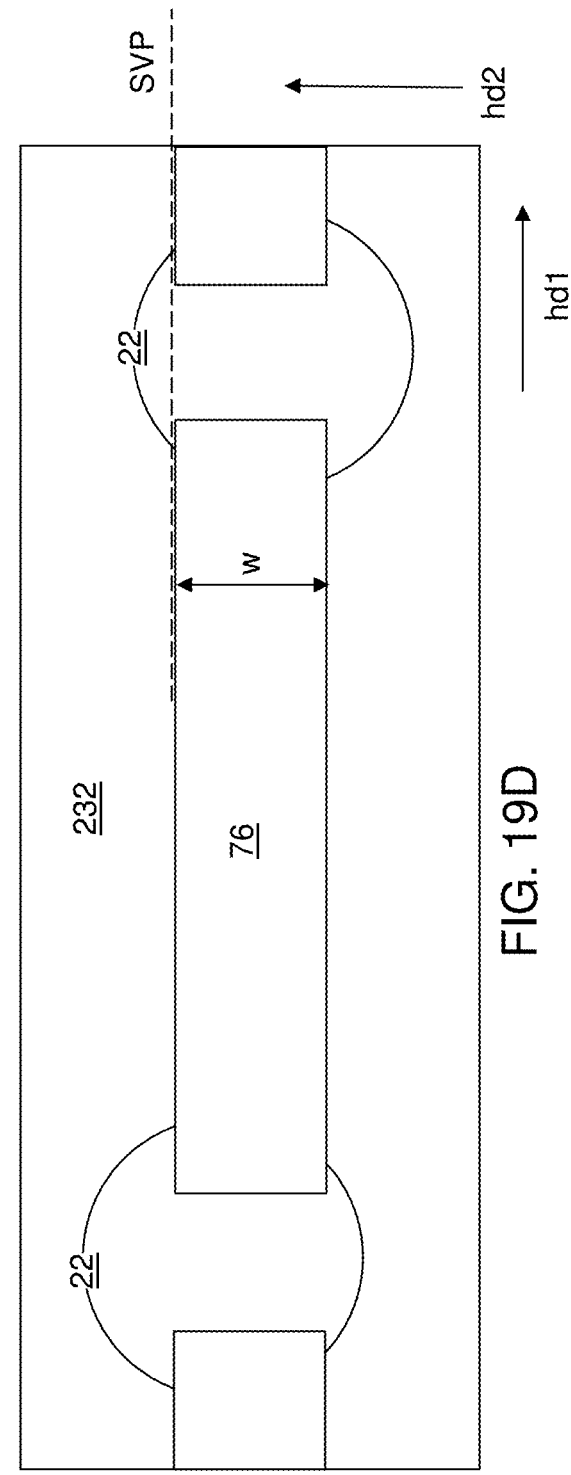

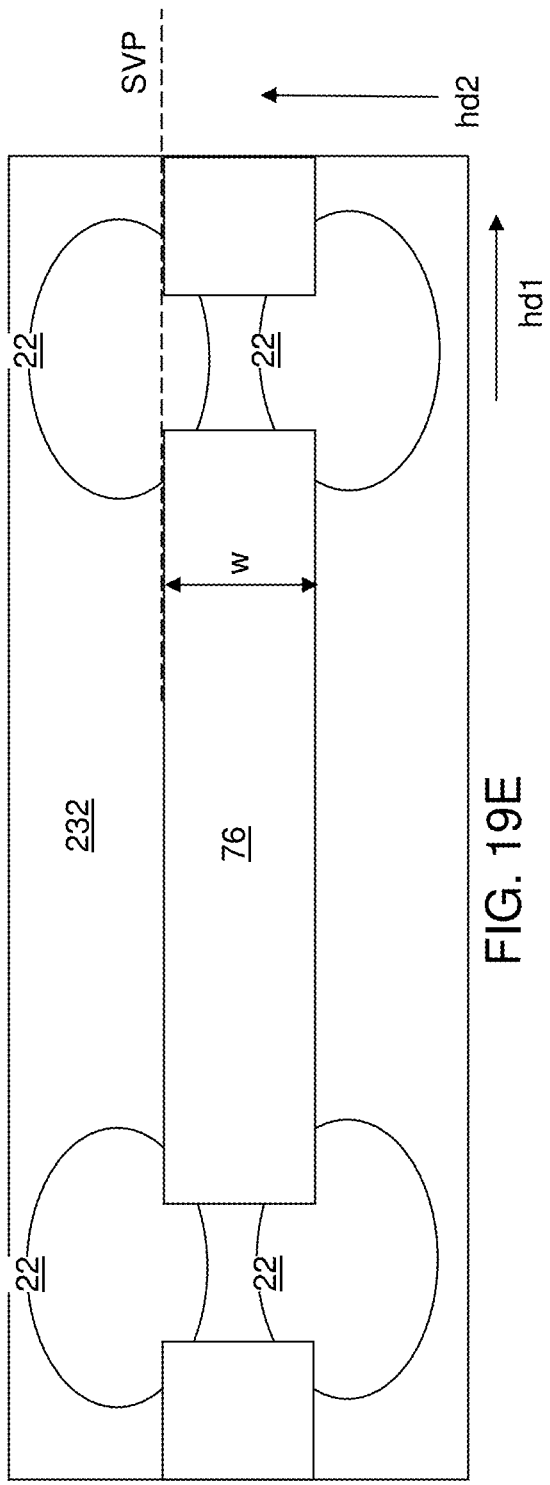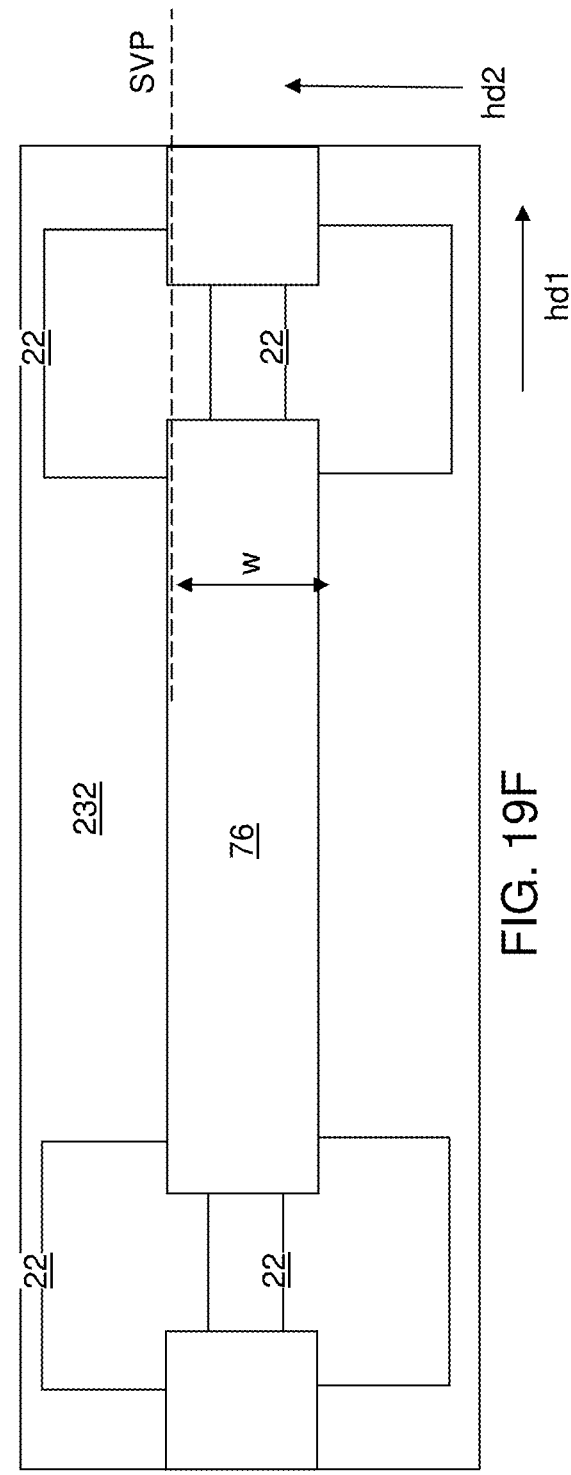

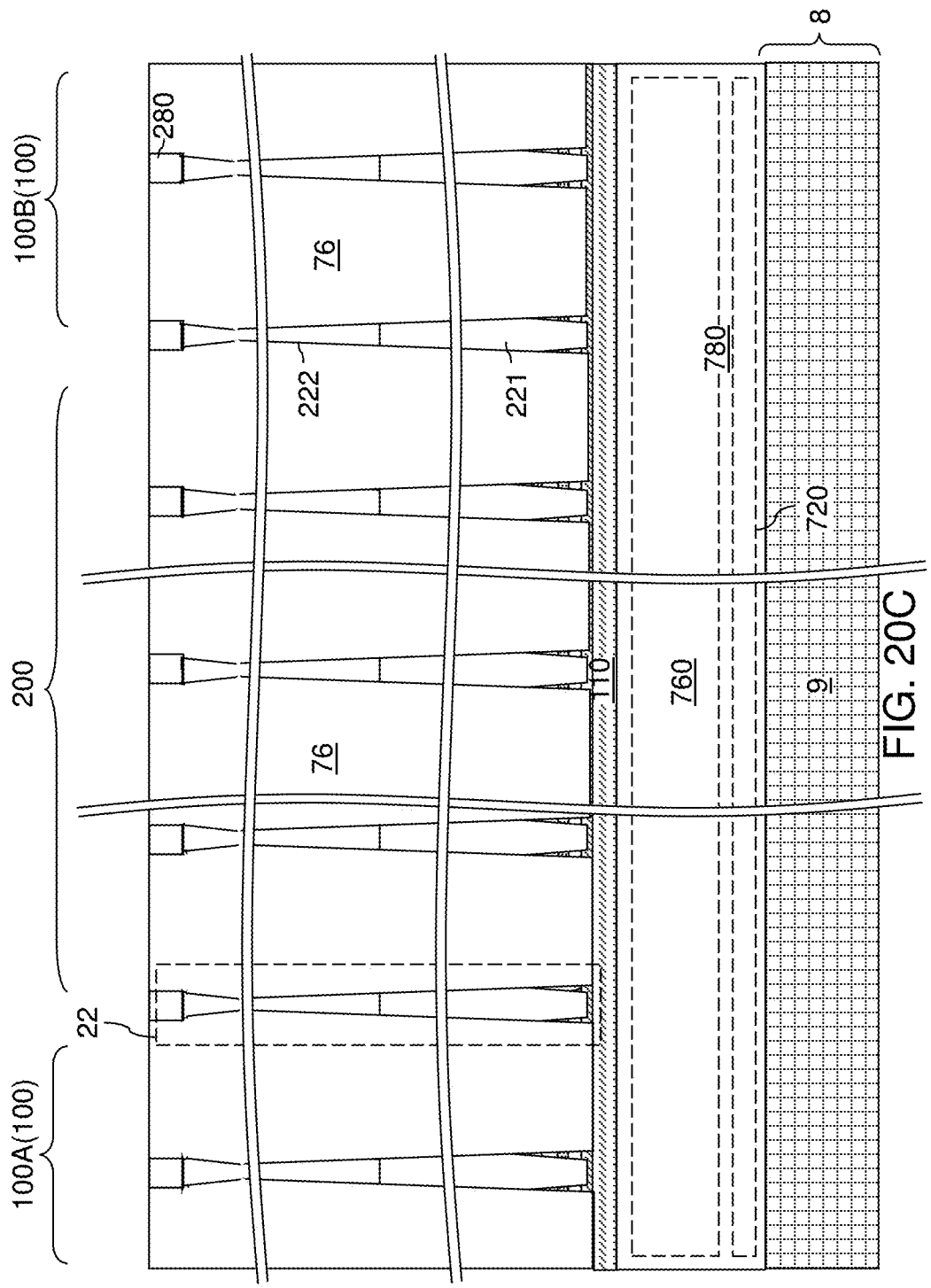

THREE-DIMENSIONAL MEMORY DEVICE WITH BACKSIDE SUPPORT PILLAR STRUCTURES AND METHODS OF FORMING THE SAME

FIELD

The present disclosure relates generally to the field of semiconductor devices, and particularly to a three-dimensional memory device including backside support pillar structures and methods of forming the same.

BACKGROUND

A three-dimensional memory device including three-dimensional vertical NAND strings having one bit per cell are disclosed in an article by T. Endoh et al., titled "Novel Ultra High Density Memory With A Stacked-Surrounding Gate Transistor (S-SGT) Structured Cell", IEDM Proc. (2001) 33-36.

SUMMARY

According to an embodiment of the present disclosure, a three-dimensional memory device is provided, which comprises: alternating stacks of insulating layers and electrically conductive layers located over a substrate, wherein the alternating stacks are laterally spaced apart from each other by backside isolation assemblies that laterally extend along a first horizontal direction; and memory stack structures that vertically extend through a respective one of the alternating stacks, and wherein each of the memory stack structures comprises a respective vertical semiconductor channel and a respective vertical stack of memory elements, wherein: each of the backside isolation assemblies comprises a laterally alternating sequence of backside dielectric isolation walls and backside support pillar structures; the backside dielectric isolation walls have a respective pair of lengthwise sidewalls that are parallel to the first horizontal direction and laterally spaced apart along a second horizontal direction that is perpendicular to the first horizontal direction; and the backside support pillar structures contact indented sidewalls of a respective one of the alternating stacks that are laterally recessed along the second horizontal direction relative to a straight vertical plane including interfaces between the backside dielectric isolation walls and the respective one of the alternating stacks in the horizontal cross-sectional view.

According to another aspect of the present disclosure, a method of forming a semiconductor structure is provided, which comprises: forming at least one vertically alternating sequence of continuous insulating layers and continuous sacrificial material layers over a substrate; forming rows of backside support pillar structures through the at least one vertically alternating sequence; forming memory stack structures through the at least one vertically alternating sequence, and wherein each of the memory stack structures comprises a respective vertical semiconductor channel and a respective vertical stack of memory elements; forming a two-dimensional array of discrete backside trenches through the at least one vertically alternating sequence, wherein contiguous combinations of a subset of the backside trenches and a subset of the backside support pillar structures divide the at least one vertically alternating sequence into alternating stacks of insulating layers and sacrificial material layers, wherein each of the insulating layers comprises a patterned portion of a respective one of the continuous insulating layers and each of the sacrificial material layers comprises a patterned portion of a respective one of the continuous sacrificial material layers; and replacing the sacrificial material layers with electrically conductive layers by providing an etchant that etches the sacrificial material layers into the backside trenches and by providing a reactant that deposits the electrically conductive layers into the backside trenches while the backside support pillar structures provide structural support to the insulating layers.

BRIEF DESCRIPTION OF THE DRAWINGS

FIG. 6A is a vertical cross-sectional view of the exemplary structure after formation of sacrificial first-tier memory opening fill portions according to an embodiment of the present disclosure.

FIG. 6C is a vertical cross-sectional view of the exemplary structure along the vertical plane C-C' of FIG. 6B.

FIGS. 8 and 9 are vertical cross-sectional views of the exemplary structure before and after formation of second-tier retro-stepped dielectric material portions, respectively, according to an embodiment of the present disclosure.

FIGS. 13A-13D illustrate sequential vertical cross-sectional views of a memory opening during formation of a memory opening fill structure according to an embodiment of the present disclosure.

FIG. 16C is a vertical cross-sectional view of the exemplary structure along the vertical plane C-C' of FIG. 16B.

FIG. 16D is a vertical cross-sectional view of the exemplary structure along the vertical plane D-D' of FIG. 16B.

FIGS. 17A-17F are horizontal cross-sectional views of various configurations of the exemplary structure of FIGS. 16A-16E at a height of a second insulating layer according to an aspect of the present disclosure.

FIGS. 19A-19F are horizontal cross-sectional views of various configurations of the exemplary structure of FIGS. 18A-18E at a height of a second insulating layer according to an aspect of the present disclosure.

FIG. 20C is a vertical cross-sectional view of the exemplary structure along the vertical plane C-C' of FIG. 20B.

DETAILED DESCRIPTION

Figure 1:
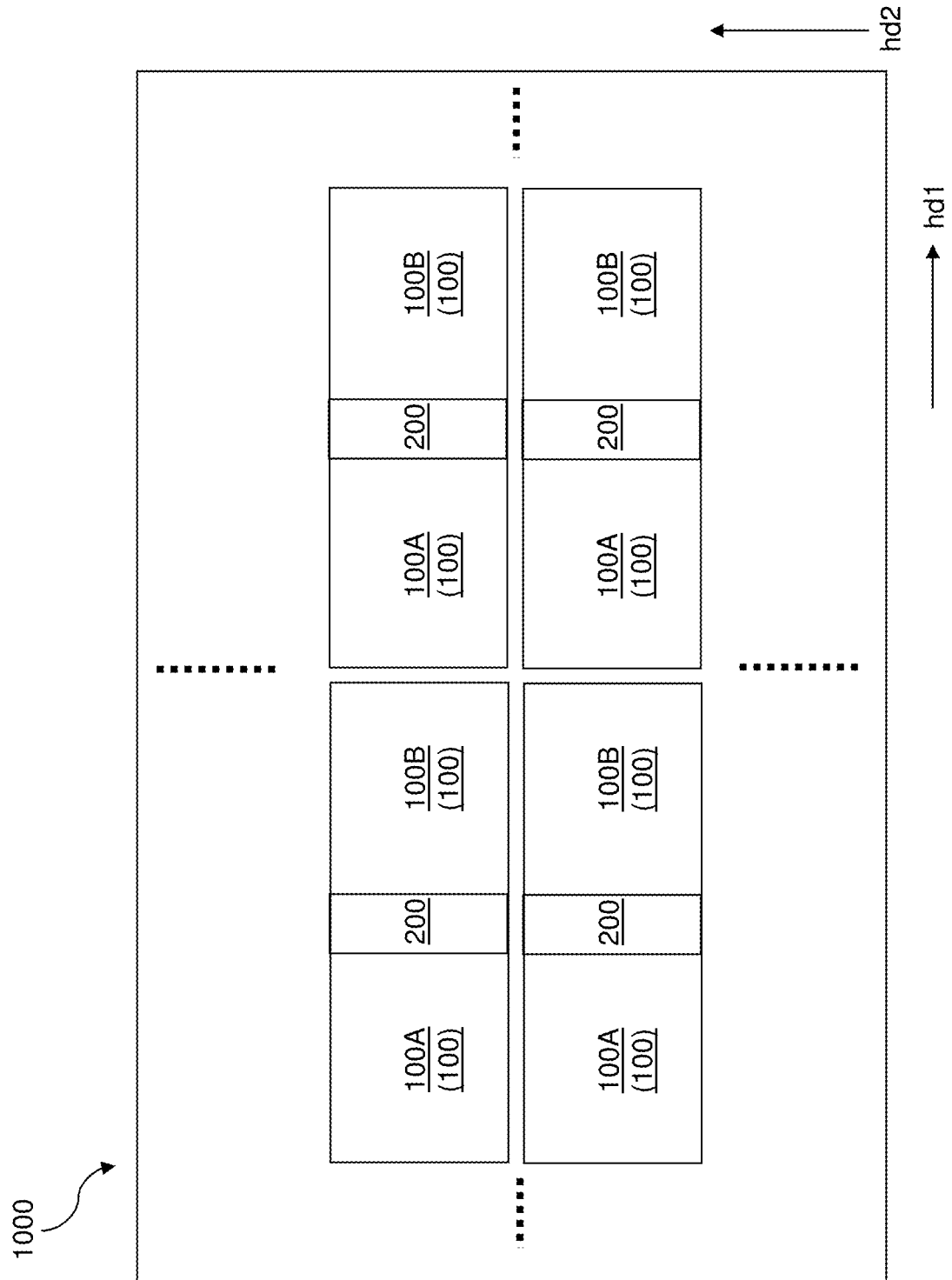
FIG. 1 is a plan view of an exemplary semiconductor die including multiple three-dimensional memory array regions according to an embodiment of the present disclosure.

As discussed above, the embodiments of the present disclosure are directed to a three-dimensional memory device including backside support pillar structures and methods of forming the same, the various aspects of which are now described in detail. The backside support pillar structures prevent stacks (e.g., "fingers") of insulating layers from toppling into or leaning into the backside trenches during replacement of sacrificial material layers with word lines and select gate electrodes through the backside trenches. The backside support pillar structures may be formed together with support pillar structures located in a staircase region without using additional photolithography, deposition or etching steps.

The drawings are not drawn to scale. Multiple instances of an element may be duplicated where a single instance of the element is illustrated, unless absence of duplication of elements is expressly described or clearly indicated otherwise. Ordinals such as "first," "second," and "third" are employed merely to identify similar elements, and different ordinals may be employed across the specification and the claims of the instant disclosure. The term "at least one" element refers to all possibilities including the possibility of a single element and the possibility of multiple elements.

The same reference numerals refer to the same element or similar element. Unless otherwise indicated, elements having the same reference numerals are presumed to have the same composition and the same function. Unless otherwise indicated, a "contact" between elements refers to a direct contact between elements that provides an edge or a surface shared by the elements. If two or more elements are not in direct contact with each other or from each other, the two elements are "disjoined from" each other or "disjoined among" one another. As used herein, a first element located "on" a second element can be located on the exterior side of a surface of the second element or on the interior side of the second element. As used herein, a first element is located "directly on" a second element if there exist a physical contact between a surface of the first element and a surface of the second element. As used herein, a first element is "electrically connected to" a second element if there exists a conductive path consisting of at least one conductive material between the first element and the second element. As used herein, a "prototype" structure or an "in-process" structure refers to a transient structure that is subsequently modified in the shape or composition of at least one component therein.

As used herein, a "layer" refers to a material portion including a region having a thickness. A layer may extend over the entirety of an underlying or overlying structure, or may have an extent less than the extent of an underlying or overlying structure. Further, a layer may be a region of a homogeneous or inhomogeneous continuous structure that has a thickness less than the thickness of the first continuous structure. For example, a layer may be located between any pair of horizontal planes between, or at, a top surface and a bottom surface of the first continuous structure. A layer may extend horizontally, vertically, and/or along a tapered surface. A substrate may be a layer, may include one or more layers therein, or may have one or more layer thereupon, thereabove, and/or therebelow.

As used herein, a first surface and a second surface are "vertically coincident" with each other if the second surface overlies or underlies the first surface and there exists a vertical plane or a substantially vertical plane that includes the first surface and the second surface. A substantially vertical plane is a plane that extends straight along a direction that deviates from a vertical direction by an angle less than 5 degrees. A vertical plane or a substantially vertical plane is straight along a vertical direction or a substantially vertical direction, and may, or may not, include a curvature along a direction that is perpendicular to the vertical direction or the substantially vertical direction.

As used herein, a "memory level" or a "memory array level" refers to the level corresponding to a general region between a first horizontal plane (i.e., a plane parallel to the top surface of the substrate) including topmost surfaces of an array of memory elements and a second horizontal plane including bottommost surfaces of the array of memory elements. As used herein, a "through-stack" element refers to an element that vertically extends through a memory level.

As used herein, a "semiconducting material" refers to a material having electrical conductivity in the range from $1.0 \times 10^{-5}$ S/m to $1.0 \times 10^{5}$ S/m. As used herein, a "semiconductor material" refers to a material having electrical conductivity in the range from $1.0 \times 10^{-5}$ S/m to 1.0 S/m in the absence of electrical dopants therein, and is capable of producing a doped material having electrical conductivity in a range from 1.0 S/m to $1.0 \times 10^{7}$ S/m upon suitable doping with an electrical dopant. As used herein, an "electrical dopant" refers to a p-type dopant that adds a hole to a valence band within a band structure, or an n-type dopant that adds an electron to a conduction band within a band structure. As used herein, a "conductive material" refers to a material having electrical conductivity greater than $1.0 \times 10^{5}$ S/m. As used herein, an "insulator material" or a "dielectric material" refers to a material having electrical conductivity less than $1.0 \times 10^{-5}$ S/m. As used herein, a "heavily doped semiconductor material" refers to a semiconductor material that is doped with electrical dopant at a sufficiently high atomic concentration to become a conductive material either as formed as a crystalline material or if converted into a crystalline material through an anneal process (for example, from an initial amorphous state), i.e., to provide electrical conductivity greater than $1.0 \times 10^{5}$ S/m. A "doped semiconductor material" may be a heavily doped semiconductor material, or may be a semiconductor material that includes electrical dopants (i.e., p-type dopants and/or n-type dopants) at a concentration that provides electrical conductivity in the range from $1.0 \times 10^{-5}$ S/m to $1.0 \times 10^{7}$ S/m. An "intrinsic semiconductor material" refers to a semiconductor material that is not doped with electrical dopants. Thus, a semiconductor material may be semiconducting or conductive, and may be an intrinsic semiconductor material or a doped semiconductor material. A doped semiconductor material may be semiconducting or conductive depending on the atomic concentration of electrical dopants therein. As used herein, a "metallic material" refers to a conductive material including at least one metallic element therein. All measurements for electrical conductivities are made at the standard condition.

A monolithic three-dimensional memory array is one in which multiple memory levels are formed above a single substrate, such as a semiconductor wafer, with no intervening substrates. The term "monolithic" means that layers of each level of the array are directly deposited on the layers of each underlying level of the array. In contrast, two dimensional arrays may be formed separately and then packaged together to form a non-monolithic memory device. For example, non-monolithic stacked memories have been constructed by forming memory levels on separate substrates and vertically stacking the memory levels, as described in U.S. Pat. No. 5,915,167 titled "Three-dimensional Structure Memory." The substrates may be thinned or removed from the memory levels before bonding, but as the memory levels are initially formed over separate substrates, such memories are not true monolithic three-dimensional memory arrays. The substrate may include integrated circuits fabricated thereon, such as driver circuits for a memory device.

The various three-dimensional memory devices of the present disclosure include a monolithic three-dimensional NAND string memory device, and may be fabricated using the various embodiments described herein. The monolithic three-dimensional NAND string is located in a monolithic, three-dimensional array of NAND strings located over the substrate. At least one memory cell in the first device level of the three-dimensional array of NAND strings is located over another memory cell in the second device level of the three-dimensional array of NAND strings.

Generally, a semiconductor package (or a "package") refers to a unit semiconductor device that may be attached to a circuit board through a set of pins or solder balls. A semiconductor package may include a semiconductor chip (or a "chip") or a plurality of semiconductor chips that are bonded throughout, for example, by flip-chip bonding or another chip-to-chip bonding. A package or a chip may include a single semiconductor die (or a "die") or a plurality of semiconductor dies. A die is the smallest unit that may independently execute external commands or report status. Typically, a package or a chip with multiple dies is capable of simultaneously executing as many number of external commands as the total number of dies therein. Each die includes one or more planes. Identical concurrent operations may be executed in each plane within a same die, although there may be some restrictions. In case a die is a memory die, i.e., a die including memory elements, concurrent read operations, concurrent write operations, or concurrent erase operations may be performed in each plane within a same memory die. In a memory die, each plane contains a number of memory blocks (or "blocks"), which are the smallest unit that may be erased by in a single erase operation. Each memory block contains a number of pages, which are the smallest units that may be selected for programming. A page is also the smallest unit that may be selected to a read operation.

Referring to FIG. 1, an exemplary semiconductor die 1000 including multiple three-dimensional memory array regions and multiple inter-array regions is illustrated. The exemplary semiconductor die 1000 can include multiple planes, each of which includes two memory array regions 100, such as a first memory array region 100A and a second memory array region 100B that are laterally spaced apart by a respective inter-array region 200. Generally, a semiconductor die 1000 may include a single plane or multiple planes. The total number of planes in the semiconductor die 1000 may be selected based on performance requirements on the semiconductor die 1000. A pair of memory array regions 100 in a plane may be laterally spaced apart along a first horizontal direction hd1 (which may be the word line direction). A second horizontal direction hd2 (which may be the bit line direction) can be perpendicular to the first horizontal direction hd1.

Figure 2:
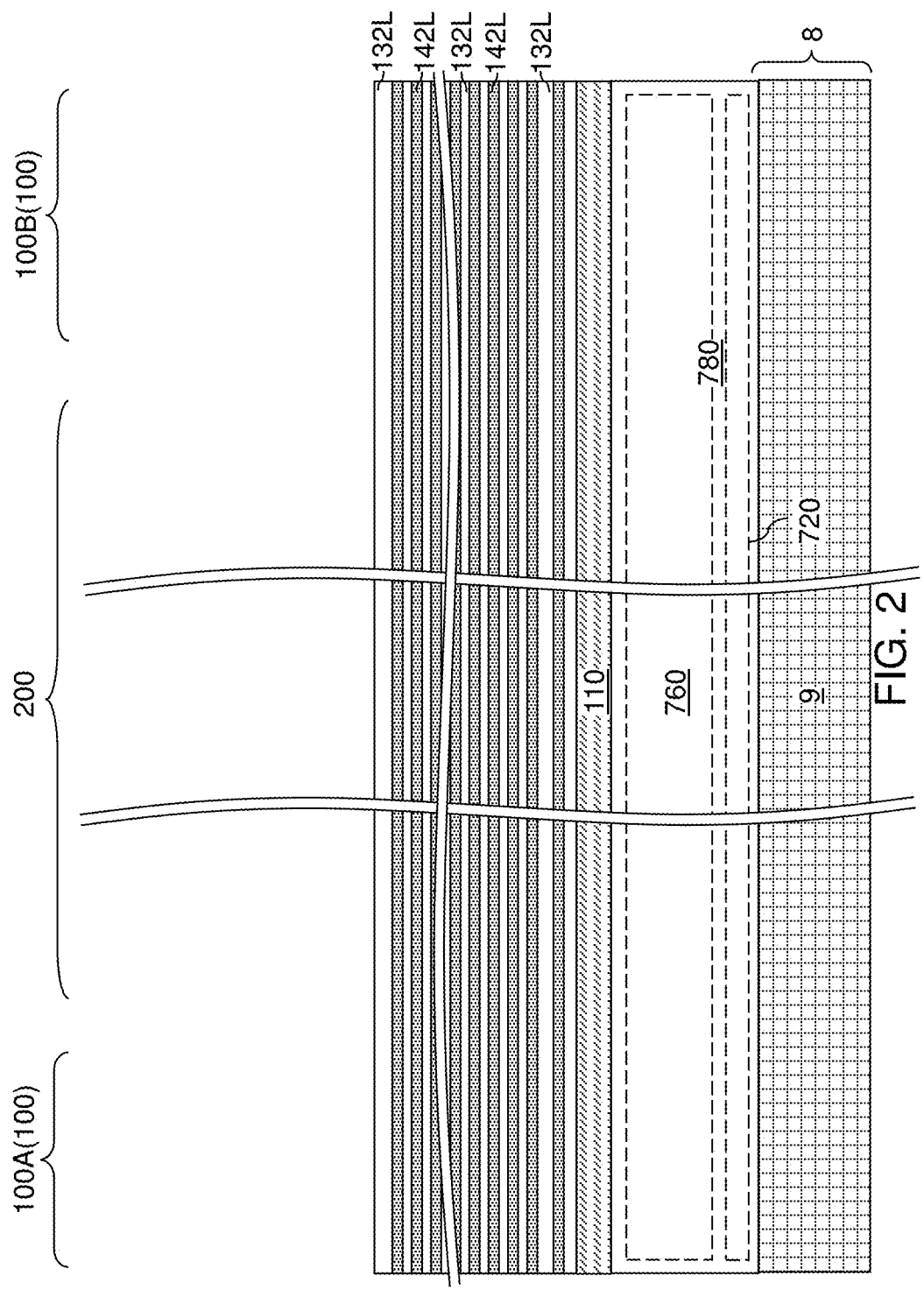
FIG. 2 is a vertical cross-sectional view of the exemplary structure after formation of optional semiconductor devices, optional lower level dielectric layers, optional lower metal interconnect structures, a semiconductor material layer, and a first vertically alternating sequence of first continuous insulating layers and first continuous sacrificial material layers according to an embodiment of the present disclosure.

Referring to FIG. 2, an exemplary structure for formation of the exemplary semiconductor die 1000 is illustrated in a vertical cross sectional view. Semiconductor devices 720 can be formed on a substrate semiconductor layer 9, which is provided at least within an upper portion of a substrate 8. Lower level dielectric layers 760 embedding lower-level metal interconnect structures 780 (schematically represented by a dotted area) can be formed over the substrate semiconductor layer 9. A semiconductor material layer 110 and a first vertically alternating sequence of first continuous insulating layers 132L and first continuous sacrificial material layers 142L can be formed thereabove.

The substrate semiconductor layer 9 may comprise a top portion (e.g., a doped well) of a substrate 8, such as silicon wafer, or a semiconductor layer located over a substrate, such as a silicon on insulator substrate or a semiconductor substrate. The semiconductor devices 720 may include field effect transistors that are formed over a top surface of the substrate 8. The lower-level dielectric layers 760 may be interconnect-level dielectric material layers that embed the lower-level metal interconnect structures 780.

As used herein, a vertically alternating sequence refers to a sequence of multiple instances of a first element and multiple instances of a second element that is arranged such that an instance of a second element is located between each vertically neighboring pair of instances of the first element, and an instance of a first element is located between each vertically neighboring pair of instances of the second element.

The first continuous insulating layers 132L can be composed of the first material, and the first continuous sacrificial material layers 142L can be composed of the second material, which is different from the first material. Each of the first continuous insulating layers 132L is an insulating layer that continuously extends over the entire area of the substrate 8, and may have a uniform thickness throughout. Each of the first sacrificial material layers 142L includes a sacrificial material layer that includes a dielectric material and continuously extends over the entire area of the substrate 8, and may have a uniform thickness throughout.

Insulating materials that may be used for the first continuous insulating layers 132L include, but are not limited to silicon oxide (including doped or undoped silicate glass), silicon nitride, silicon oxynitride, organosilicate glass (OSG), spin-on dielectric materials, dielectric metal oxides that are commonly known as high dielectric constant (high-k) dielectric oxides (e.g., aluminum oxide, hafnium oxide, etc.) and silicates thereof, dielectric metal oxynitrides and silicates thereof, and organic insulating materials. In one embodiment, the first material of the first continuous insulating layers 132L may be silicon oxide.

The second material of the first continuous sacrificial material layers 142L is a dielectric material, which is a sacrificial material that may be removed selective to the first material of the first continuous insulating layers 132L. As used herein, a removal of a first material is "selective to" a second material if the removal process removes the first material at a rate that is at least twice the rate of removal of the second material. The ratio of the rate of removal of the first material to the rate of removal of the second material is herein referred to as a "selectivity" of the removal process for the first material with respect to the second material.

The second material of the first continuous sacrificial material layers 142L may be subsequently replaced with electrically conductive electrodes which may function, for example, as control gate electrodes of a vertical NAND device. In one embodiment, the first continuous sacrificial material layers 142L may be material layers that comprise silicon nitride.

Figure 3:
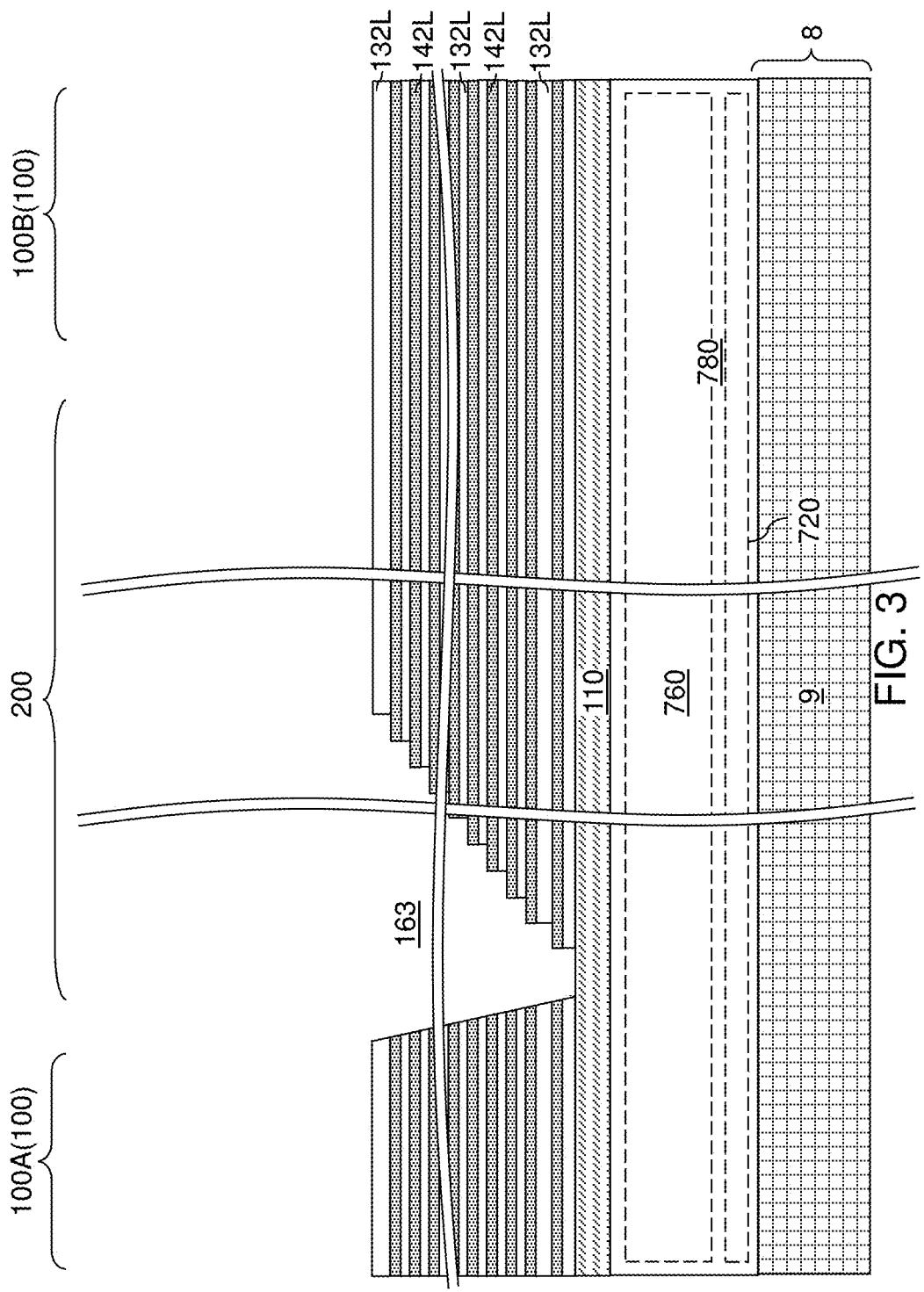
FIG. 3 is a vertical cross-sectional view of the exemplary structure after formation of first stepped surfaces in the inter-array region according to an embodiment of the present disclosure.

Referring to FIG. 3, first stepped surfaces can be formed within the inter-array region 200 simultaneously. A hard mask layer (not shown) such as a metallic or dielectric mask material layer can be formed over the first vertically alternating sequence, and can be patterned to form multiple rectangular openings. The areas of openings within the hard mask layer correspond to areas in which first stepped surfaces are to be subsequently formed. Each opening through the hard mask layer may be rectangular, and may have a pair of sides that are parallel to the first horizontal direction hd1 and a pair of sides that are parallel to the second horizontal direction hd2. The rectangular openings through the hard mask layer may be arranged along the second horizontal direction hd2, and may be alternately staggered along the first horizontal direction hd1. Thus, upon sequentially numbering the rectangular openings along the second horizontal direction hd2, every odd-numbered rectangular openings through the hard mask layer can be formed as a first one-dimensional array arranged along the second horizontal direction hd2 aligned along the first horizontal direction hd1 (i.e., having a same lateral extent along the first horizontal direction), and every even-numbered rectangular openings through the hard mask layer can be formed as a second one-dimensional array arranged along the second horizontal direction hd2 aligned along the first horizontal direction hd1.

A trimmable mask layer (not shown) can be applied over the first vertically alternating sequence. The trimmable mask layer can include a trimmable photoresist layer that can be controllably trimmed by a timed ashing process. The trimmable mask layer can be patterned with an initial pattern such that a segment of each rectangular opening in the hard mask layer that is most proximal to the memory array regions 100 is not masked by the trimmable mask layer, while the rest of each rectangular opening is covered by the trimmable mask layer. For example, the trimmable mask layer can have a rectangular shape having straight edges that are parallel to the second horizontal direction hd2, such that the straight edges are located over a vertical step S of respective first stepped surfaces that is most proximal to one of the memory array regions 100.

The first stepped surfaces can be formed within the rectangular openings in the hard mask layer by iteratively performing a set of layer patterning processing steps as many times as the total number of first continuous sacrificial material layers 142L within the first vertically alternating sequence less 1. The set of layer patterning processing steps comprises an anisotropic etch process that etches unmasked portions of a pair of a first continuous insulating layer 132L and a first continuous sacrificial material layer 142L, and a mask trimming process in which the trimmable mask layer is isotropically trimmed to provide shifted sidewalls that are shifted away from the most proximal memory array region 100. A final anisotropic etch process can be performed after the last mask trimming process, and the trimmable mask layer can be removed, for example, by ashing. The hard mask layer can be removed selective to the materials of the first vertically alternating sequence (132L, 142L), for example, by an isotropic etch process (such as a wet etch process).

A first stepped cavity 163 can be formed within each area of the rectangular opening in the hard mask layer. Each first stepped cavity 163 can include a cliff region in which a tapered sidewall of the first vertically alternating sequence vertically extends from the bottommost layer of the first vertically alternating sequence (132L, 142L) to the topmost layer of the first vertically alternating sequence (132L, 142L). Each first stepped cavity 163 has respective first stepped surfaces as stepped bottom surfaces. Each first stepped cavity 163 has a pair of stepped sidewalls that laterally extend along the first horizontal direction hd1. Each stepped sidewall of the first stepped cavity adjoins the first stepped surfaces at the bottom edge, and extends to the top surface of the topmost layer of the first vertically alternating sequence (132L, 142L).

The array of first staircase regions can be arranged along the second horizontal direction hd2 with an alternating lateral offsets along the first horizontal direction hd1 to provide a staggered configuration for the first staircase regions. In other words, upon sequentially numerically labeling the first staircase regions with positive integers starting with 1 along the second horizontal direction hd2, every odd-numbered first staircase region may be closer to the first memory array region 100A than to the second memory array region 100B, and every even-numbered first staircase region may be closer to the second memory array region 100B than to the first memory array region 100A.

Figure 4:
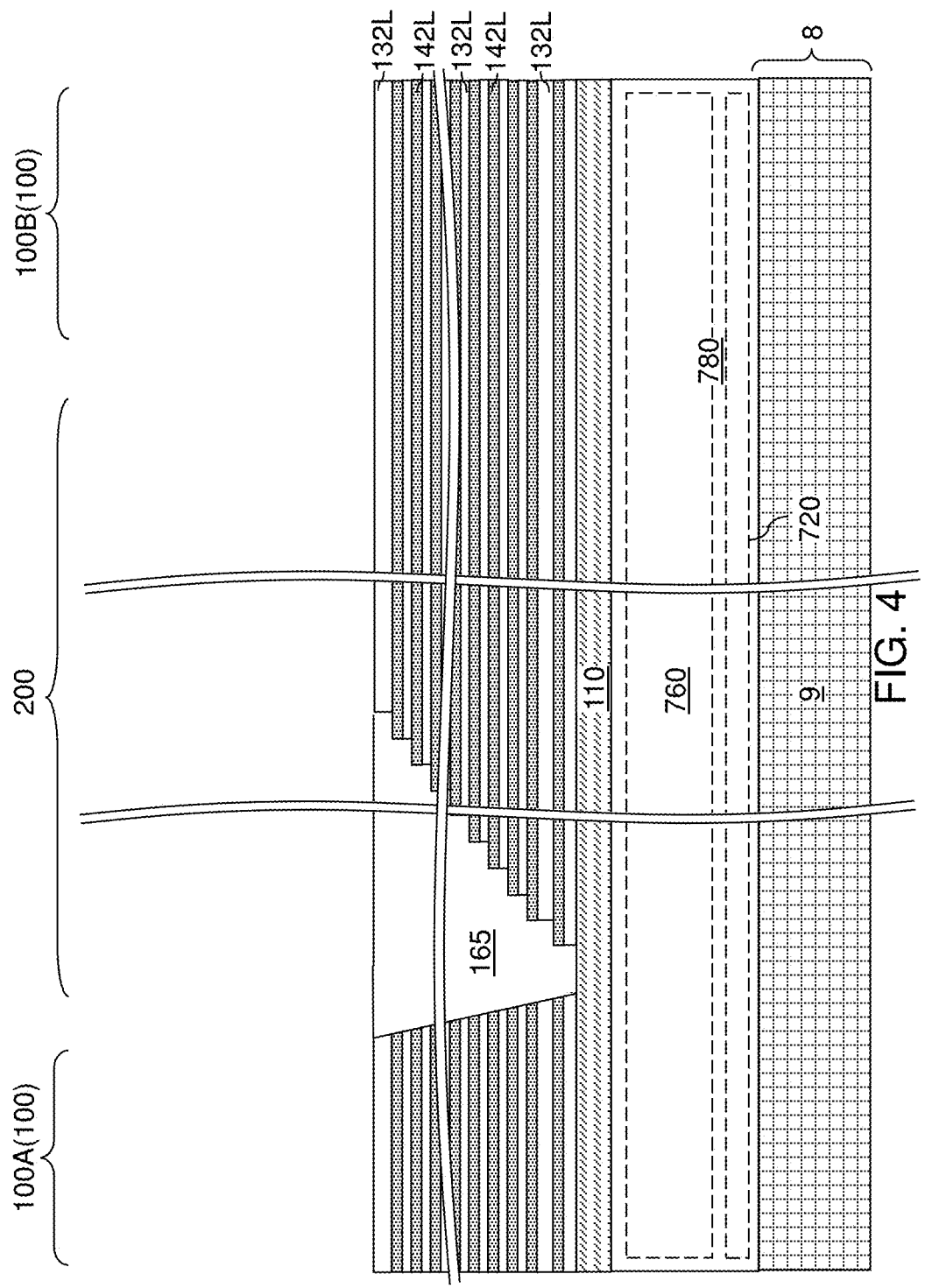
FIG. 4 is a vertical cross-sectional view of the exemplary structure after formation of first-tier retro-stepped dielectric material portions according to an embodiment of the present disclosure.
Figure 5A:
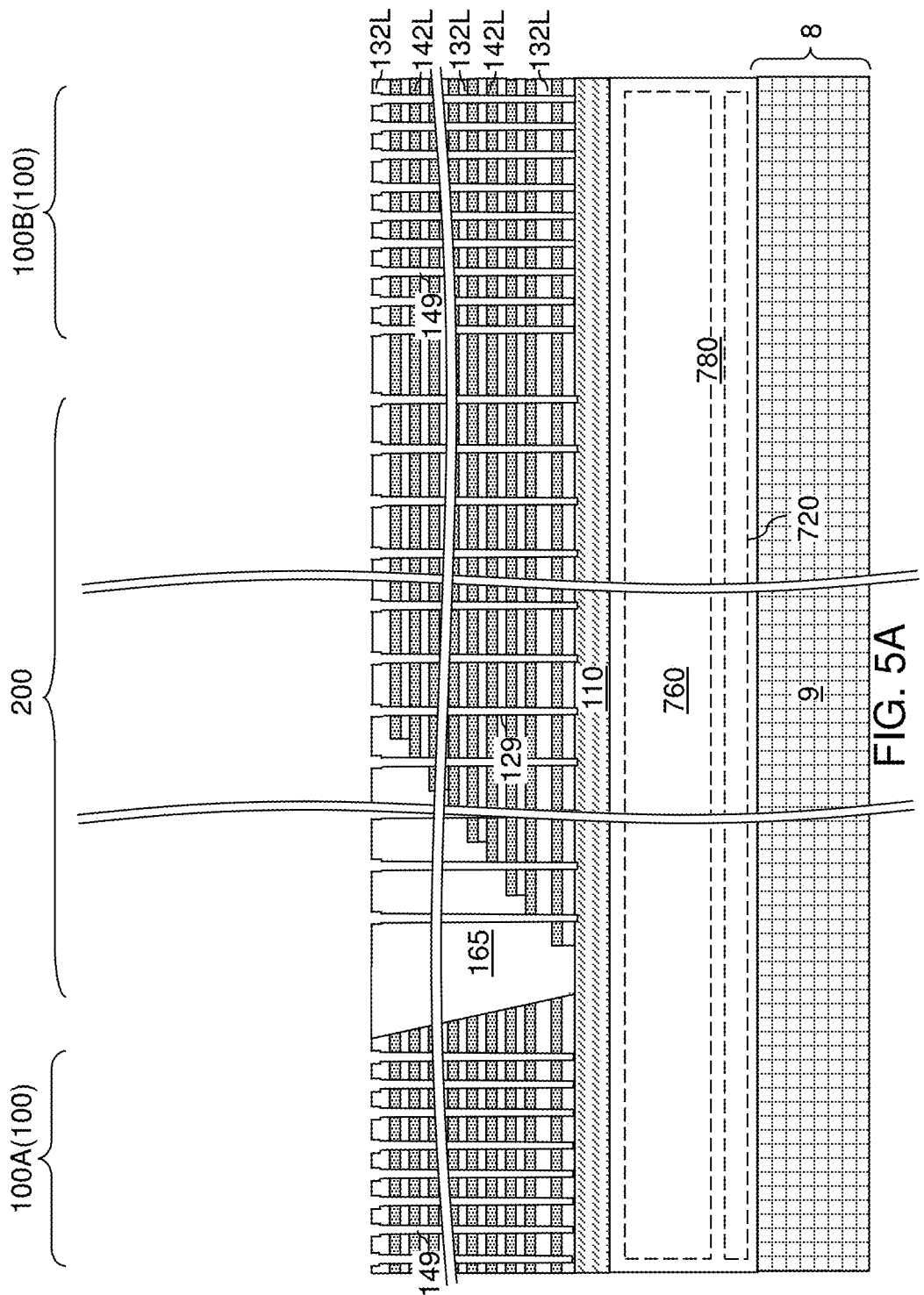
FIG. 5A is a vertical cross-sectional view of the exemplary structure after formation of first-tier openings according to an embodiment of the present disclosure.
Figure 5B:
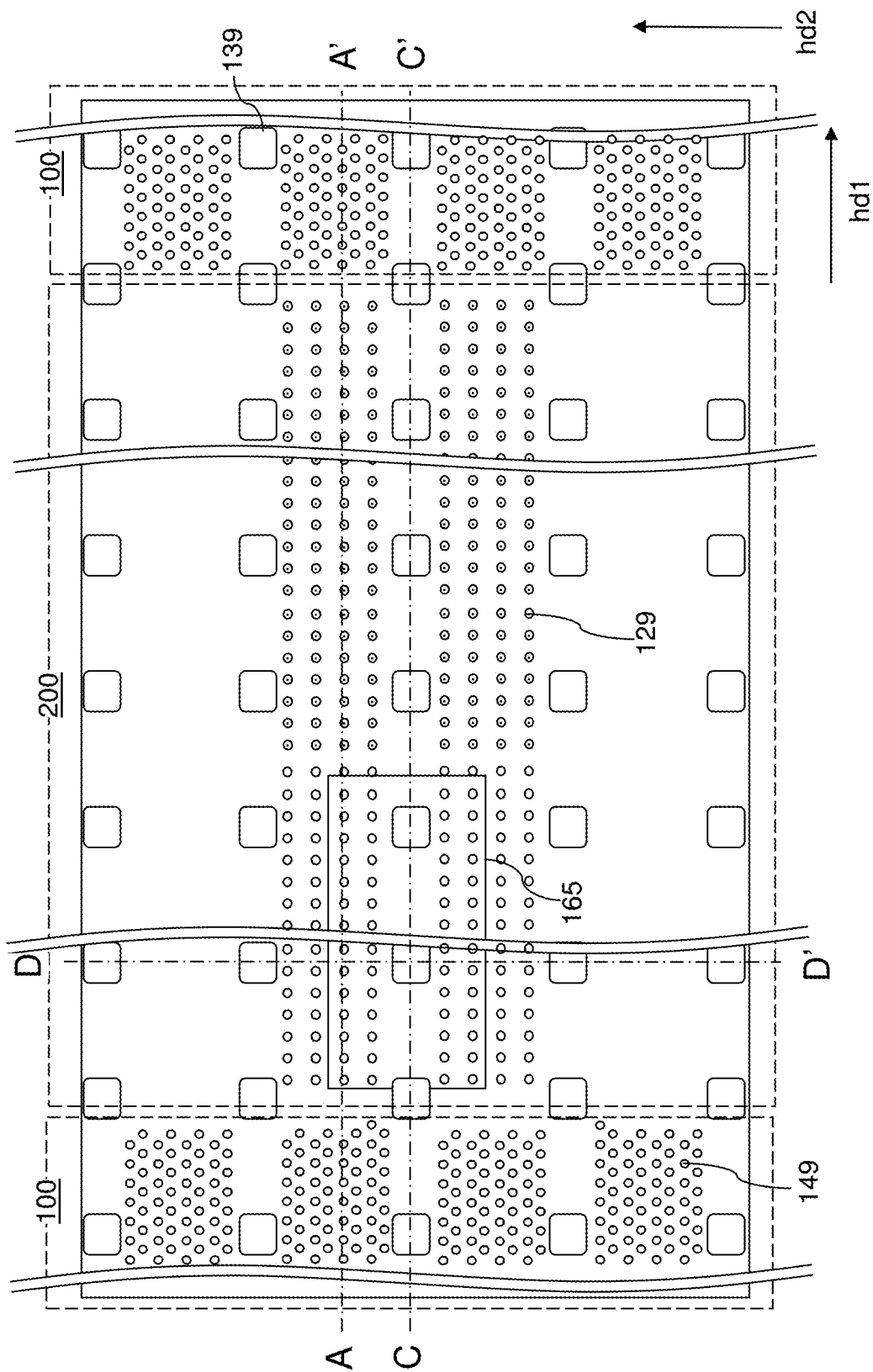
FIG. 5B is a top-down view of the exemplary structure of FIG. 5A. The vertical plane A-A' is the plane of the vertical cross-sectional view of FIG. 5A.
Figure 5C:
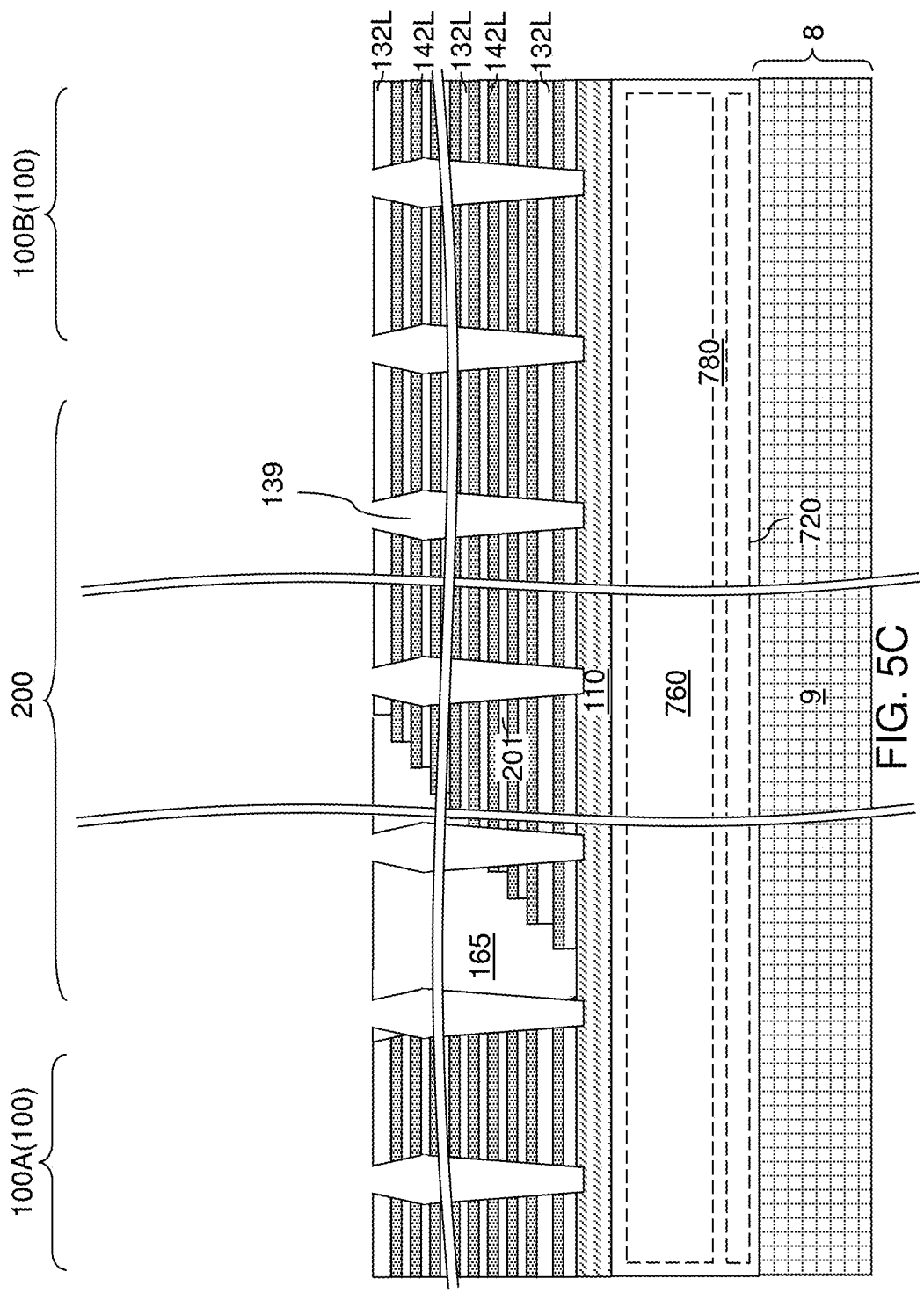
FIG. 5C is a vertical cross-sectional view of the exemplary structure along the vertical plane C-C' of FIG. 5B.
Figure 5D:
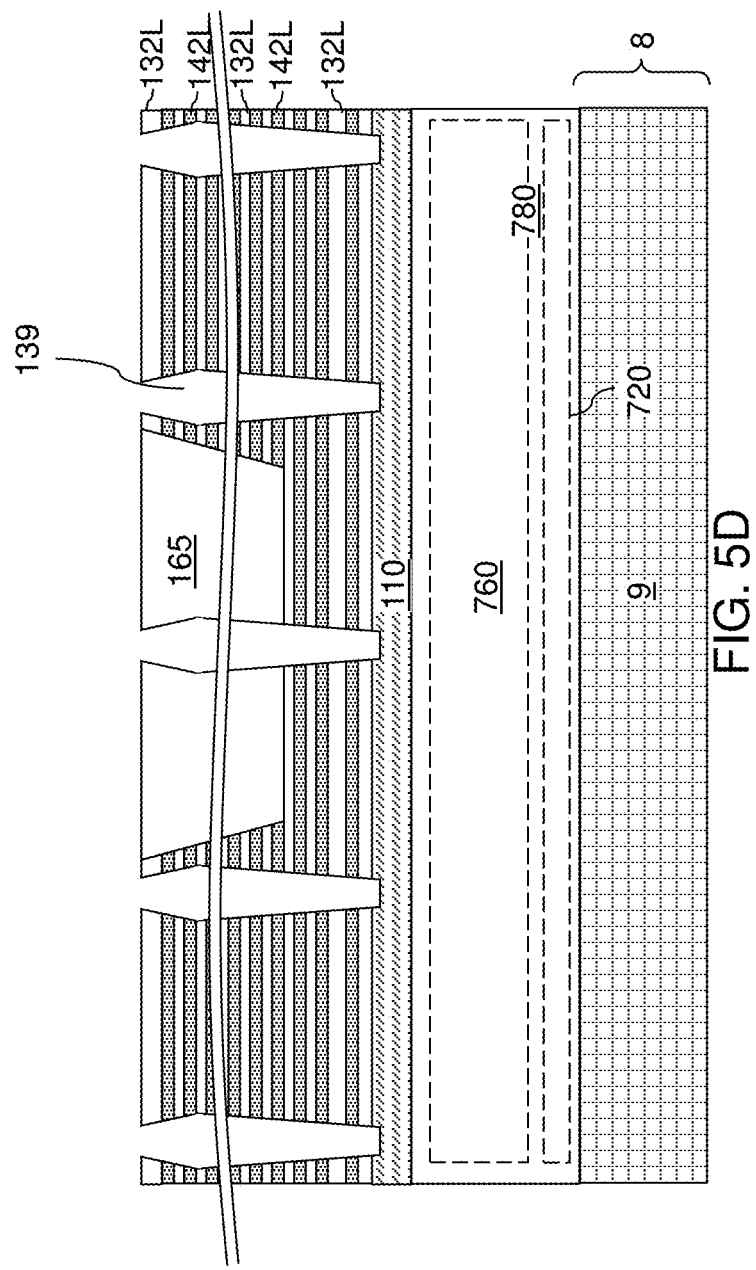
FIG. 5D is a vertical cross-sectional view of the exemplary structure along the vertical plane D-D' of FIG. 5B.
Figure 6B:
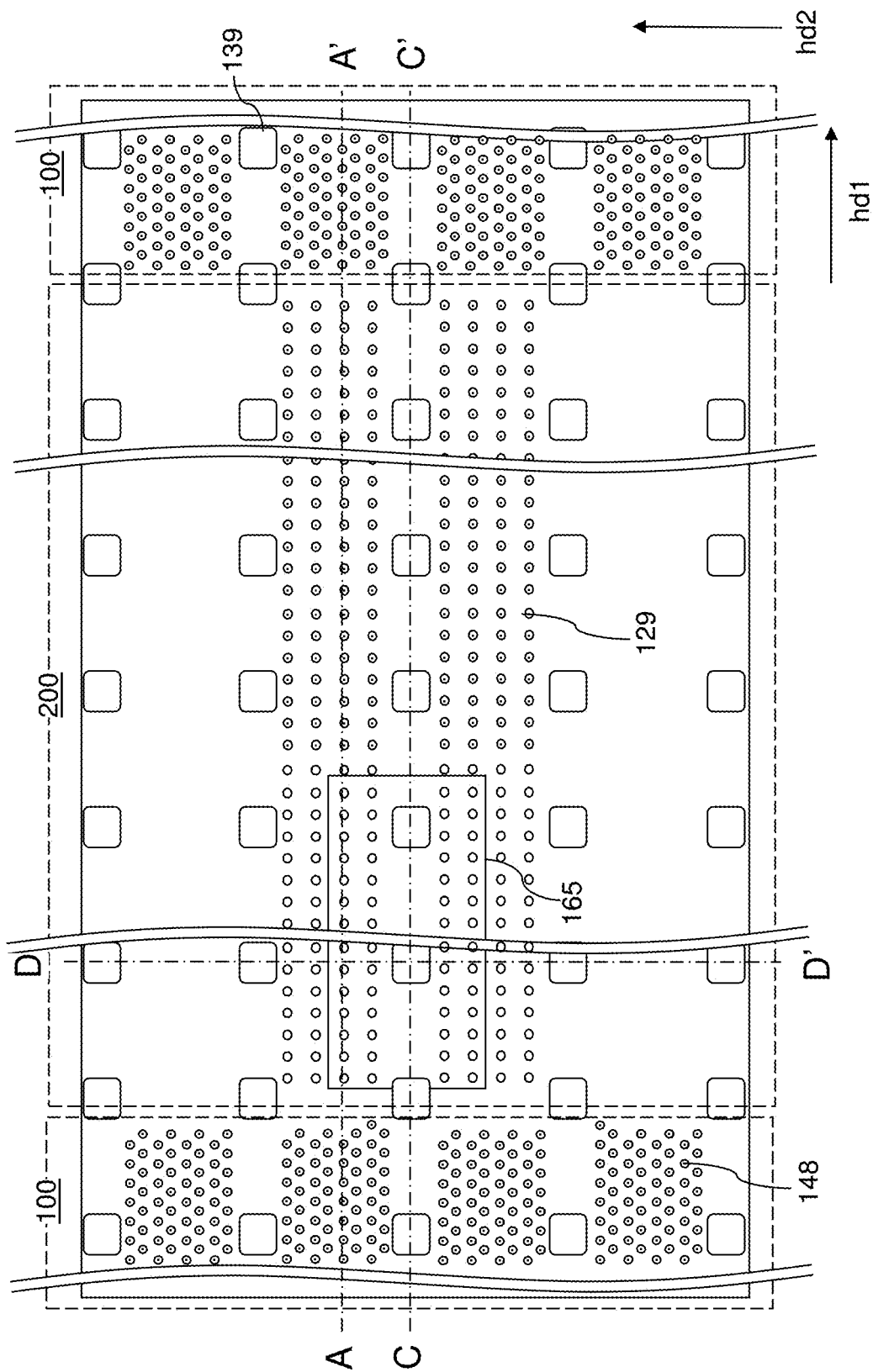
FIG. 6B is a top-down view of the exemplary structure of FIG. 6A. The vertical plane A-A' is the plane of the vertical cross-sectional view of FIG. 6A.
Figure 6D:
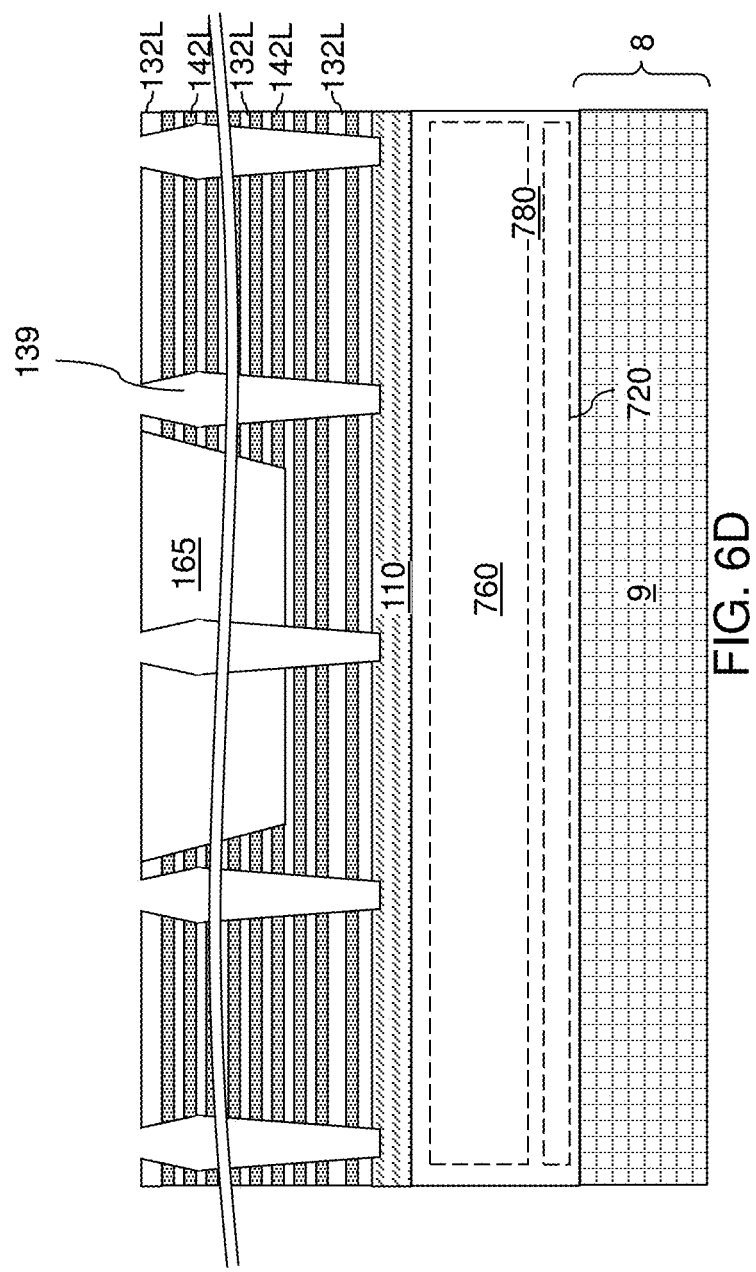
FIG. 6D is a vertical cross-sectional view of the exemplary structure along the vertical plane D-D' of FIG. 6B.
Figure 7A:
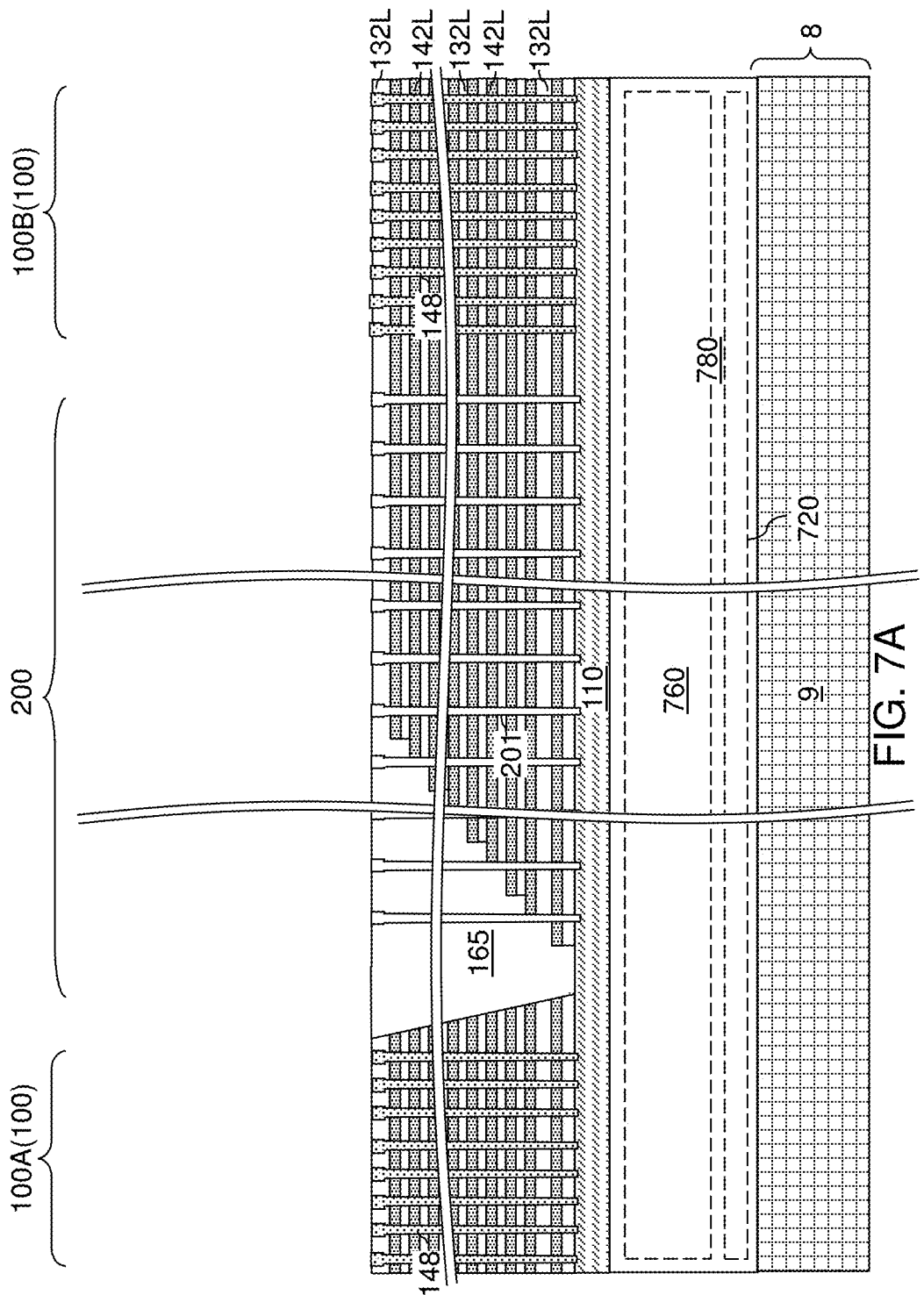
FIG. 7A is a vertical cross-sectional view of the exemplary structure after formation of first-tier support pillar portions and first-tier backside support pillar portions according to an embodiment of the present disclosure.
Figure 7B:
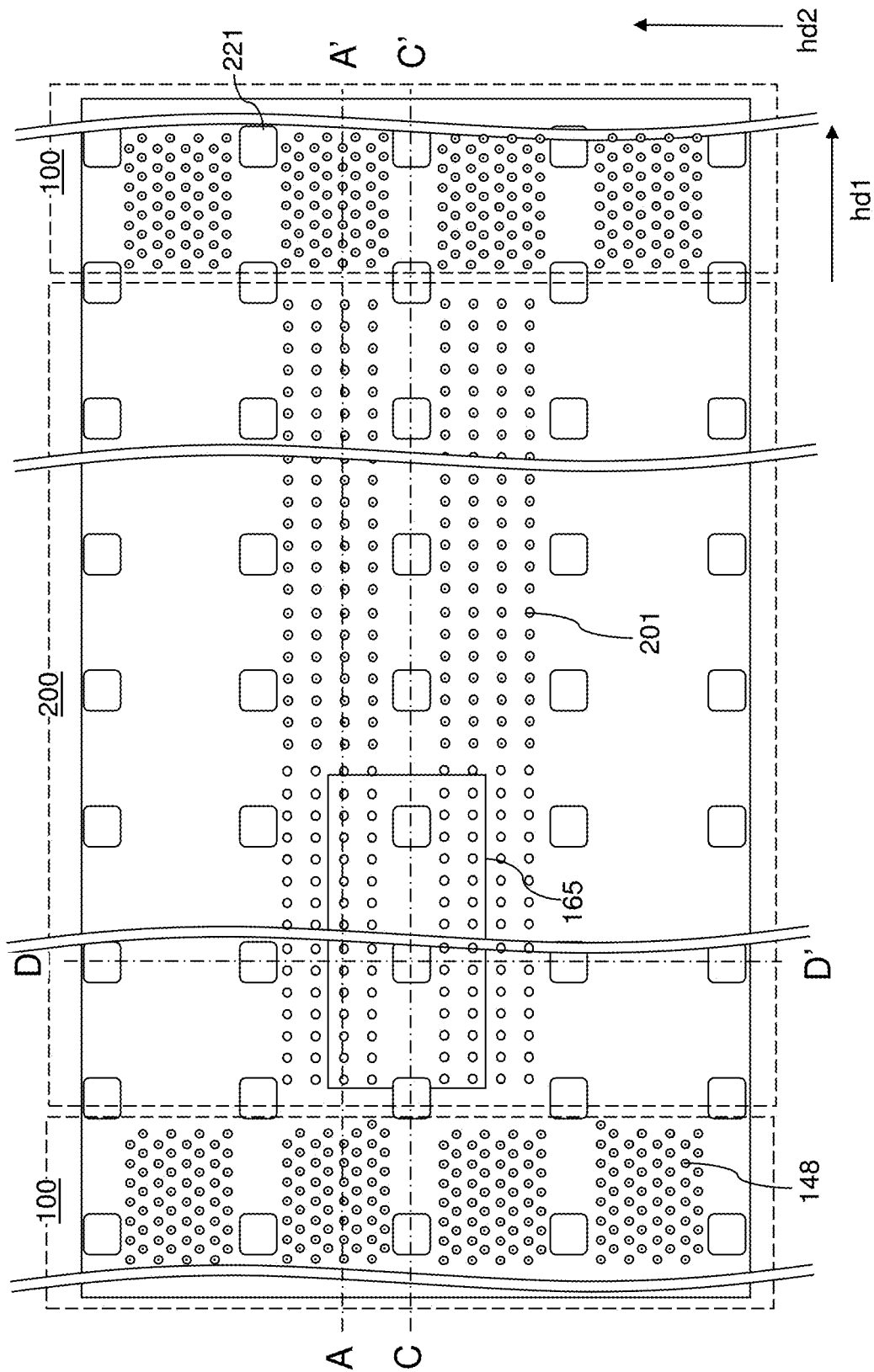
FIG. 7B is a top-down view of the exemplary structure of FIG. 7A. The vertical plane A-A' is the plane of the vertical cross-sectional view of FIG. 7A.
Figure 7C:
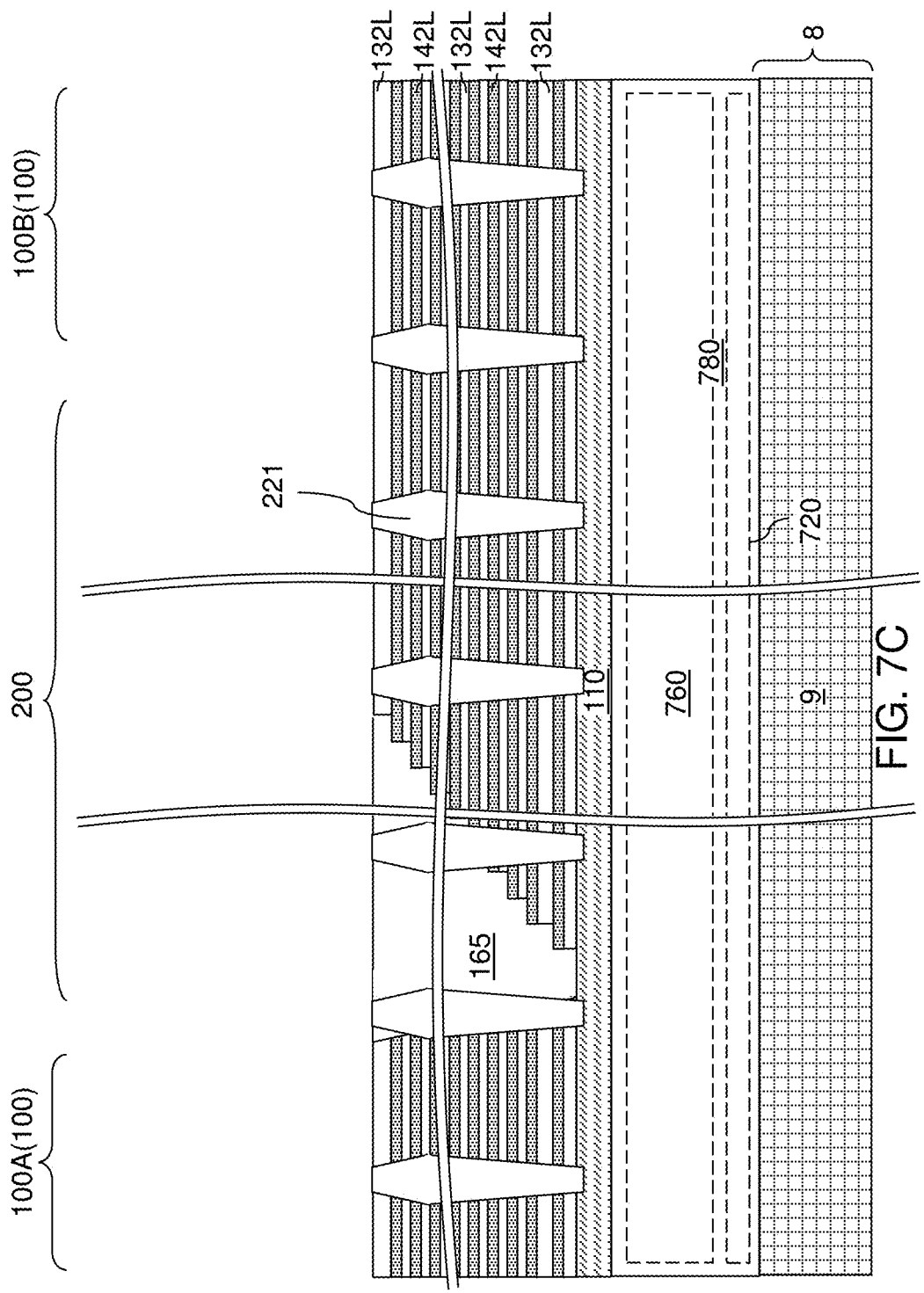
FIG. 7C is a vertical cross-sectional view of the exemplary structure along the vertical plane C-C' of FIG. 7B.
Figure 7D:
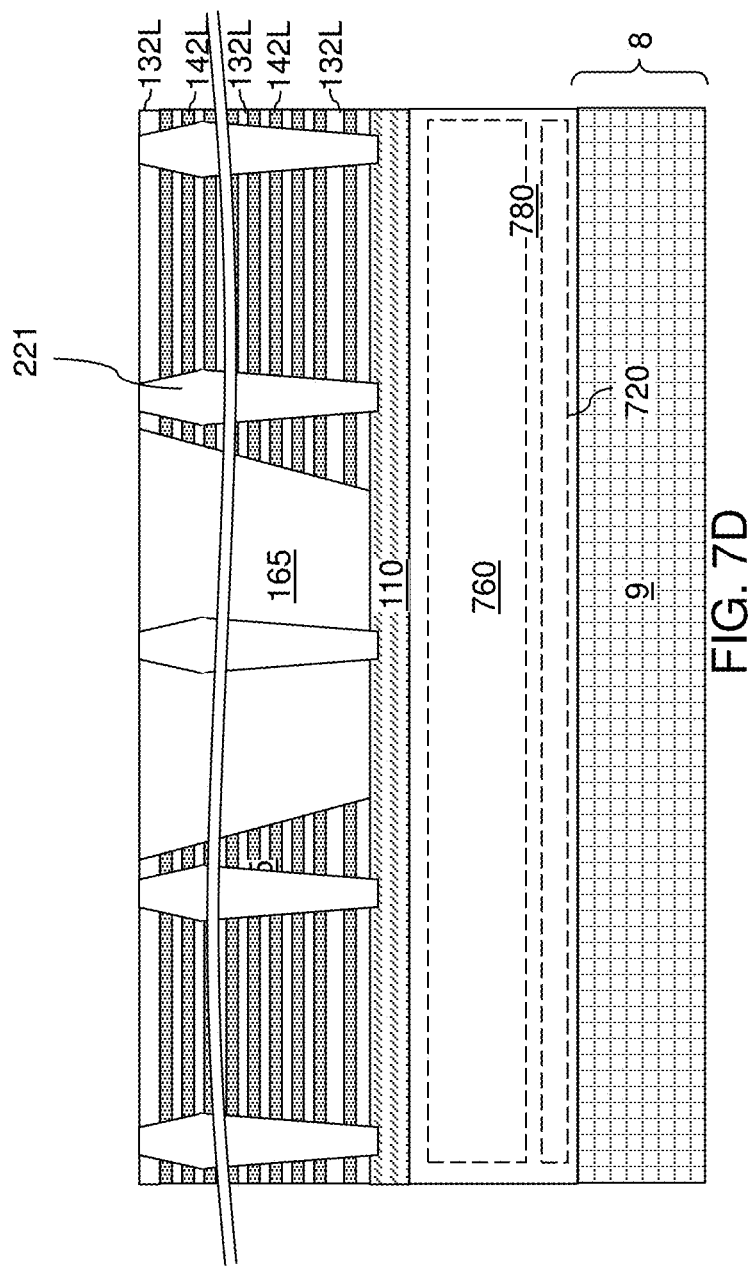
FIG. 7D is a vertical cross-sectional view of the exemplary structure along the vertical plane D-D' of FIG. 7B.

Referring to FIG. 4, a first dielectric fill material (such as undoped silicate glass (i.e., silicon oxide) or a doped silicate glass) can be deposited in each first stepped cavity 163. The first dielectric fill material can be planarized to remove excess portions of the first dielectric fill material from above the horizontal plane including the topmost surface of the first vertically alternating sequence (132L, 142L). Each remaining portion of the first dielectric fill material that fills a respective first stepped cavity constitutes a first-tier retro-stepped dielectric material portion 165.

Referring to FIGS. 5A-5D, various first-tier openings may be formed through the first vertically alternating sequence (132L, 142L) and into the semiconductor material layer 110. A photoresist layer (not shown) may be applied over the first vertically alternating sequence (132L, 142L), and may be lithographically patterned to form various openings therethrough. The pattern of openings in the photoresist layer may be transferred through the first vertically alternating sequence (132L, 142L) and into the semiconductor material layer 110 by a first anisotropic etch process to form the various first-tier openings concurrently, i.e., during the first isotropic etch process.

The various first-tier openings may include first-tier memory openings 149 formed in the memory array regions 100, first-tier support openings 129 formed in the inter-array region 200, and first-tier backside support openings 139 that are formed in rows that are arranged along the first horizontal direction hd1. Each cluster of first-tier memory openings 149 may be formed as a two-dimensional array of first-tier memory openings 149. The first-tier support openings 129 are openings that are formed in the inter-array region 200, and are subsequently employed to form support pillar structures. A subset of the first-tier support openings 129 may be formed through a respective horizontal surface of the first stepped surfaces. First-tier backside support openings 139 within each row of first-tier backside support openings 139 can be arranged along the first horizontal direction hd1 between neighboring clusters of first-tier memory openings 149. In one embodiment, each row of first-tier backside support openings 139 can laterally extend from a distal end of a first memory array region 100A, through an inter-array region 200, and to a distal end of a second memory array region 100B. Optionally, an etch stop layer may be located above the semiconductor material layer 110 to prevent over etching the first-tier backside support openings 139 too far into the semiconductor material layer 110.

In one embodiment, the first-tier memory openings 149 and the first-tier support openings 129 can have a respective circular or elliptical horizontal cross-sectional shape, and the first-tier backside support openings 139 can have a respective rectangular or rounded rectangular horizontal cross-sectional shape. A first pair of sidewalls of each first-tier backside support opening 139 can be parallel to the first horizontal direction hd1, and a second pair of sidewalls of each first-tier backside support openings 139 can be parallel to the second horizontal direction hd2. In one embodiment, each of the first-tier backside support openings 139 can have a width along the second horizontal direction hd2, which can be in a range from 50 nm to 500 nm, such as from 100 nm to 250 nm, although lesser and greater widths may also be employed. In one embodiment, each of the first-tier backside support openings 139 can have a width that is greater than the width (e.g., diameter) of the first-tier memory openings 149 and the first-tier support openings 129.

In one embodiment, each first-tier backside support opening 139 may have a respective bulging vertical cross-sectional profile, in which a top width and a bottom width of each first-tier backside support openings 139 is less than a middle width of the respective first-tier backside support opening 139 that is measured between the top portion and the bottom portion of the respective first-tier backside support opening 139. In one embodiment, the height at which each first-tier backside support opening 139 has a maximum width may be in a range from 70% to 98% of the height of the respective first-tier backside support opening 139 as measured from the bottom surface of the respective first-tier backside support opening 139.

Referring to FIGS. 6A-6D, a sacrificial first-tier fill material is deposited concurrently deposited in each of the first-tier openings (149, 129, 139). The sacrificial first-tier fill material includes a material that may be subsequently removed selective to the materials of the first continuous insulating layers 132L and the first continuous sacrificial material layers 142L. In one embodiment, the sacrificial first-tier fill material may include a semiconductor material such as silicon (e.g., a-Si or polysilicon), a silicon-germanium alloy, germanium, a III-V compound semiconductor material, or a combination thereof. Optionally, a thin etch stop liner (such as a silicon oxide layer or a silicon nitride layer having a thickness in a range from 1 nm to 3 nm) may be used prior to depositing the sacrificial first-tier fill material. The sacrificial first-tier fill material may be formed by a non-conformal deposition or a conformal deposition method.

In another embodiment, the sacrificial first-tier fill material may include a silicon oxide material having a higher etch rate than the materials of the first continuous insulating layers 132L. For example, the sacrificial first-tier fill material may include borosilicate glass or porous or non-porous organosilicate glass having an etch rate that is at least 100 times higher than the etch rate of densified TEOS oxide (i.e., a silicon oxide material formed by decomposition of tetraethylorthosilicate glass in a chemical vapor deposition process and subsequently densified in an anneal process) in a 100:1 dilute hydrofluoric acid. In this case, a thin etch stop liner (such as a silicon nitride layer having a thickness in a range from 1 nm to 3 nm) may be used prior to depositing the sacrificial first-tier fill material. The sacrificial first-tier fill material may be formed by a non-conformal deposition or a conformal deposition method.

In yet another embodiment, the sacrificial first-tier fill material may include carbon-containing material (such as amorphous carbon or diamond-like carbon) that may be subsequently removed by ashing, or a silicon-based polymer that may be subsequently removed selective to the materials of the first vertically alternating sequence (132L, 142L).

Portions of the deposited sacrificial material may be removed from above the topmost layer of the first vertically alternating sequence (132L, 142L), such as from above the topmost first continuous insulating layer 132L. For example, the sacrificial first-tier fill material may be recessed to a top surface of the topmost first continuous insulating layer 132L using a planarization process. The planarization process may include a recess etch process, chemical mechanical planarization (CMP), or a combination thereof. The top surface of the topmost first continuous insulating layer 132L may be used as an etch stop layer or a planarization stop layer.

A photoresist layer can be applied over the exemplary structure, and can be lithographically patterned to cover areas of the first-tier memory openings 149 without covering the areas of the first-tier support openings 129 and the first-tier backside support openings 139. An etch process that selectively etches the sacrificial first-tier fill material relative to the materials of the first vertically alternating sequence (132L, 142L). The sacrificial first-tier fill material can be removed from inside the first-tier support openings 129 and from inside the first-tier backside support openings 139. The photoresist layer can be subsequently removed, for example, by ashing. Each remaining portion of the sacrificial first-tier fill material in the first-tier memory openings 149 constitutes a sacrificial first-tier memory opening fill portion 148. Clusters of sacrificial first-tier memory opening fill portions 148 can be formed within each memory array region 100.

Referring to FIGS. 7A-7D, a dielectric first-tier fill material can be conformally concurrently deposited in each of the first-tier support openings 129 and in each of the first-tier backside support openings 139. The dielectric first-tier fill material can include, for example, undoped silicate glass or a doped silicate glass. The dielectric first-tier fill material may be formed, for example, by chemical vapor deposition.

Portions of the deposited dielectric first-tier fill material may be removed from above the topmost layer of the first vertically alternating sequence (132L, 142L), such as from above the topmost first continuous insulating layer 132L. For example, the dielectric first-tier fill material may be recessed to a top surface of the topmost first continuous insulating layer 132L using a planarization process. The planarization process may include a recess etch process, chemical mechanical planarization (CMP), or a combination thereof. The top surface of the topmost first continuous insulating layer 132L may be used as an etch stop layer or a planarization stop layer. Each remaining portion of the dielectric first-tier fill material in the first-tier support openings 129 constitutes a first-tier support pillar portion 201. Each remaining portion of the dielectric first-tier fill material in the first-tier backside support openings 139 constitutes a first-tier backside support pillar portion 221.

Figure 8:
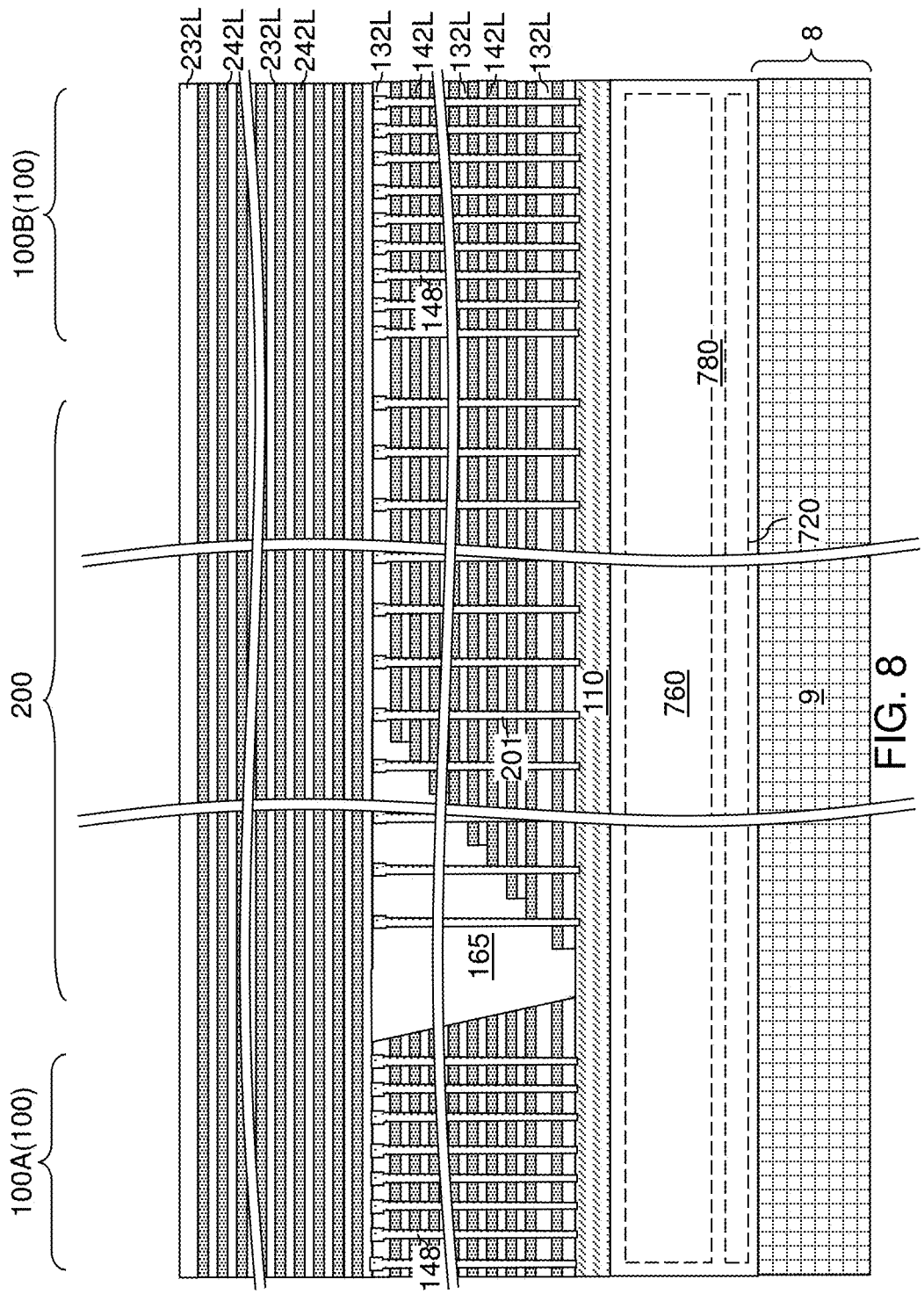
Figure 10A:
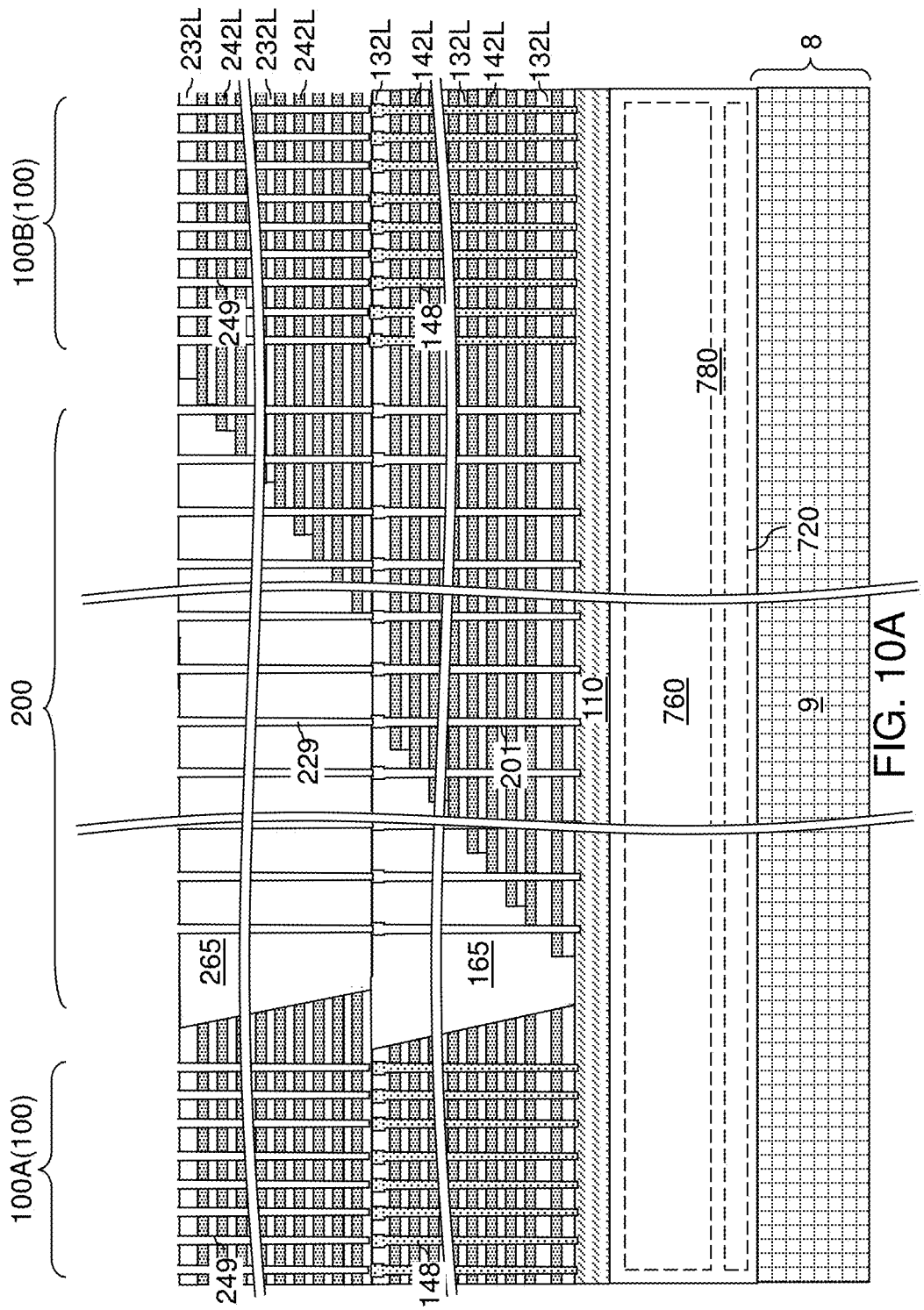
FIG. 10A is a vertical cross-sectional view of the exemplary structure after formation of second-tier openings according to an embodiment of the present disclosure.
Figure 10B:
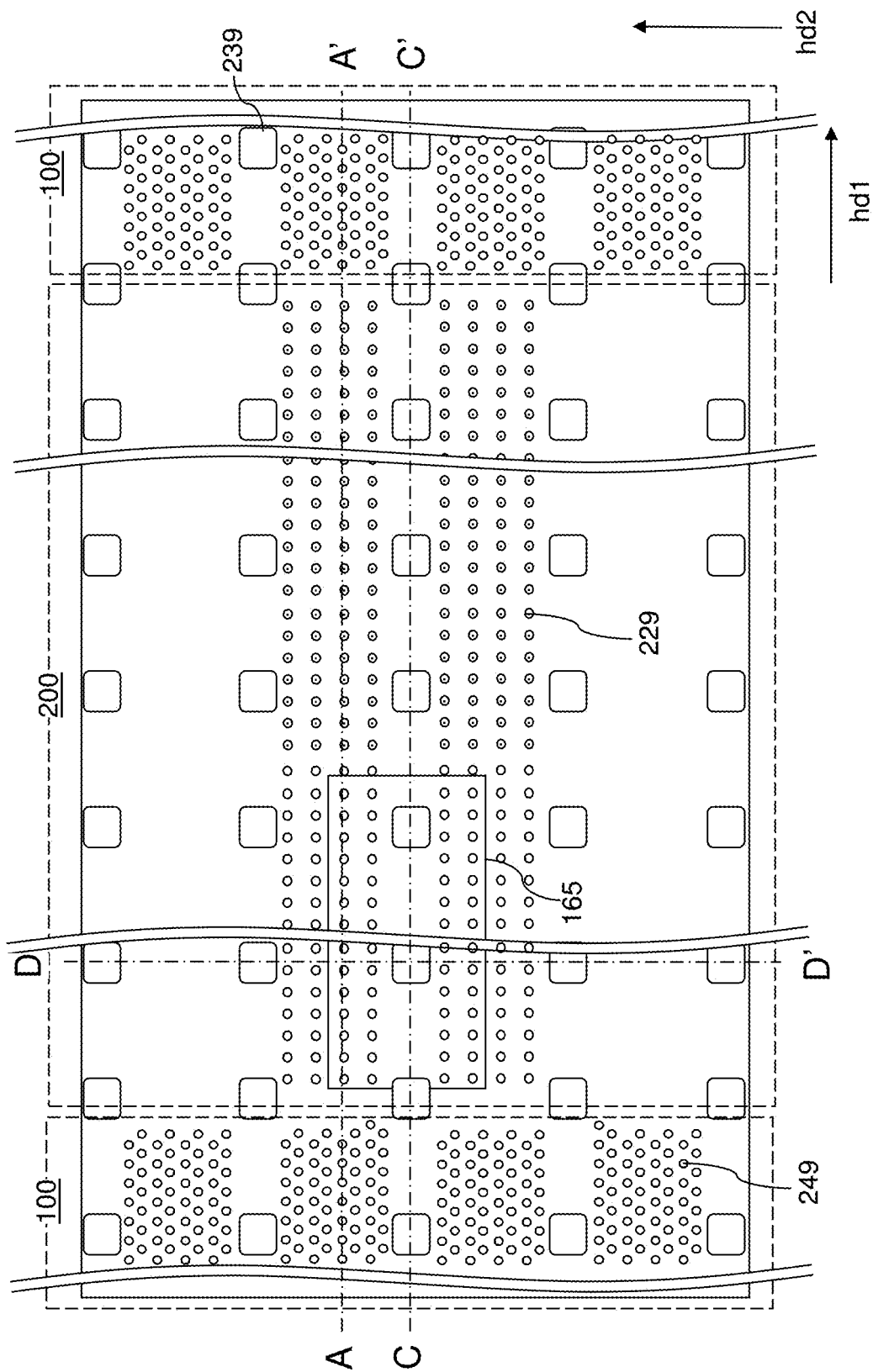
FIG. 10B is a top-down view of the exemplary structure of FIG. 10A. The vertical plane A-A' is the plane of the vertical cross-sectional view of FIG. 10A.
Figure 10C:
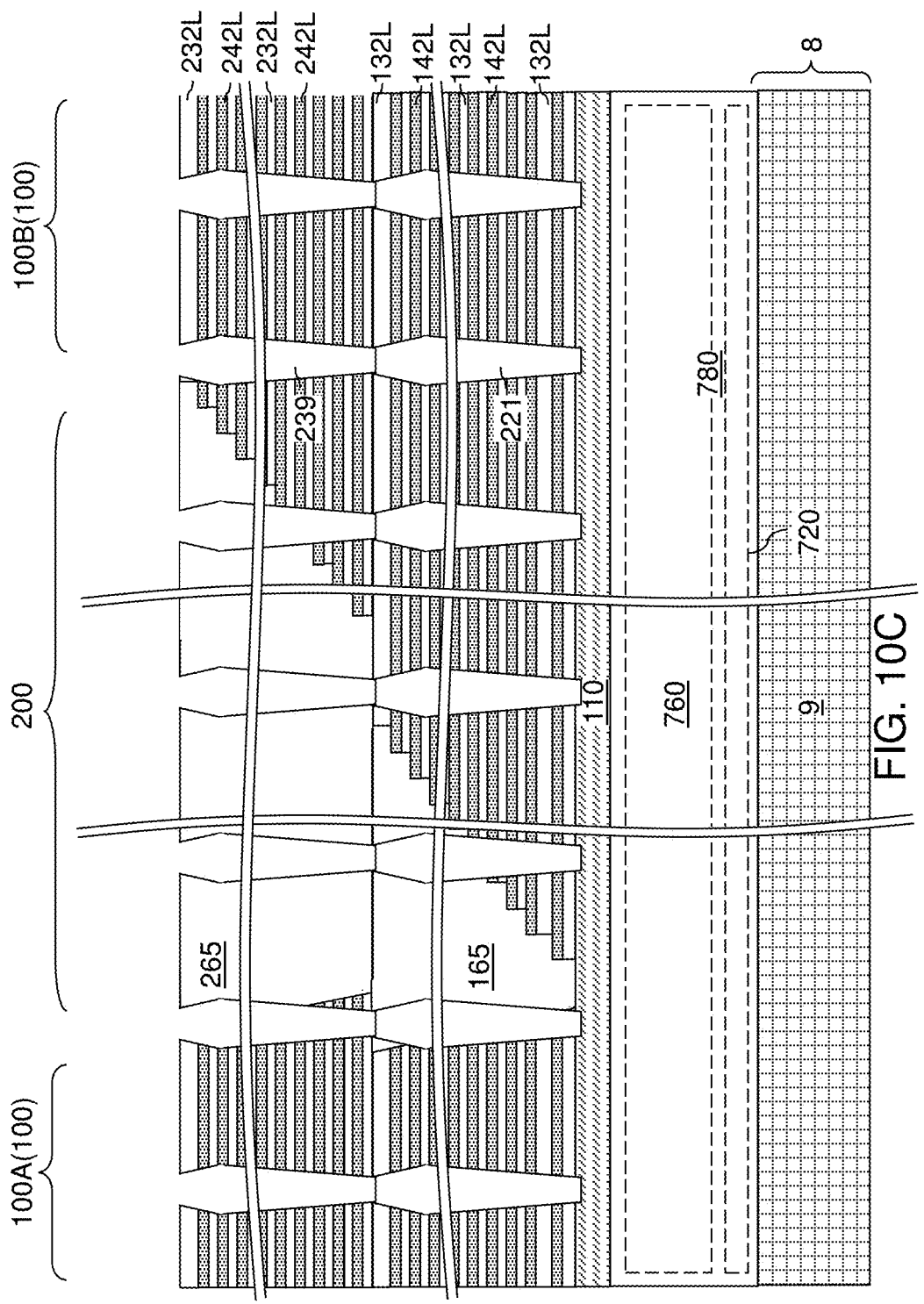
FIG. 10C is a vertical cross-sectional view of the exemplary structure along the vertical plane C-C' of FIG. 10B.
Figure 10D:
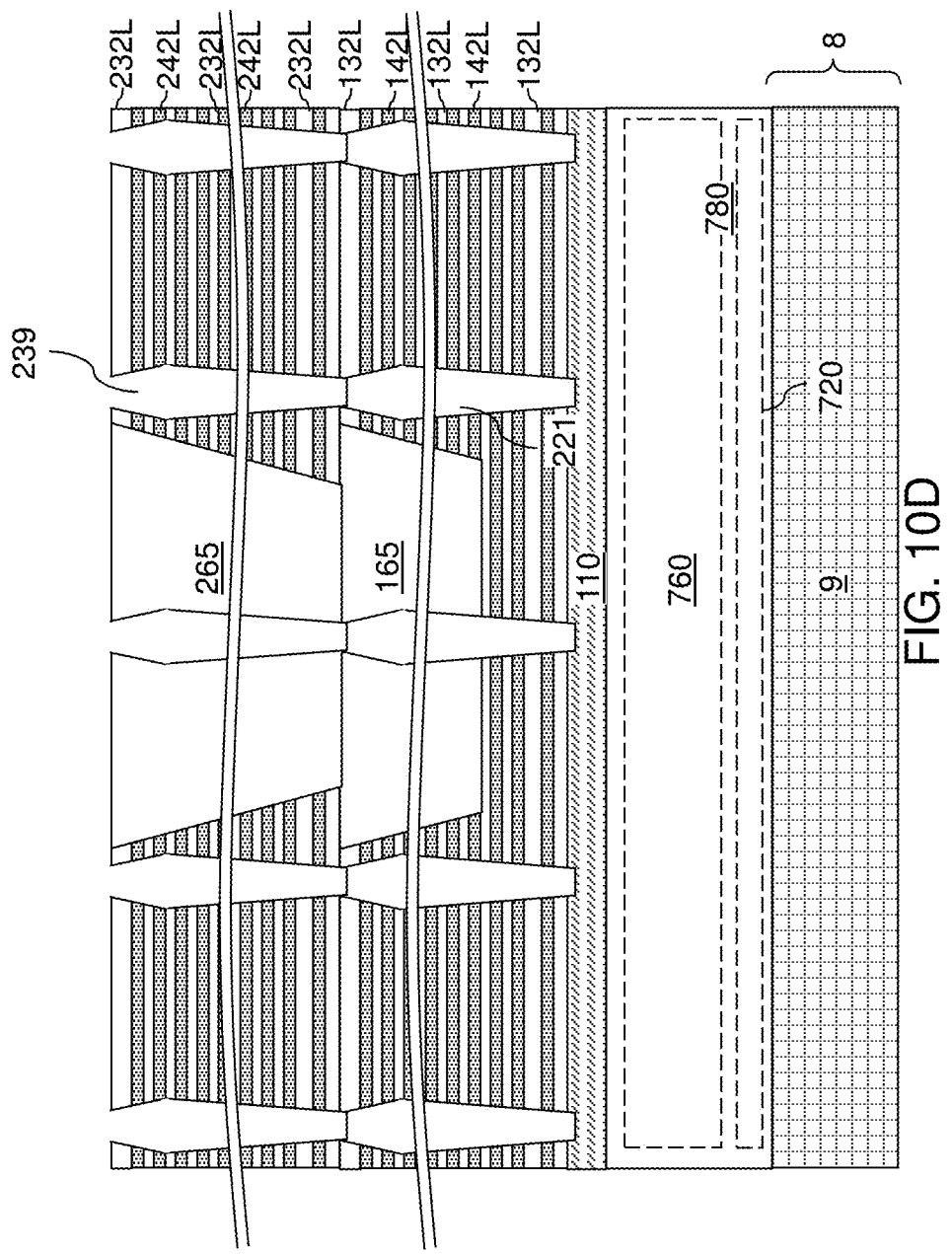
FIG. 10D is a vertical cross-sectional view of the exemplary structure along the vertical plane D-D' of FIG. 10B.
Figure 11A:
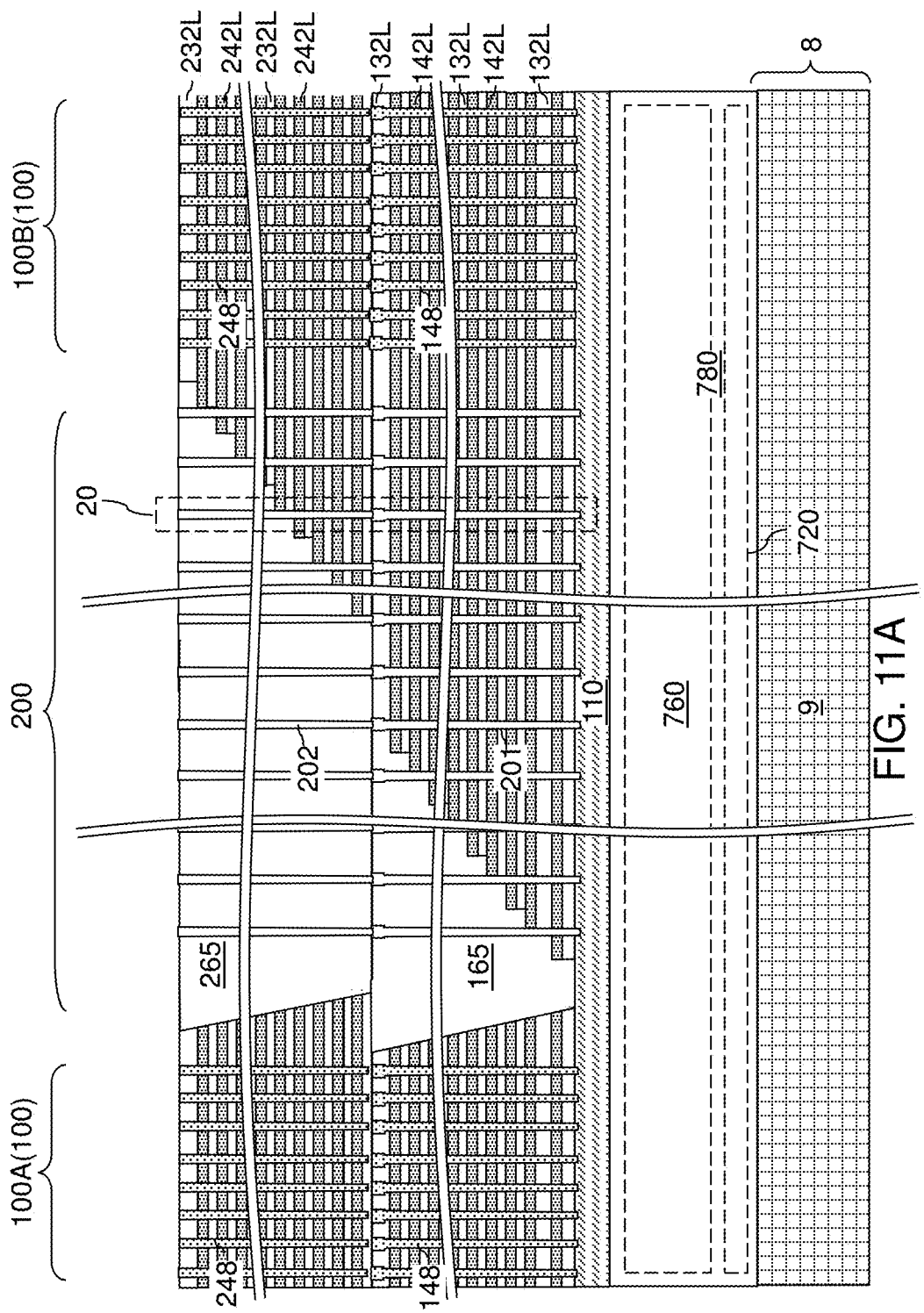
FIG. 11A is a vertical cross-sectional view of the exemplary structure after formation of sacrificial second-tier memory opening fill portions, second-tier support pillar portions, and second-tier backside support pillar portions according to an embodiment of the present disclosure.
Figure 11B:
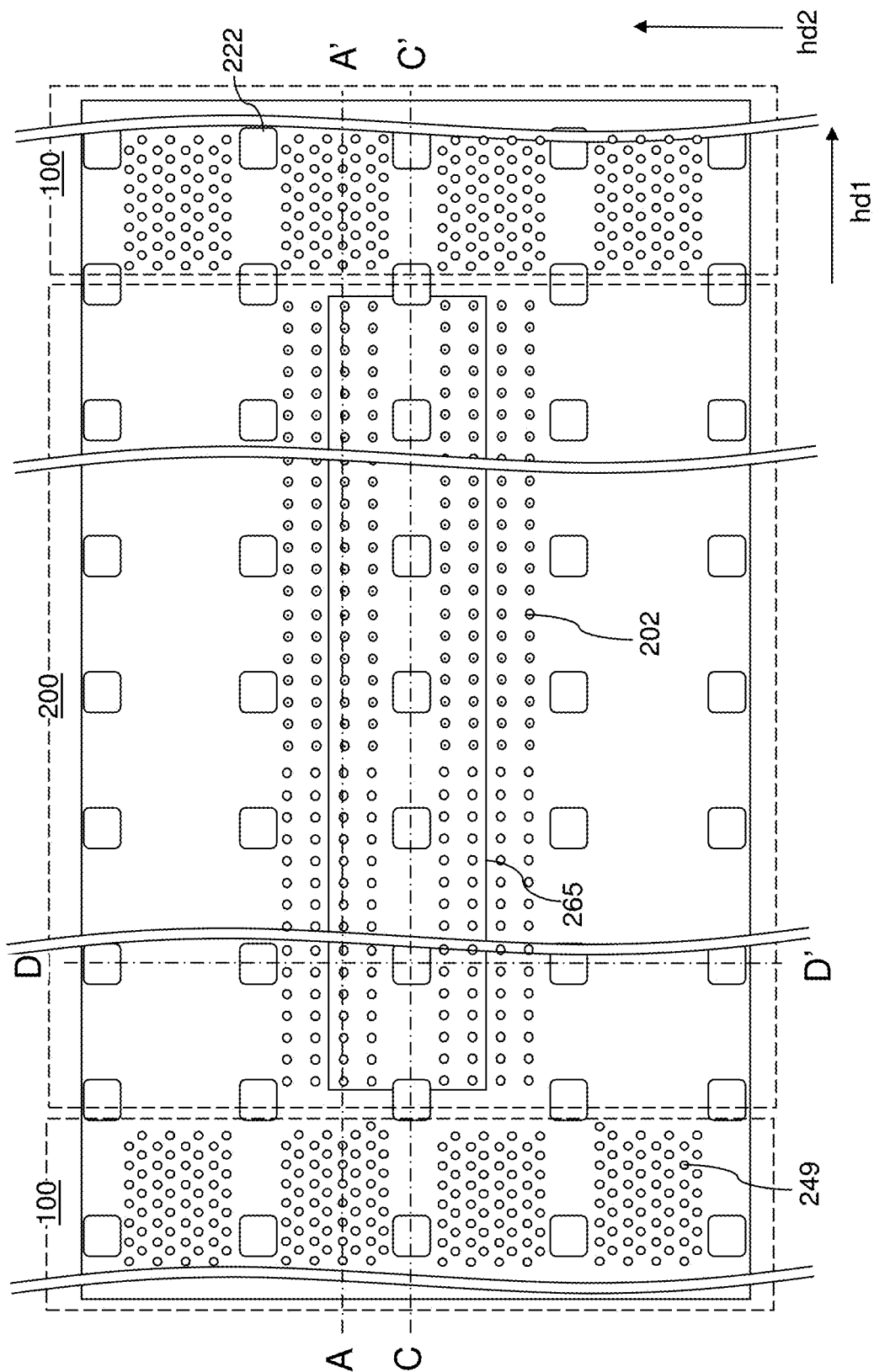
FIG. 11B is a top-down view of the exemplary structure of FIG. 11A. The vertical plane A-A' is the plane of the vertical cross-sectional view of FIG. 11A.
Figure 11C:
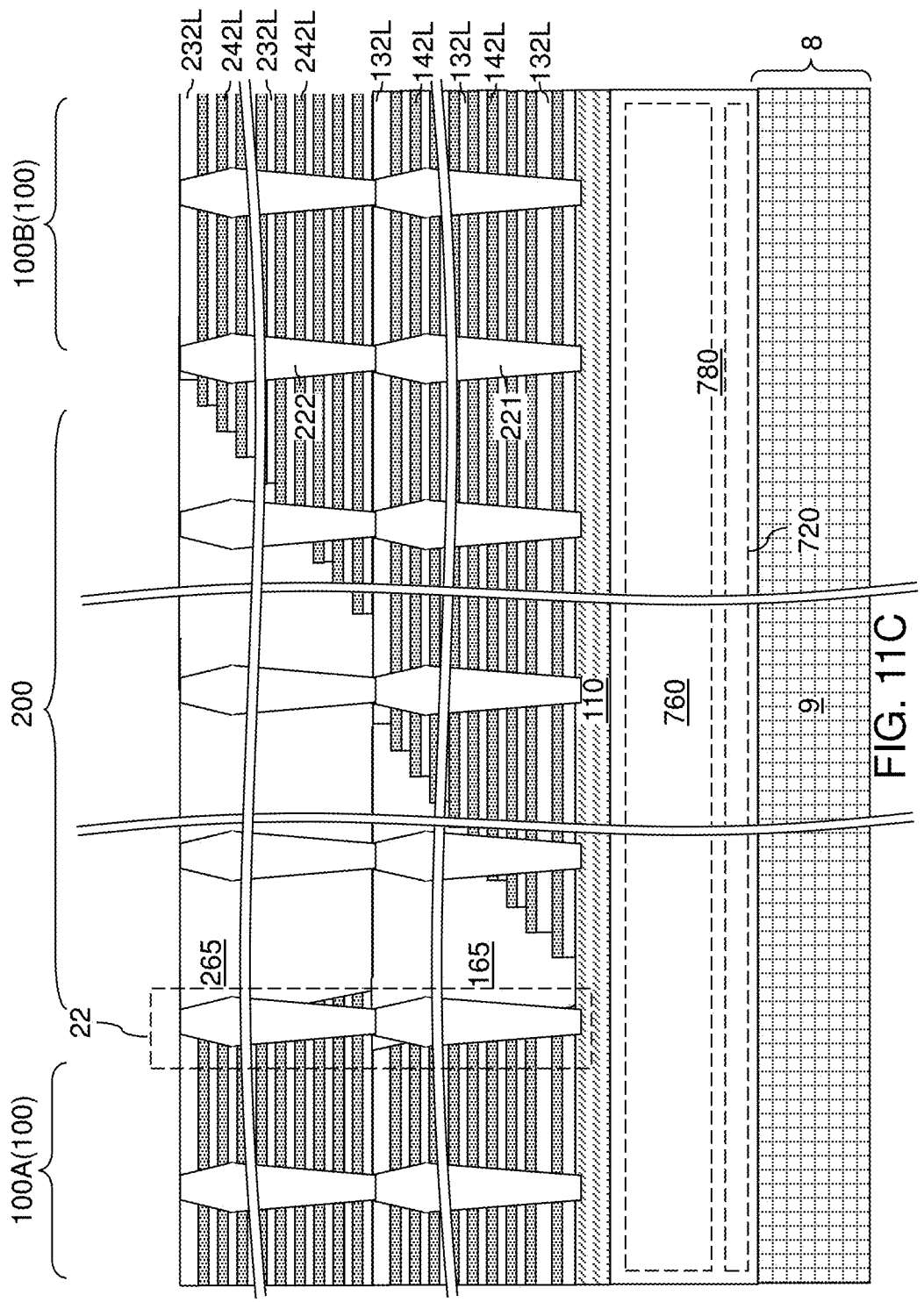
FIG. 11C is a vertical cross-sectional view of the exemplary structure along the vertical plane C-C' of FIG. 11B.
Figure 11D:
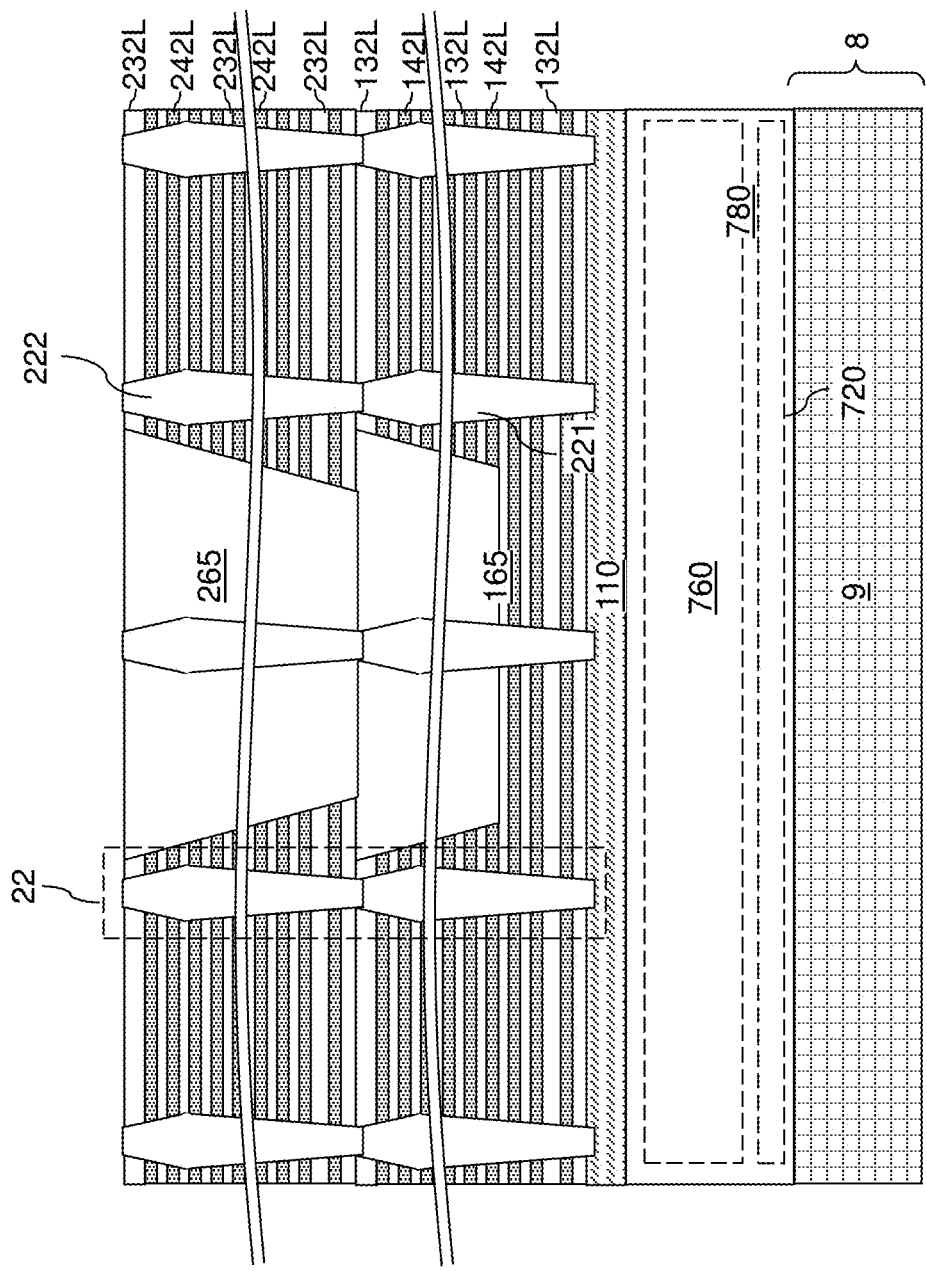
FIG. 11D is a vertical cross-sectional view of the exemplary structure along the vertical plane D-D' of FIG. 11B.

Referring to FIG. 8, a second vertically alternating sequence of second continuous insulating layers 232L and second continuous sacrificial material layers 242L can be formed. Each of the second continuous insulating layers 232L is an insulating layer that continuously extends over the entire area of the substrate 8, and may have a uniform thickness throughout. Each of the second sacrificial material layers 242L includes is a sacrificial material layer that includes a dielectric material and continuously extends over the entire area of the substrate 8, and may have a uniform thickness throughout. The second continuous insulating layers 232L can have the same material composition and the same thickness as the first continuous insulating layers 132L. The second sacrificial material layers 242L can have the same material composition and the same thickness as the first sacrificial material layers 142L.

Generally, at least one vertically alternating sequence of continuous insulating layers (132L, 232L) and continuous sacrificial material layers (142L, 242L) can be formed over a substrate 8. In some embodiments, at least one additional vertically alternating sequence of additional continuous insulating layers and additional continuous sacrificial material layers can be optionally formed over the first vertically alternating sequence (132L, 142L) and the first-tier retro-stepped dielectric material portions 165.

Referring to FIG. 9, second stepped surfaces can be formed within the inter-array region 200 simultaneously. The areas of the second stepped surfaces are laterally offset from respective proximal first stepped surfaces along the first horizontal direction hd1 so that a set of first stepped surfaces and a set of second stepped surfaces that are laterally spaced along the first horizontal direction hd1 and are not offset along the second horizontal direction hd2 can provide a continuously ascending staircase or a continuously descending staircase. For example, a hard mask layer (not shown) such as a metallic or dielectric mask material layer can be formed over the second vertically alternating sequence, and can be patterned to form multiple rectangular openings that are laterally offset from a respective first-tier retro-stepped dielectric material portion 165 along the first horizontal direction hd1 and are aligned to (i.e., not laterally offset from) the respective first-tier retro-stepped dielectric material portion 165 along the second horizontal direction hd2. The areas of openings within the hard mask layer correspond to areas in which second stepped surfaces are to be subsequently formed. Each opening through the hard mask layer may be rectangular, and may have a pair of sides that are parallel to the first horizontal direction hd1 and a pair of sides that are parallel to the second horizontal direction hd2. The rectangular openings through the hard mask layer may be arranged along the second horizontal direction hd1, and may be alternately staggered along the second horizontal direction hd2. Thus, upon sequentially numbering the rectangular openings along the second horizontal direction hd2, every odd-numbered rectangular opening through the hard mask layer can be formed as a first one-dimensional array arranged along the second horizontal direction hd2 and aligned along the first horizontal direction hd1 (i.e., having a same lateral extent along the first horizontal direction), and every even-numbered rectangular openings through the hard mask layer can be formed as a second one-dimensional array arranged along the second horizontal direction hd2 aligned along the first horizontal direction hd1.

A trimmable mask layer (not shown) can be applied over the second vertically alternating sequence. The trimmable mask layer can include a trimmable photoresist layer that can be controllably trimmed by a timed ashing process. The trimmable mask layer can be patterned with an initial pattern such that a segment of each rectangular opening in the hard mask layer that is most distal from the memory array regions 100 is not masked by the trimmable mask layer, while the rest of each rectangular opening is covered by the trimmable mask layer. For example, the trimmable mask layer can have a rectangular shape having straight edges that are parallel to the second horizontal direction hd2, such that the straight edges are located over a vertical step S of respective second stepped surfaces that is most distal from one of the memory array regions 100.

The second stepped surfaces can be formed within the rectangular openings in the hard mask layer by iteratively performing a set of layer patterning processing steps as many times as the total number of second continuous sacrificial material layers 242L within the second vertically alternating sequence less 1. The set of layer patterning processing steps comprises an anisotropic etch process that etches unmasked portions of a pair of a second continuous insulating layer 232L and a second continuous sacrificial material layer 242L, and a mask trimming process in which the trimmable mask layer is isotropically trimmed to provide shifted sidewalls that are shifted away from the most proximal memory array region 100. A final anisotropic etch process can be performed after the last mask trimming process, and the trimmable mask layer can be removed, for example, by ashing. The hard mask layer can be removed selective to the materials of the second vertically alternating sequence (232L, 242L), for example, by an isotropic etch process (such as a wet etch process).

A second stepped cavity can be formed within each area of the rectangular opening in the hard mask layer. Each second stepped cavity can include a cliff region in which a tapered sidewall of the second vertically alternating sequence vertically extends from the bottommost layer of the second vertically alternating sequence (232L, 242L) to the topmost layer of the second vertically alternating sequence (232L, 242L). Each second stepped cavity has respective second stepped surfaces as stepped bottom surfaces. Each second stepped cavity has a pair of stepped sidewalls that laterally extend along the first horizontal direction hd1. Each stepped sidewall of the second stepped cavity adjoins the second stepped surfaces at the bottom edge, and extends to the top surface of the topmost layer of the second vertically alternating sequence (232L, 242L). Each second stepped cavity defines the lateral extent of respective second stepped surfaces.

The array of second staircase regions can be arranged along the second horizontal direction hd2 with an alternating lateral offsets along the first horizontal direction hd1 to provide a staggered configuration for the second staircase regions. In other words, upon sequentially numerically labeling the second staircase regions with positive integers starting with 1 along the second horizontal direction hd2, every even-numbered second staircase region may be closer to the first memory array region 100A than to the second memory array region 100B, and every odd-numbered second staircase region may be closer to the second memory array region 100B than to the first memory array region 100A. The second stepped cavities can extend through each layer within the second vertically alternating sequence (232L, 242L).

A second dielectric fill material (such as undoped silicate glass or a doped silicate glass) can be deposited in each second stepped cavity and in each well. The second dielectric fill material can be planarized to remove excess portions of the second dielectric fill material from above the horizontal plane including the topmost surface of the second vertically alternating sequence (232L, 242L). Each remaining portion of the second dielectric fill material that fills a respective second stepped cavity constitutes a second-tier retro-stepped dielectric material portion 265. Thus, the second-tier retro-stepped dielectric material portions 265 are formed through the second vertically alternating sequence (232L, 242L).

Referring to FIGS. 10A-10D, various second-tier openings may be formed through the second vertically alternating sequence (232L, 242L). A photoresist layer (not shown) may be applied over the second vertically alternating sequence (232L, 242L), and may be lithographically patterned to form various openings therethrough. The pattern of openings in the photoresist layer may be the same as the pattern of the first-tier openings (149, 129, 139). The pattern of the openings in the photoresist layer can be transferred through the second vertically alternating sequence (232L, 242L) by a second anisotropic etch process to form the various second-tier openings (249, 229, 239) concurrently, i.e., during the second isotropic etch process.

The various second-tier openings (249, 229, 239) may include second-tier memory openings 249 formed in the memory array regions 100, second-tier support openings 229 formed in the inter-array region 200, and second-tier backside support openings 239 that are formed in rows that are arranged along the first horizontal direction hd1. Each cluster of second-tier memory openings 249 may be formed as a two-dimensional array of second-tier memory openings 249. The second-tier support openings 229 are openings that are formed in the inter-array region 200, and are subsequently employed to form support pillar structures. A subset of the second-tier support openings 229 may be formed through a respective horizontal surface of the second stepped surfaces. Second-tier backside support openings 239 within each row of second-tier backside support openings 239 can be arranged along the first horizontal direction hd1 between neighboring clusters of second-tier memory openings 249. In one embodiment, each row of second-tier backside support openings 239 can laterally extend from a distal end of a first memory array region 100A, through an inter-array region 200, and to a distal end of a second memory array region 100B.

In one embodiment, the second-tier memory openings 249 and the second-tier support openings 229 can have a respective circular or elliptical horizontal cross-sectional shape, and the second-tier backside support openings 239 can have a respective rectangular or rounded rectangular horizontal cross-sectional shape. A first pair of sidewalls of each second-tier backside support opening 239 can be parallel to the second horizontal direction hd1, and a second pair of sidewalls of each second-tier backside support openings 239 can be parallel to the second horizontal direction hd2. In one embodiment, each of the second-tier backside support openings 239 can have a width along the second horizontal direction hd2, which can be in a range from 50 nm to 500 nm, such as from 200 nm to 250 nm, although lesser and greater widths may also be employed. In one embodiment, each of the second-tier backside support openings 239 can have a width that is greater than the width (e.g., diameter) of the second-tier memory openings 249 and the second-tier support openings 229.

In one embodiment, each second-tier backside support opening 239 may have a respective bulging vertical cross-sectional profile, in which a top width and a bottom width of each second-tier backside support openings 239 is less than a middle width of the respective second-tier backside support opening 239 that is measured between the top portion and the bottom portion of the respective second-tier backside support opening 239. In one embodiment, the height at which each second-tier backside support opening 239 has a maximum width may be in a range from 70% to 98% of the height of the respective second-tier backside support opening 239 as measured from the bottom surface of the respective second-tier backside support opening 239.

Referring to FIGS. 11A-11D, a sacrificial second-tier fill material is deposited concurrently deposited in each of the second-tier openings (249, 229, 239). The sacrificial second-tier fill material includes a material that may be subsequently removed selective to the materials of the second continuous insulating layers 232L and the second continuous sacrificial material layers 242L. In one embodiment, the sacrificial second-tier fill material can include any material that may be employed as the sacrificial first-tier fill material described above.

Portions of the deposited sacrificial material may be removed from above the topmost layer of the second vertically alternating sequence (232L, 242L), such as from above the topmost second continuous insulating layer 232L. For example, the sacrificial second-tier fill material may be recessed to a top surface of the topmost second continuous insulating layer 232L using a planarization process. The planarization process may include a recess etch process, chemical mechanical planarization (CMP), or a combination thereof. The top surface of the topmost second continuous insulating layer 232L may be used as an etch stop layer or a planarization stop layer.

A photoresist layer can be applied over the exemplary structure, and can be lithographically patterned to cover areas of the second-tier memory openings 249 without covering the areas of the second-tier support openings 229 and the second-tier backside support openings 239. An etch process that selectively etches the sacrificial second-tier fill material relative to the materials of the second vertically alternating sequence (232L, 242L). The sacrificial second-tier fill material can be removed from inside the second-tier support openings 229 and from inside the first-tier backside support openings 239. The photoresist layer can be subsequently removed, for example, by ashing. Each remaining portion of the sacrificial second-tier fill material in the second-tier memory openings 249 constitutes a sacrificial second-tier memory opening fill portion 248. Clusters of sacrificial second-tier memory opening fill portions 248 can be formed within each memory array region 100.

A dielectric second-tier fill material can be conformally concurrently deposited in each of the second-tier support openings 229 and in each of the second-tier backside support openings 239. The dielectric second-tier fill material can include, for example, undoped silicate glass or a doped silicate glass. The dielectric second-tier fill material may be formed, for example, by chemical vapor deposition.

Portions of the deposited dielectric second-tier fill material may be removed from above the topmost layer of the second vertically alternating sequence (232L, 242L), such as from above the topmost second continuous insulating layer 232L. For example, the dielectric second-tier fill material may be recessed to a top surface of the topmost second continuous insulating layer 232L using a planarization process. The planarization process may include a recess etch process, chemical mechanical planarization (CMP), or a combination thereof. The top surface of the topmost second continuous insulating layer 232L may be used as an etch stop layer or a planarization stop layer. Each remaining portion of the dielectric second-tier fill material in the second-tier support openings 229 constitutes a second-tier support pillar portion 202. Each remaining portion of the dielectric second-tier fill material in the second-tier backside support openings 239 constitutes a second-tier backside support pillar portion 222.

Each vertical stack of a first-tier support pillar portion 201 and a second-tier support pillar portion 202 constitutes a support pillar structure 20. Each vertical stack of a first-tier backside support pillar structure 221 and a second-tier backside support pillar structure 222 constitutes a backside support pillar structure 22.

Generally, rows of backside support pillar structures 22 can be formed through at least one vertically alternating sequence of continuous insulating layers (132L, 232L) and continuous sacrificial material layers (142L, 242L), such as a first vertically alternating sequence of first continuous insulating layers 132L and first continuous sacrificial material layers 142L and a second vertically alternating sequence of second continuous insulating layers 232L and second continuous sacrificial material layers 242L. Each row of the backside support pillar structures 22 comprises a subset of the backside support pillar structures 22 that are arranged along the first horizontal direction hd1. In one embodiment, each of the backside support pillar structures 22 vertically extends at least between a first horizontal plane including bottommost surfaces of the at least one vertically alternating sequence {(132L, 142L), (232L, 242L)} and a second horizontal plane including topmost surfaces of the at least one vertically alternating sequence {(132L, 142L), (232L, 242L)}.

Arrays of support pillar structures 20 can be formed between the rows of backside support pillar structures 22 and through the at least one vertically alternating sequence {(132L, 142L), (232L, 242L)} concurrently with formation of the backside support pillar structures 22. The support pillar structures 20 and the backside support pillar structures 22 are formed by a same set of dielectric material deposition processes. Thus, the support pillar structures 20 and the backside support pillar structures 22 comprise the same dielectric material. In one embodiment, each of the support pillar structures 20 can have a respective circular or elliptical horizontal cross-sectional shape. In one embodiment, each of the backside support pillar structures 22 can have a width that is greater than the width (e.g., diameter) of the support pillar structures 20.

Figure 12:
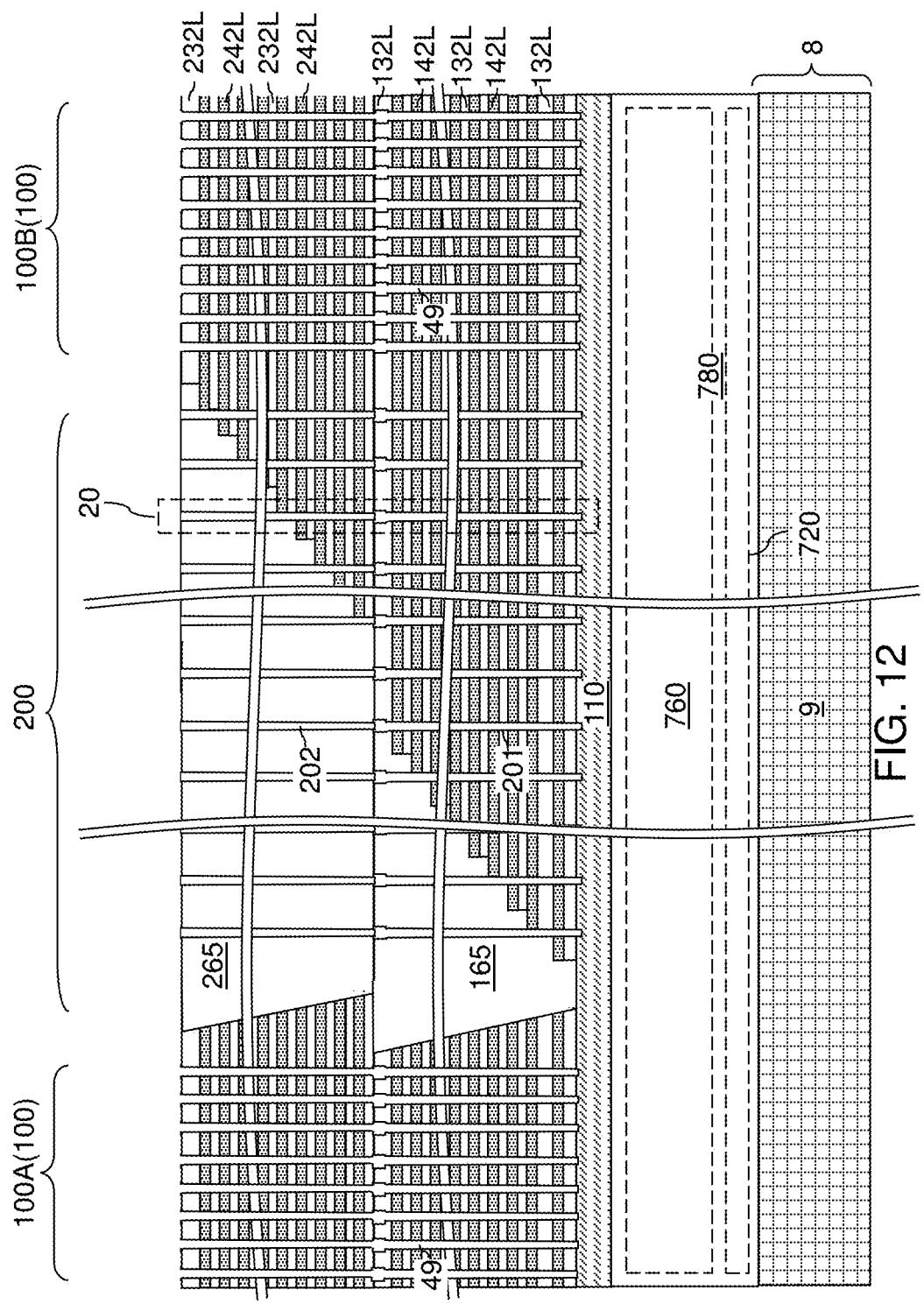
FIG. 12 is a vertical cross-sectional view of the exemplary structure after formation of inter-tier memory openings according to an embodiment of the present disclosure.

Referring to FIGS. 12 and 13A, the sacrificial fill materials of the sacrificial second-tier memory opening fill portions 248 and the sacrificial first-tier memory opening fill portions 148 can be removed selective to the materials of the at least one vertically alternating sequence {(132L, 142L), (232L, 242L)}, the support pillar structures 20 and the backside support pillar structures 22 by performing an etch process. The etch process can remove the sacrificial fill materials without significantly removing the materials of the at least one vertically alternating sequence {(132L, 142L), (232L, 242L)}. Inter-tier memory openings 49, which are herein referred to as memory openings 49, are formed in volumes from which the sacrificial second-tier memory opening fill portions 248 and the sacrificial first-tier memory opening fill portions 148 are removed. Each memory opening 49 includes a volume of a vertical stack of a sacrificial second-tier memory opening fill portion 248 and a sacrificial first-tier memory opening fill portion 148. Each memory opening 49 extends through the first-tier structure and the second-tier structure. Generally, memory openings 49 can be formed within each memory array region 100, in which each layer of the first vertically alternating sequence (132L, 142L) and each layer within the second vertically alternating sequence (232L, 242L) are present.

Referring to FIG. 13B, a stack of layers including a blocking dielectric layer 52, a charge storage layer 54, and a tunneling dielectric layer 56 may be sequentially deposited in the inter-tier memory openings 49. The blocking dielectric layer 52 may include a single dielectric material layer or a stack of a plurality of dielectric material layers. In one embodiment, the blocking dielectric layer may include a dielectric metal oxide layer consisting essentially of a dielectric metal oxide. As used herein, a dielectric metal oxide refers to a dielectric material that includes at least one metallic element and at least oxygen. The dielectric metal oxide may consist essentially of the at least one metallic element and oxygen, or may consist essentially of the at least one metallic element, oxygen, and at least one non-metallic element such as nitrogen. In one embodiment, the blocking dielectric layer 52 may include a dielectric metal oxide having a dielectric constant greater than 7.9, i.e., having a dielectric constant greater than the dielectric constant of silicon nitride. The thickness of the dielectric metal oxide layer may be in a range from 1 nm to 20 nm, although lesser and greater thicknesses may also be used. The dielectric metal oxide layer may subsequently function as a dielectric material portion that blocks leakage of stored electrical charges to control gate electrodes. In one embodiment, the blocking dielectric layer 52 includes aluminum oxide. Alternatively or additionally, the blocking dielectric layer 52 may include a dielectric semiconductor compound such as silicon oxide, silicon oxynitride, silicon nitride, or a combination thereof.

Subsequently, the charge storage layer 54 may be formed. In one embodiment, the charge storage layer 54 may be a continuous layer or patterned discrete portions of a charge trapping material including a dielectric charge trapping material, which may be, for example, silicon nitride. Alternatively, the charge storage layer 54 may include a continuous layer or patterned discrete portions of a conductive material such as doped polysilicon or a metallic material that is patterned into multiple electrically isolated portions (e.g., floating gates), for example, by being formed within lateral recesses into continuous sacrificial material layers (142L, 242L). In one embodiment, the charge storage layer 54 includes a silicon nitride layer. In one embodiment, the continuous sacrificial material layers (142L, 242L) and the continuous insulating layers (132L, 232L) may have vertically coincident sidewalls, and the charge storage layer 54 may be formed as a single continuous layer. Alternatively, the continuous sacrificial material layers (142L, 242L) may be laterally recessed with respect to the sidewalls of the continuous insulating layers (132L, 232L), and a combination of a deposition process and an anisotropic etch process may be used to form the charge storage layer 54 as a plurality of memory material portions that are vertically spaced apart. The thickness of the charge storage layer 54 may be in a range from 2 nm to 20 nm, although lesser and greater thicknesses may also be used.

The tunneling dielectric layer 56 includes a dielectric material through which charge tunneling may be performed under suitable electrical bias conditions. The charge tunneling may be performed through hot-carrier injection or by Fowler-Nordheim tunneling induced charge transfer depending on the mode of operation of the monolithic three-dimensional NAND string memory device to be formed. The tunneling dielectric layer 56 may include silicon oxide, silicon nitride, silicon oxynitride, dielectric metal oxides (such as aluminum oxide and hafnium oxide), dielectric metal oxynitride, dielectric metal silicates, alloys thereof, and/or combinations thereof. In one embodiment, the tunneling dielectric layer 56 may include a stack of a first silicon oxide layer, a silicon oxynitride layer, and a second silicon oxide layer, which is commonly known as an ONO stack. In one embodiment, the tunneling dielectric layer 56 may include a silicon oxide layer that is substantially free of carbon or a silicon oxynitride layer that is substantially free of carbon. The thickness of the tunneling dielectric layer 56 may be in a range from 2 nm to 20 nm, although lesser and greater thicknesses may also be used. The stack of the blocking dielectric layer 52, the charge storage layer 54, and the tunneling dielectric layer 56 constitutes a memory film 50 that stores memory bits.

An anisotropic etch process can be performed to remove horizontal portions of the tunneling dielectric layer 56, the charge storage layer 54, and the blocking dielectric layer 52. A surface of the semiconductor material layer 110 can be physically exposed at the bottom of each cavity 49' within each memory opening 49.

A semiconductor channel material layer 60L can be subsequently deposited. The semiconductor channel material layer 60L includes a p-doped semiconductor material such as at least one elemental semiconductor material, at least one III-V compound semiconductor material, at least one II-VI compound semiconductor material, at least one organic semiconductor material, or other semiconductor materials known in the art. In one embodiment, the semiconductor channel material layer 60L may have a uniform doping. In one embodiment, the semiconductor channel material layer 60L has a p-type doping in which p-type dopants (such as boron atoms) are present at an atomic concentration in a range from $1.0 \times 10^{12}/cm^3$ to $1.0 \times 10^{18}/cm^3$, such as from $1.0 \times 10^{14}/cm^3$ to $1.0 \times 10^{17}/cm^3$. In one embodiment, the semiconductor channel material layer 60L includes, and/or consists essentially of, boron-doped amorphous silicon or boron-doped polysilicon. In another embodiment, the semiconductor channel material layer 60L has an n-type doping in which n-type dopants (such as phosphor atoms or arsenic atoms) are present at an atomic concentration in a range from $1.0 \times 10^{12}/cm^3$ to $1.0 \times 10^{18}/cm^3$, such as from $1.0 \times 10^{14}/cm^3$ to $1.0 \times 10^{17}/cm^3$. The semiconductor channel material layer 60L may be formed by a conformal deposition method such as low pressure chemical vapor deposition (LPCVD). The thickness of the semiconductor channel material layer 60L may be in a range from 2 nm to 10 nm, although lesser and greater thicknesses may also be used. A cavity 49' is formed in the volume of each inter-tier memory opening 49 that is not filled with the deposited material layers (52, 54, 56, 60L).

Referring to FIG. 13C, in case the cavity 49' in each memory opening is not completely filled by the semiconductor channel material layer 60L, a dielectric core layer may be deposited in the cavity 49' to fill any remaining portion of the cavity 49' within each memory opening. The dielectric core layer includes a dielectric material such as silicon oxide or organosilicate glass. The dielectric core layer may be deposited by a conformal deposition method such as low pressure chemical vapor deposition (LPCVD), or by a self-planarizing deposition process such as spin coating. The horizontal portion of the dielectric core layer overlying the top second continuous insulating layer 232L may be removed, for example, by a recess etch. The recess etch continues until top surfaces of the remaining portions of the dielectric core layer are recessed to a height between the top and bottom surfaces of the topmost second insulating layer 232L. Each remaining portion of the dielectric core layer constitutes a dielectric core 62.

Referring to FIG. 13D, a doped semiconductor material having a doping of a second conductivity type may be deposited in cavities overlying the dielectric cores 62. The second conductivity type is the opposite of the first conductivity type. For example, if the first conductivity type is p-type, the second conductivity type is n-type, and vice versa. Portions of the deposited doped semiconductor material, the semiconductor channel material layer 60L, the tunneling dielectric layer 56, the charge storage layer 54, and the blocking dielectric layer 52 that overlie the horizontal plane including the top surface of the topmost second continuous insulating layer 232L may be removed by a planarization process such as a chemical mechanical planarization (CMP) process.

Each remaining portion of the doped semiconductor material of the second conductivity type constitutes a drain region 63. The dopant concentration in the drain regions 63 may be in a range from $5.0 \times 10^{18}/cm^3$ to $2.0 \times 10^{21}/cm^3$, although lesser and greater dopant concentrations may also be used. The doped semiconductor material may be, for example, doped polysilicon.

Each remaining portion of the semiconductor channel material layer 60L constitutes a vertical semiconductor channel 60 through which electrical current may flow when a vertical NAND device including the vertical semiconductor channel 60 is turned on. A tunneling dielectric layer 56 is surrounded by a charge storage layer 54, and laterally surrounds a vertical semiconductor channel 60. Each adjoining set of a blocking dielectric layer 52, a charge storage layer 54, and a tunneling dielectric layer 56 collectively constitute a memory film 50, which may store electrical charges with a macroscopic retention time. In some embodiments, a blocking dielectric layer 52 may not be present in the memory film 50 at this step, and a blocking dielectric layer may be subsequently formed after formation of backside recesses. As used herein, a macroscopic retention time refers to a retention time suitable for operation of a memory device as a permanent memory device such as a retention time in excess of 24 hours.

Each combination of a memory film 50 and a vertical semiconductor channel 60 within an inter-tier memory opening 49 constitutes a memory stack structure 55. The memory stack structure 55 is a combination of a vertical semiconductor channel 60, a tunneling dielectric layer 56, a plurality of memory elements comprising portions of the charge storage layer 54, and an optional blocking dielectric layer 52. The memory stack structures 55 can be formed through memory array regions 100 of the first and second vertically alternating sequences in which all layers of the first and second vertically alternating sequences are present. Each combination of a memory stack structure 55, a dielectric core 62, and a drain region 63 within an inter-tier memory opening 49 constitutes a memory opening fill structure 58. Generally, memory opening fill structures 58 are formed within the memory openings 49. Each of the memory opening fill structures 58 comprises a respective memory film 50 and a respective vertical semiconductor channel 60.

Generally, memory stack structures 55 can be formed through the at least one vertically alternating sequence {(132L, 142L), (232L, 242L)}. Each of the memory stack structures 55 comprises a respective vertical semiconductor channel 60 and a respective vertical stack of memory elements (which may comprise portions of the charge storage layer 54 located at levels of the continuous sacrificial material layers (142L, 242L).

Referring to FIGS. 14A-14E, a contact-level dielectric layer 280 may be formed over the second vertically alternating sequence (232L, 242L), the support pillar structures 20, the memory opening fill structures 58, and the backside support pillar structures 22. The contact-level dielectric layer 280 includes a dielectric material such as silicon oxide, and may be formed by a conformal or non-conformal deposition process. For example, the contact-level dielectric layer 280 may include undoped silicate glass and may have a thickness in a range from 100 nm to 600 nm, although lesser and greater thicknesses may also be used.

A photoresist layer (not shown) may be applied over the contact-level dielectric layer 280, and may be lithographically patterned to form a discrete two-dimensional array of rectangular openings and moat-shaped openings. The discrete two-dimensional array of rectangular openings include rows of rectangular openings that are arranged along the first horizontal direction hd1. Each row of rectangular openings can be interlaced with areas of a respective row of backside support pillar structures 22 such that each interlaced set of areas of rectangular openings in the photoresist layer and areas of the backside support pillar structures 22 in a top-down vie includes a continuous area that extends along the first horizontal direction through a first memory array region 100A, an inter-array region 200, and a second memory array region 100B. The moat-shaped openings are formed within the inter-array region 200 between a respective neighboring pair of rows of backside support pillar structures 22.

An anisotropic etch process can be performed to transfer the pattern of the two-dimensional array of rectangular openings and the moat-shaped openings in the photoresist layer through the contact-level dielectric layer 280 and through the at least one vertically alternating sequence {(132L, 142L), (232L, 242L)}. A two-dimensional array of discrete backside trenches 79 are formed through the contact-level dielectric layer 280 and through the at least one vertically alternating sequence {(132L, 142L), (232L, 242L)} underneath the two-dimensional array of rectangular openings in the photoresist layer. Moat trenches 179 are formed through the contact-level dielectric layer 280 and through the at least one vertically alternating sequence {(132L, 142L), (232L, 242L)} underneath the moat-shaped openings in the photoresist layer.

In one embodiment, the two-dimensional array of discrete backside trenches 79 may be formed by anisotropically etching portions of the at least one vertically alternating sequence {(132L, 142L), (232L, 242L)} and peripheral portions of the backside support pillar structures 22. Sidewalls of the backside support pillar structures 22 may be physically exposed to the edge surfaces (e.g., surfaces which extend generally along the second horizontal direction hd2) of the backside trenches 79. In one embodiment, the backside trenches 79 have a respective pair of lengthwise sidewalls that are parallel to the first horizontal direction hd1 and laterally spaced apart along a second horizontal direction hd2 that is perpendicular to the first horizontal direction hd1 by a uniform width w in a horizontal cross-sectional view.

Generally, the two-dimensional array of discrete backside trenches 79 can comprise rows of discrete backside trenches 79 that are arranged along the first horizontal direction hd1. Each of the discrete backside trenches 79 vertically extends at least between the first horizontal plane including bottommost surfaces of the at least one vertically alternating sequence {(132L, 142L), (232L, 242L)} and the second horizontal plane including topmost surfaces of the at least one vertically alternating sequence {(132L, 142L), (232L, 242L)}.

Each contiguous combination of a respective subset of the backside trenches 79 and a respective subset of the backside support pillar structures 22 laterally extends along the first horizontal direction hd1. Contiguous combinations of a subset of the backside trenches 79 and a subset of the backside support pillar structures 22 divide the at least one vertically alternating sequence {(132L, 142L), (232L, 242L)} into alternating stacks of insulating layers (132, 232) and sacrificial material layers (142, 242). Each of the insulating layers (132, 232) comprises a patterned portion of a respective one of the continuous insulating layers (132L, 232L), and each of the sacrificial material layers (142, 242) comprises a patterned portion of a respective one of the continuous sacrificial material layers (142L, 242L). For example, the insulating layers (132, 232) comprise first insulating layers 132 that are patterned portions of the first continuous insulating layers 132L, and second insulating layers 232 that are patterned portions of the second continuous insulating layers 232L.

Figure 14A:
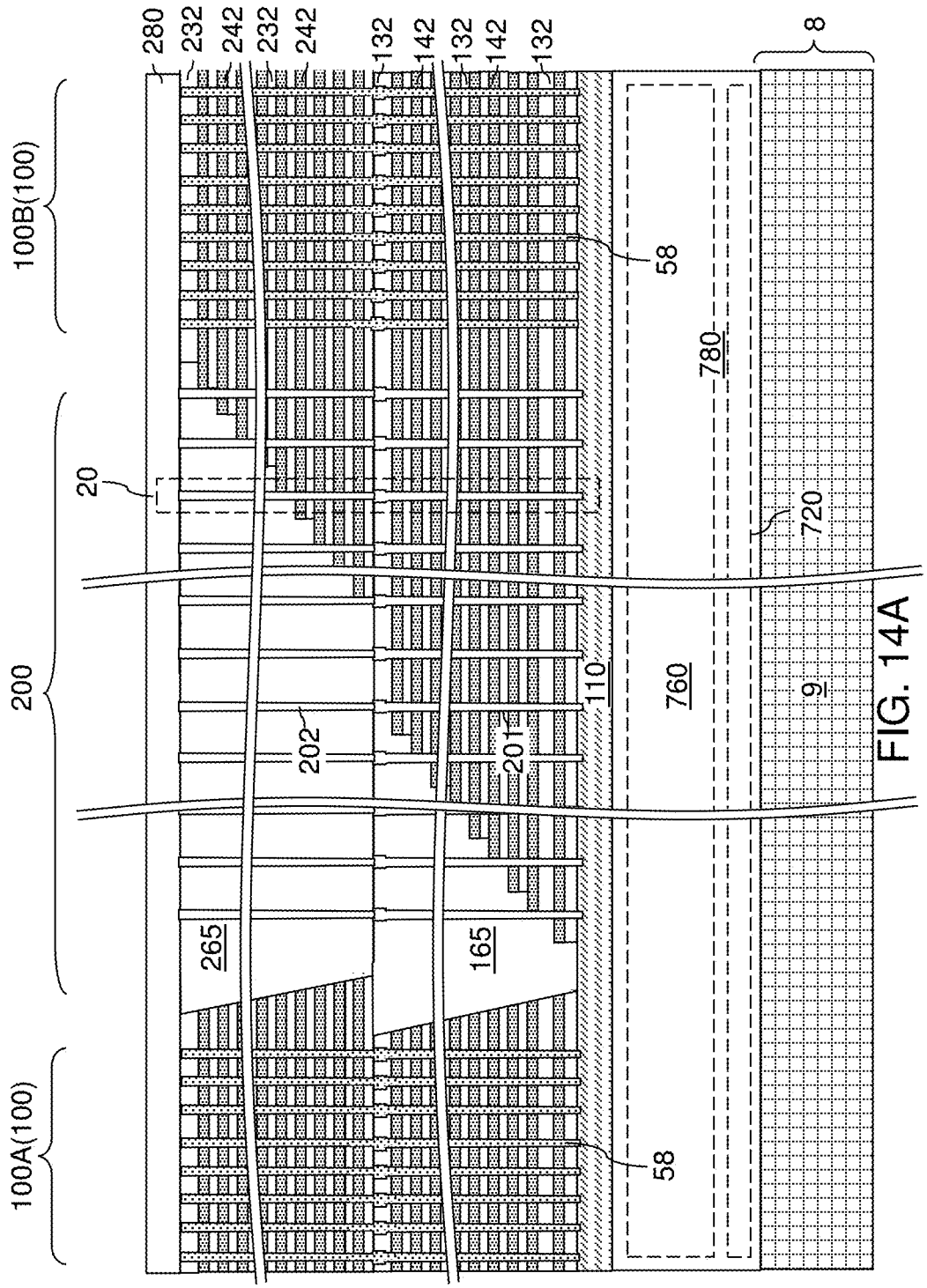
FIG. 14A is a vertical cross-sectional view of the exemplary structure after formation of a contact level dielectric layer, backside trenches, and moat trenches according to an embodiment of the present disclosure.
Figure 14B:
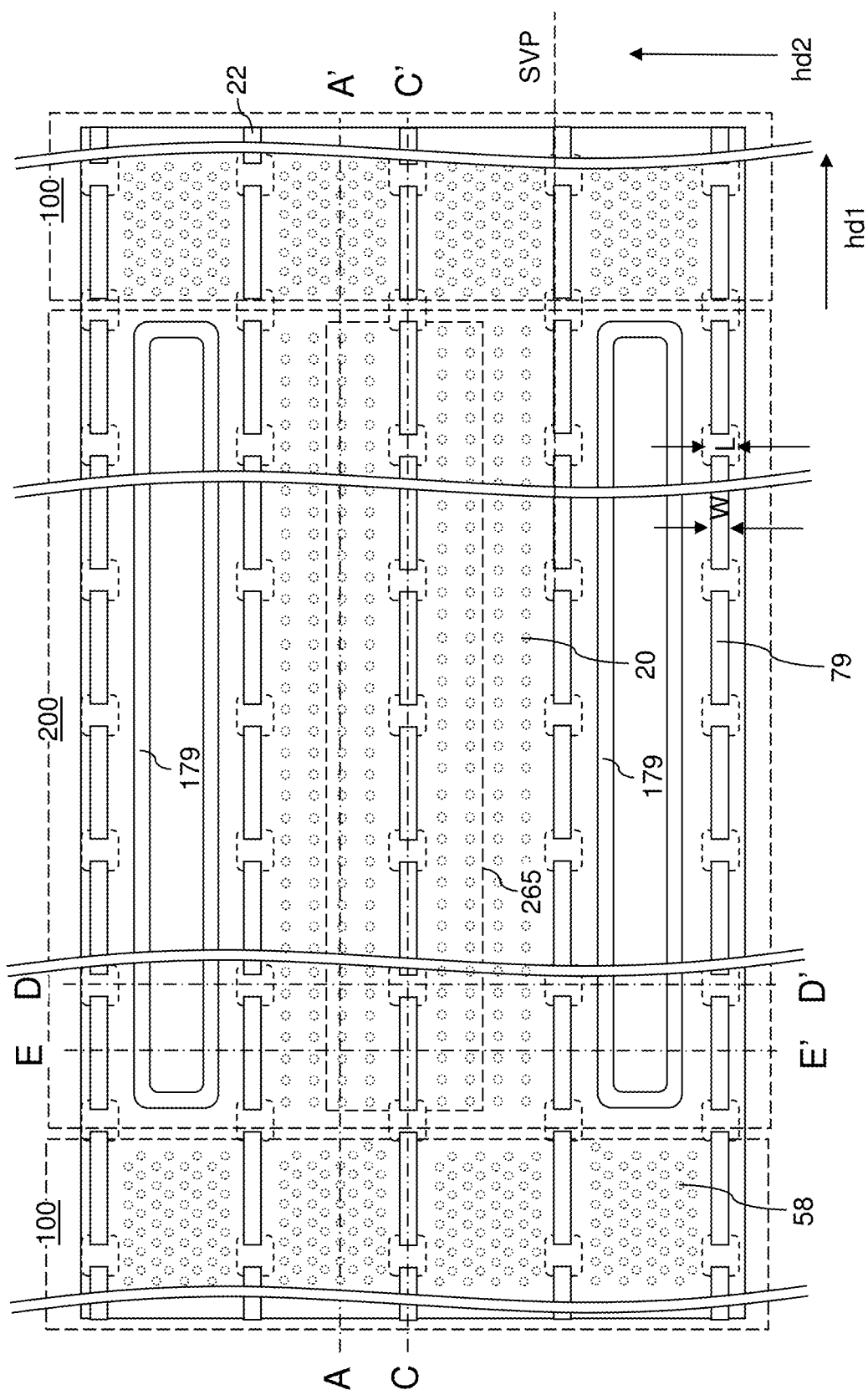
FIG. 14B is a top-down view of the exemplary structure of FIG. 14A. The vertical plane A-A' is the plane of the vertical cross-sectional view of FIG. 14A.
Figure 14C:
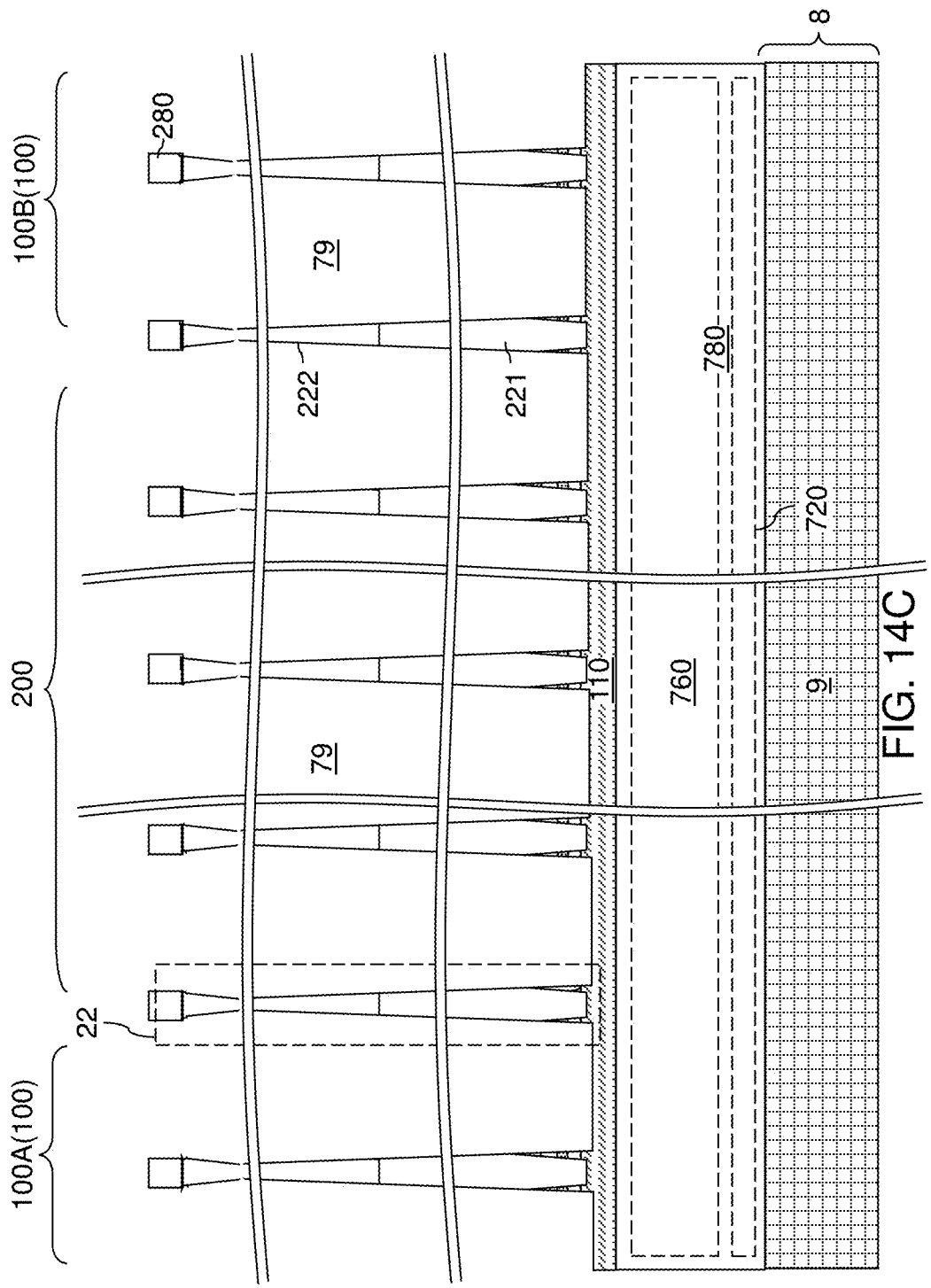
FIG. 14C is a vertical cross-sectional view of the exemplary structure along the vertical plane C-C' of FIG. 14B.

In one embodiment, each of the backside support pillar structures 22 has a lateral extent "L" along the second horizontal direction hd2 that is greater than the uniform width "W" of the discrete backside trenches 79 shown in FIG. 14B. In one embodiment, each of the backside support pillar structures 22 can contacts sidewalls of a neighboring pair of alternating stacks {(132, 142), (232, 242)} of the alternating stacks {(132, 142), (232, 242)}. The width L of the backside support pillar structures 22 along the second horizontal direction hd2 can be greater than the uniform width W of the discrete backside trenches 79. Thus, each backside support pillar structure 22 may have a pair of laterally protruding portions that protrude laterally into a respective alternating stack {(132, 142), (232, 242)}. In one embodiment, the backside support pillar structures 22 contact indented sidewalls of a respective one of the alternating stacks {(132, 142), (232, 242)} that are laterally recessed along the second horizontal direction hd2 relative to a straight vertical plane SVP including interfaces between the backside trenches 79 and the respective one of the alternating stacks {(132, 142), (232, 242)} in the horizontal cross-sectional view or in a top-down view (such as the view of FIG. 14B).

In one embodiment, each of the backside trenches 79 has a length along the first horizontal direction hd1 that is greater than the uniform width W along the second horizontal direction hd2. In one embodiment, each of the backside support pillar structures 22 has a lateral extent L along the second horizontal direction hd2 that is greater than the uniform width W.

Figure 14D:
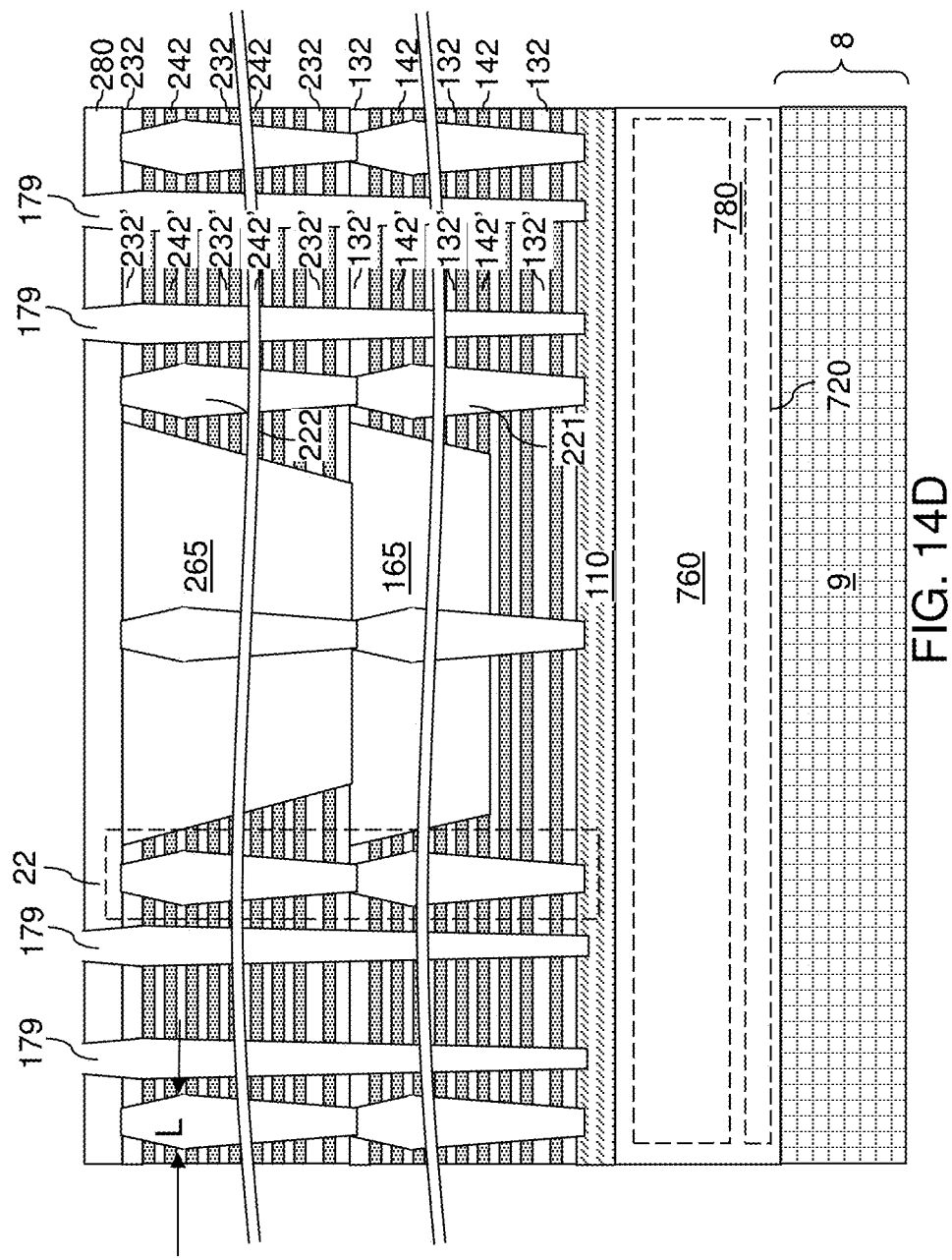
FIG. 14D is a vertical cross-sectional view of the exemplary structure along the vertical plane D-D' of FIG. 14B.
Figure 14E:
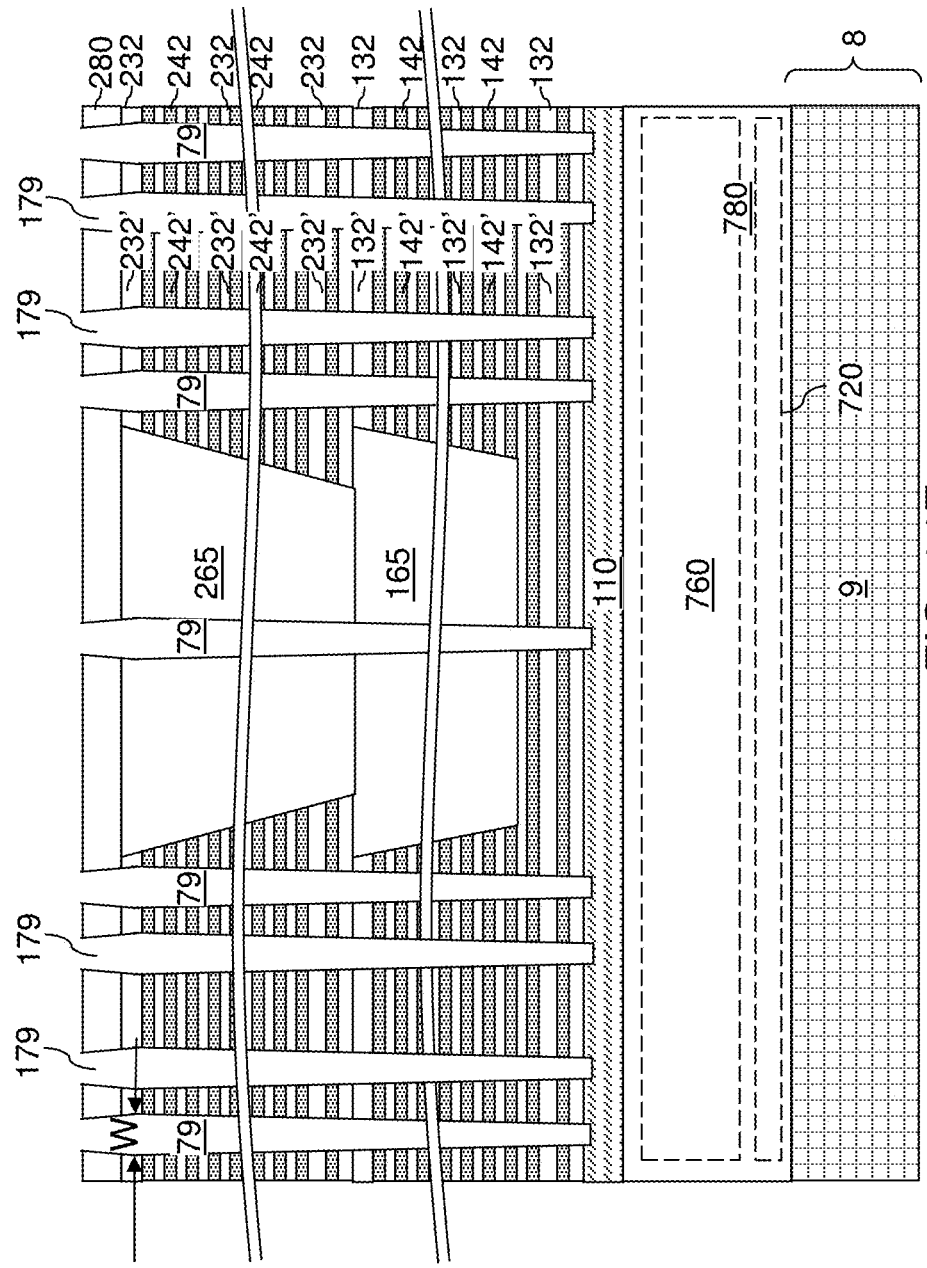
FIG. 14E is a vertical cross-sectional view of the exemplary structure along the vertical plane E-E' of FIG. 14B.
Figure 15A:
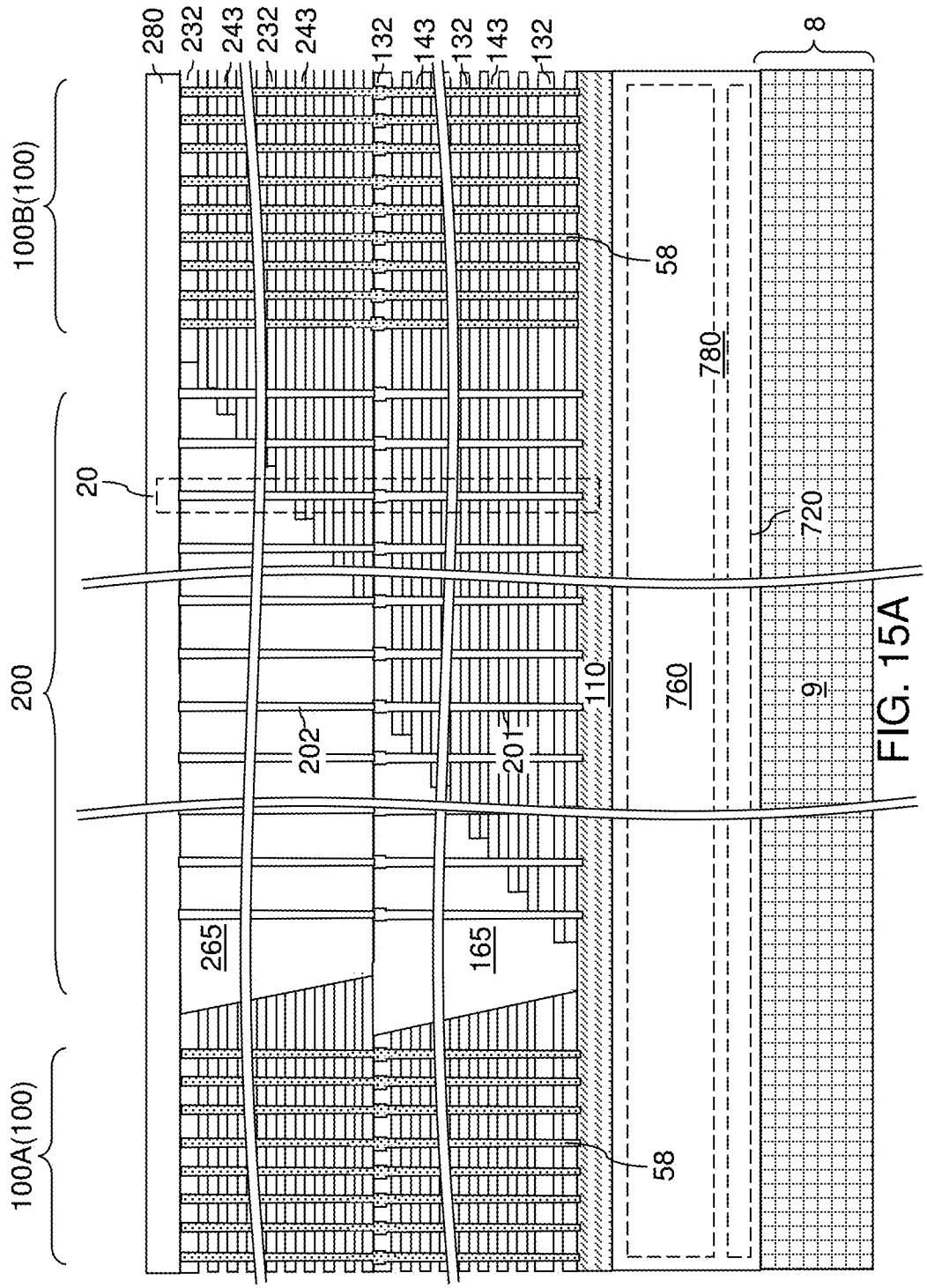
FIG. 15A is a vertical cross-sectional view of the exemplary structure after formation of backside recesses according to an embodiment of the present disclosure.
Figure 15B:
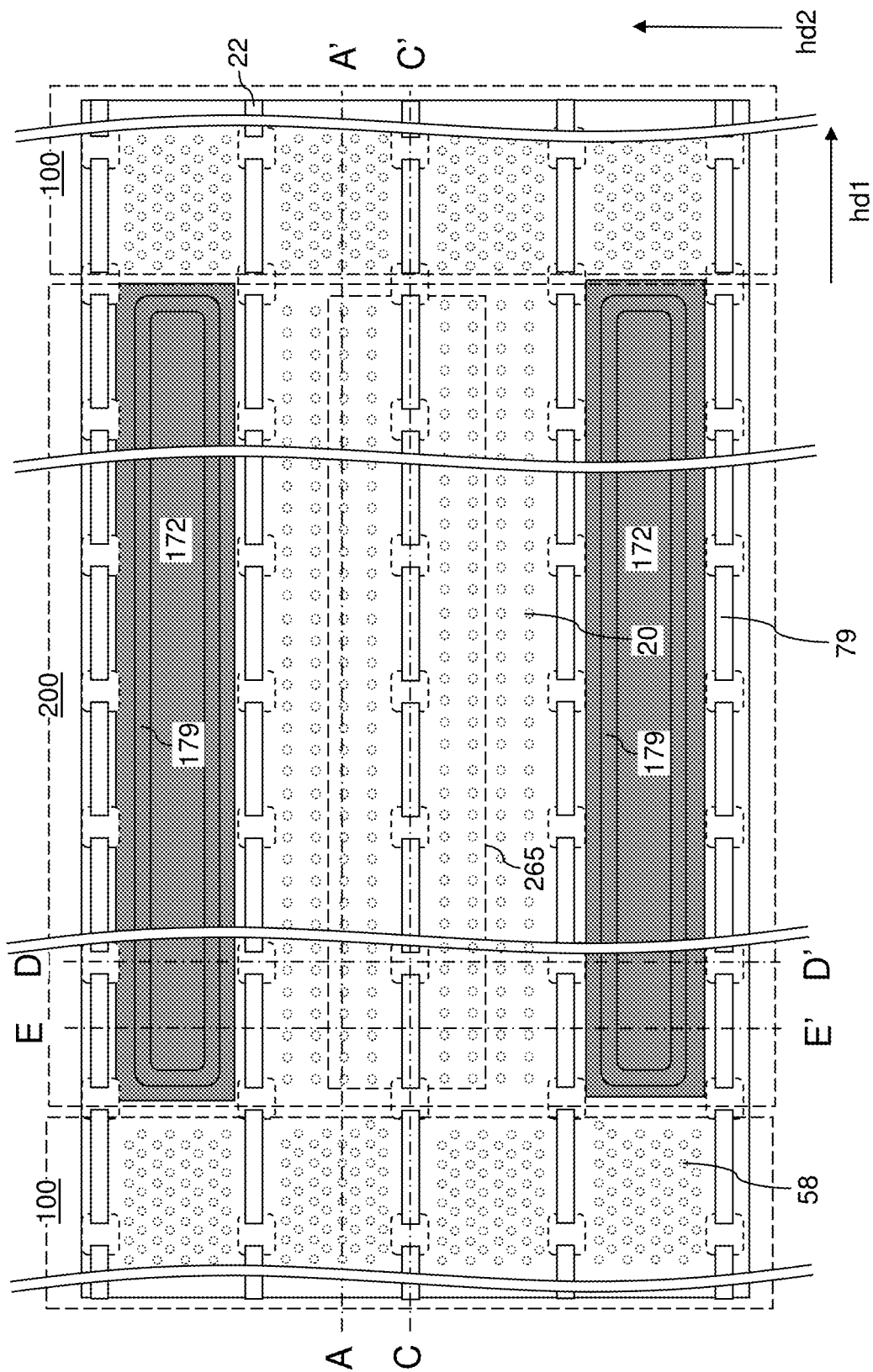
FIG. 15B is a top-down view of the exemplary structure of FIG. 15A. The vertical plane A-A' is the plane of the vertical cross-sectional view of FIG. 15A.
Figure 15C:
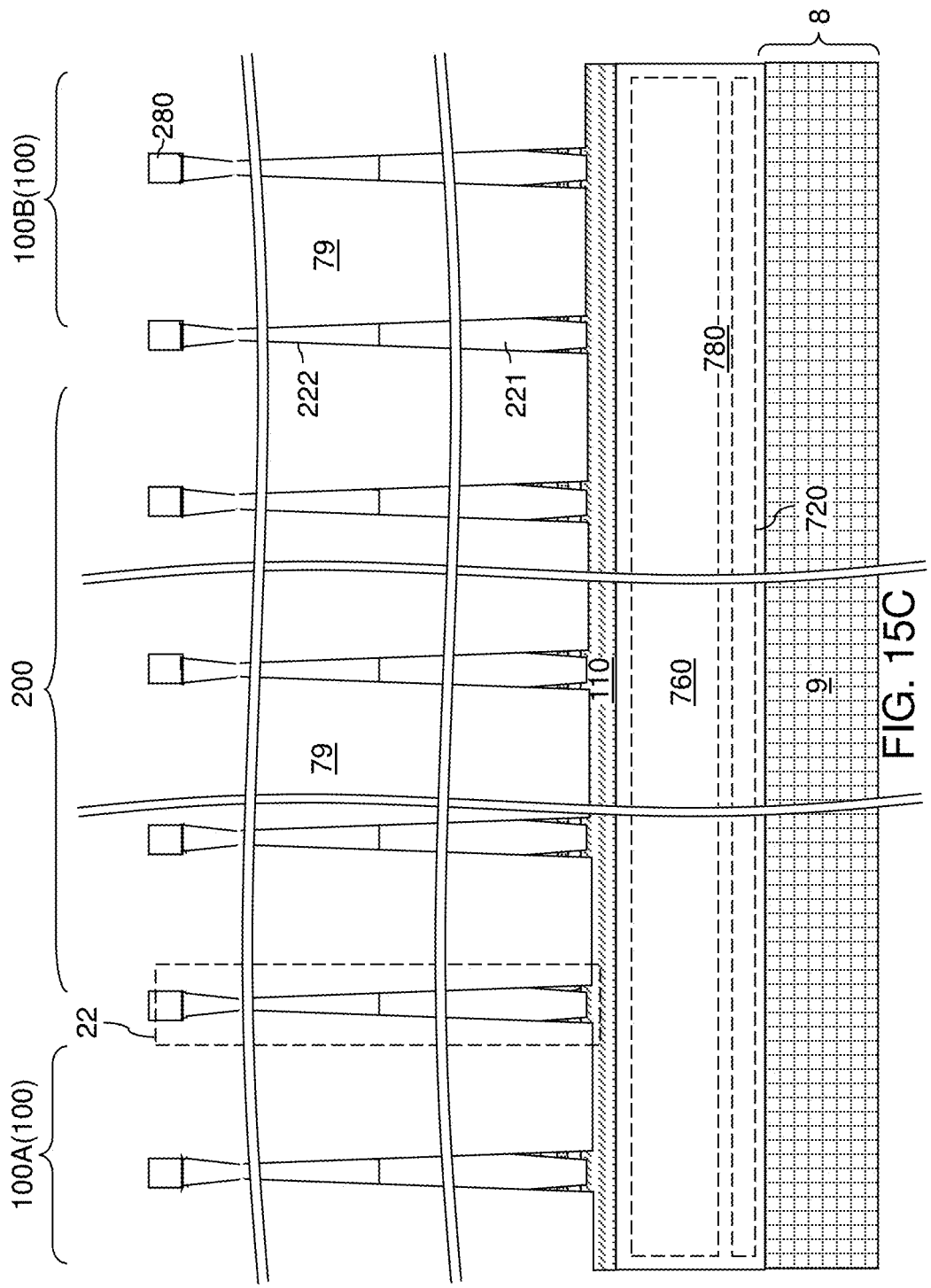
FIG. 15C is a vertical cross-sectional view of the exemplary structure along the vertical plane C-C' of FIG. 15B.
Figure 15D:
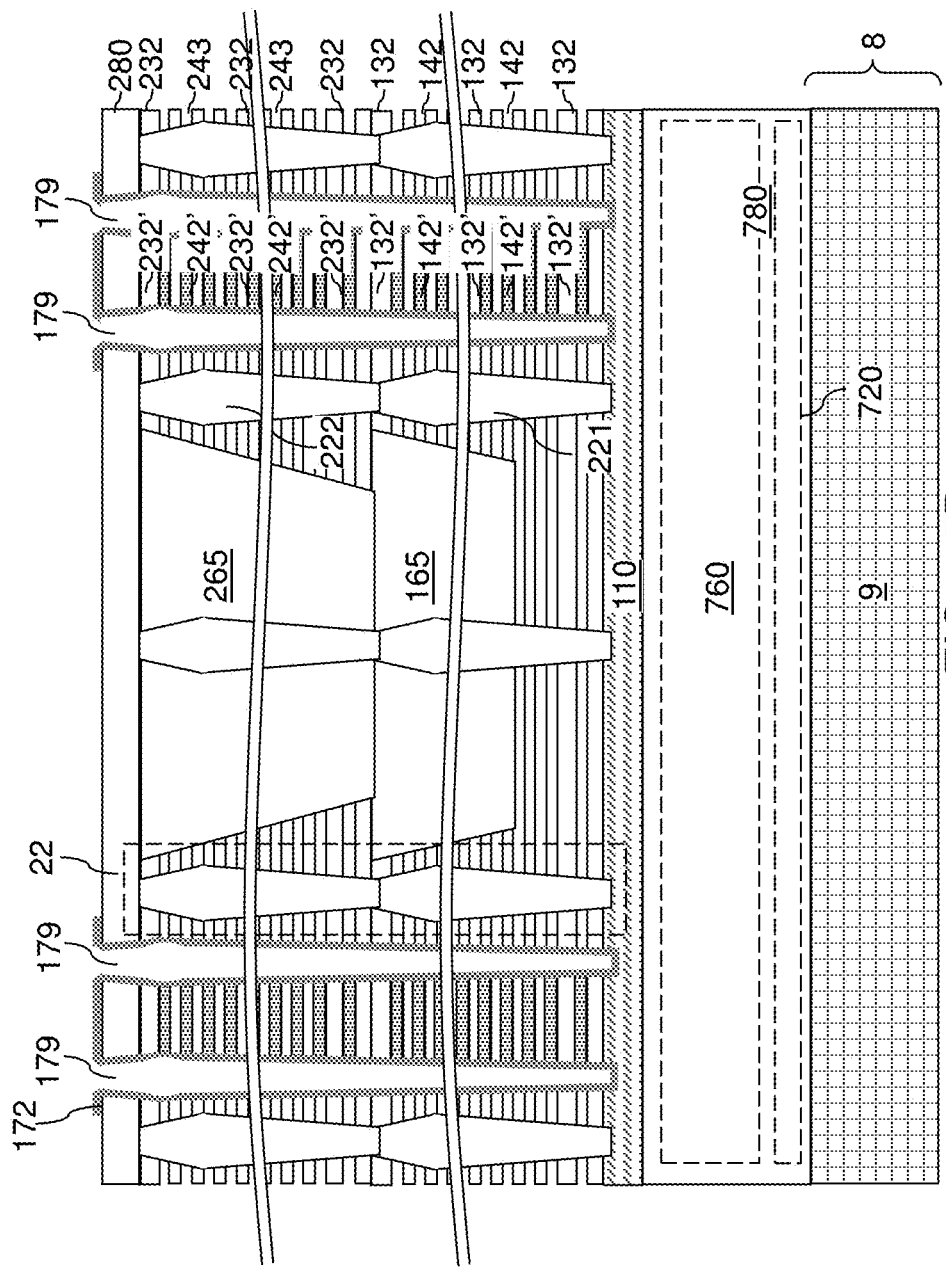
FIG. 15D is a vertical cross-sectional view of the exemplary structure along the vertical plane D-D' of FIG. 15B.
Figure 15E:
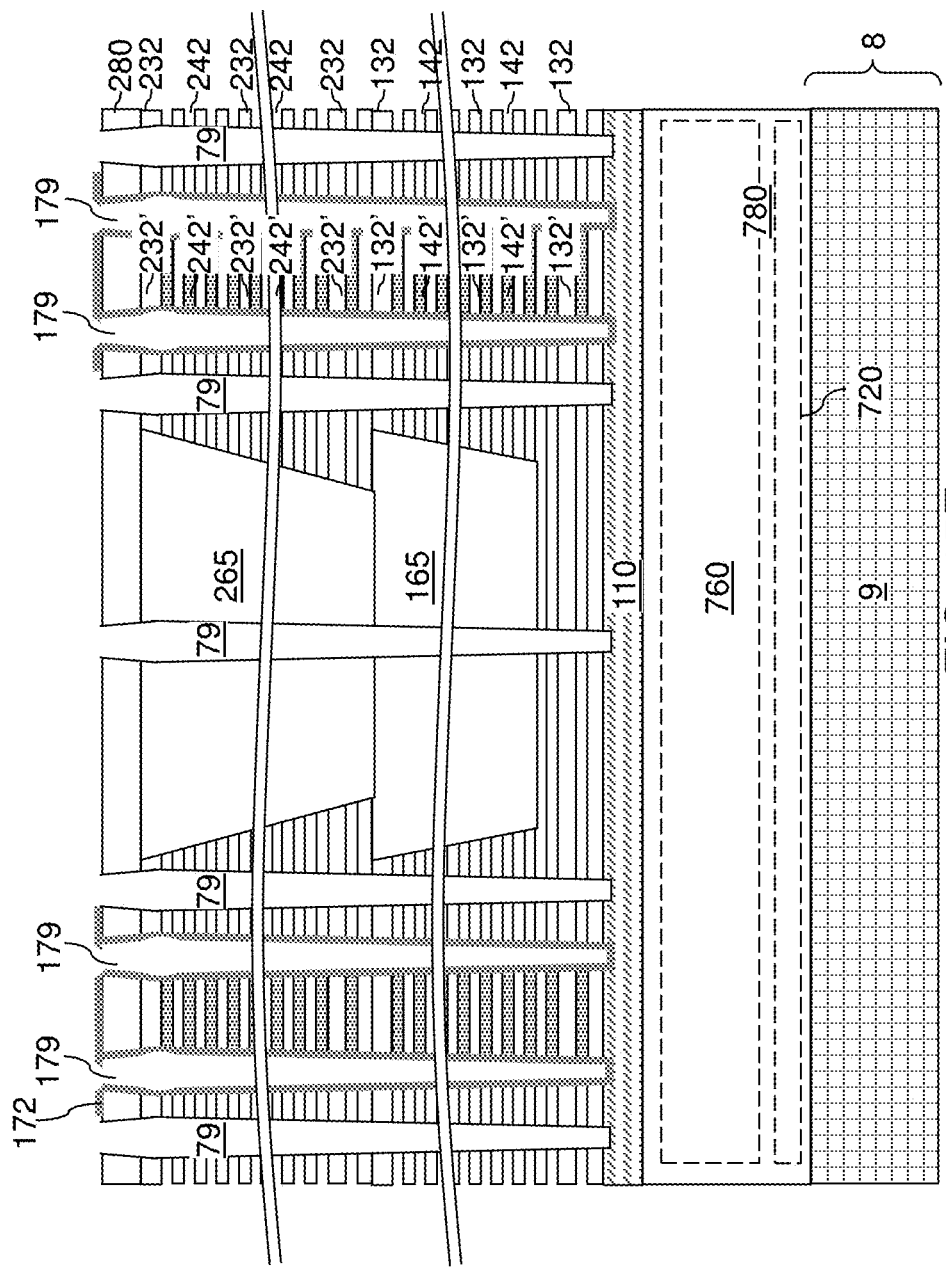
FIG. 15E is a vertical cross-sectional view of the exemplary structure along the vertical plane E-E' of FIG. 15B.
Figure 16A:
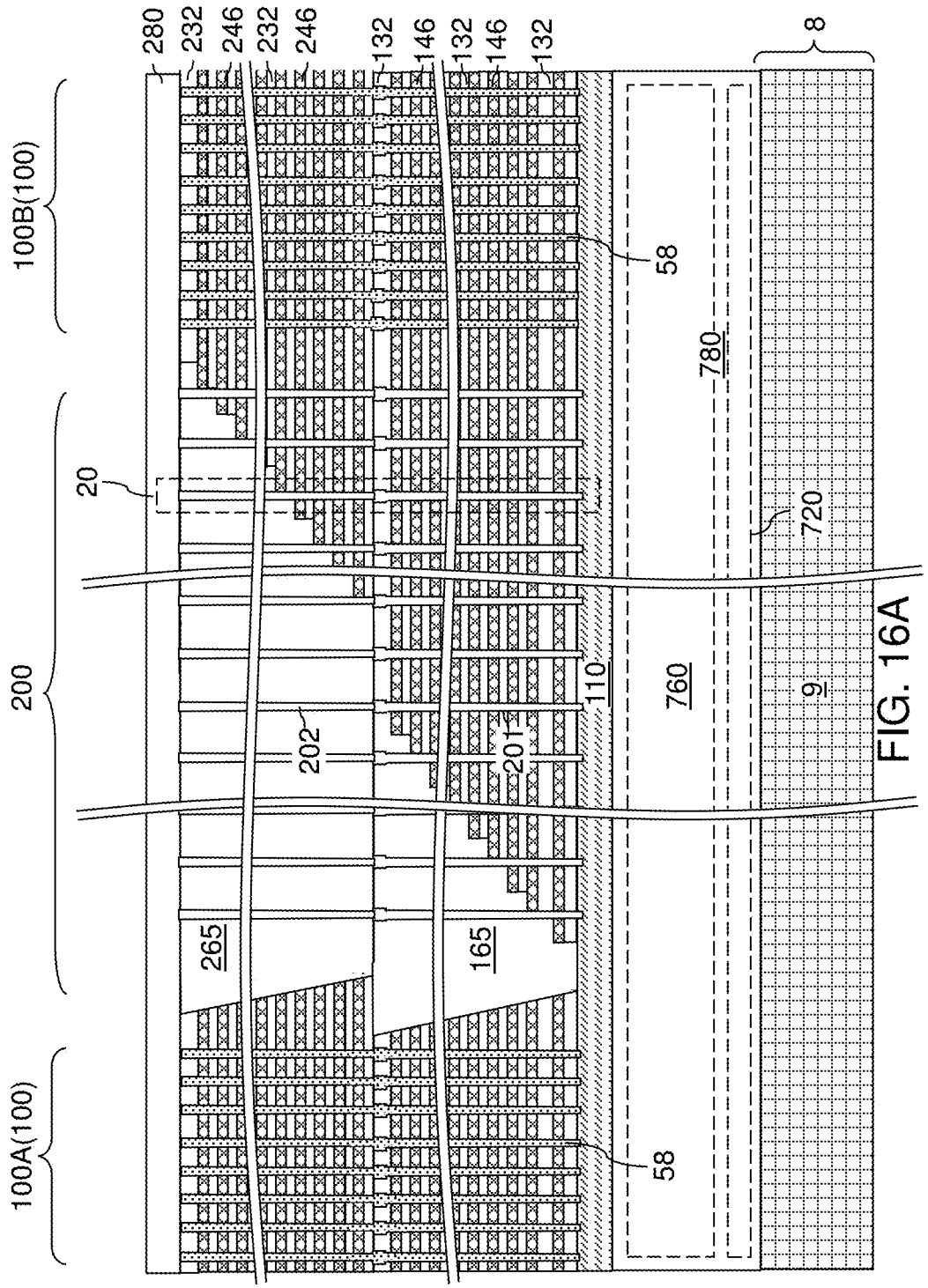
FIG. 16A is a vertical cross-sectional view of the exemplary structure after formation of electrically conductive layers according to an embodiment of the present disclosure.
Figure 16B:
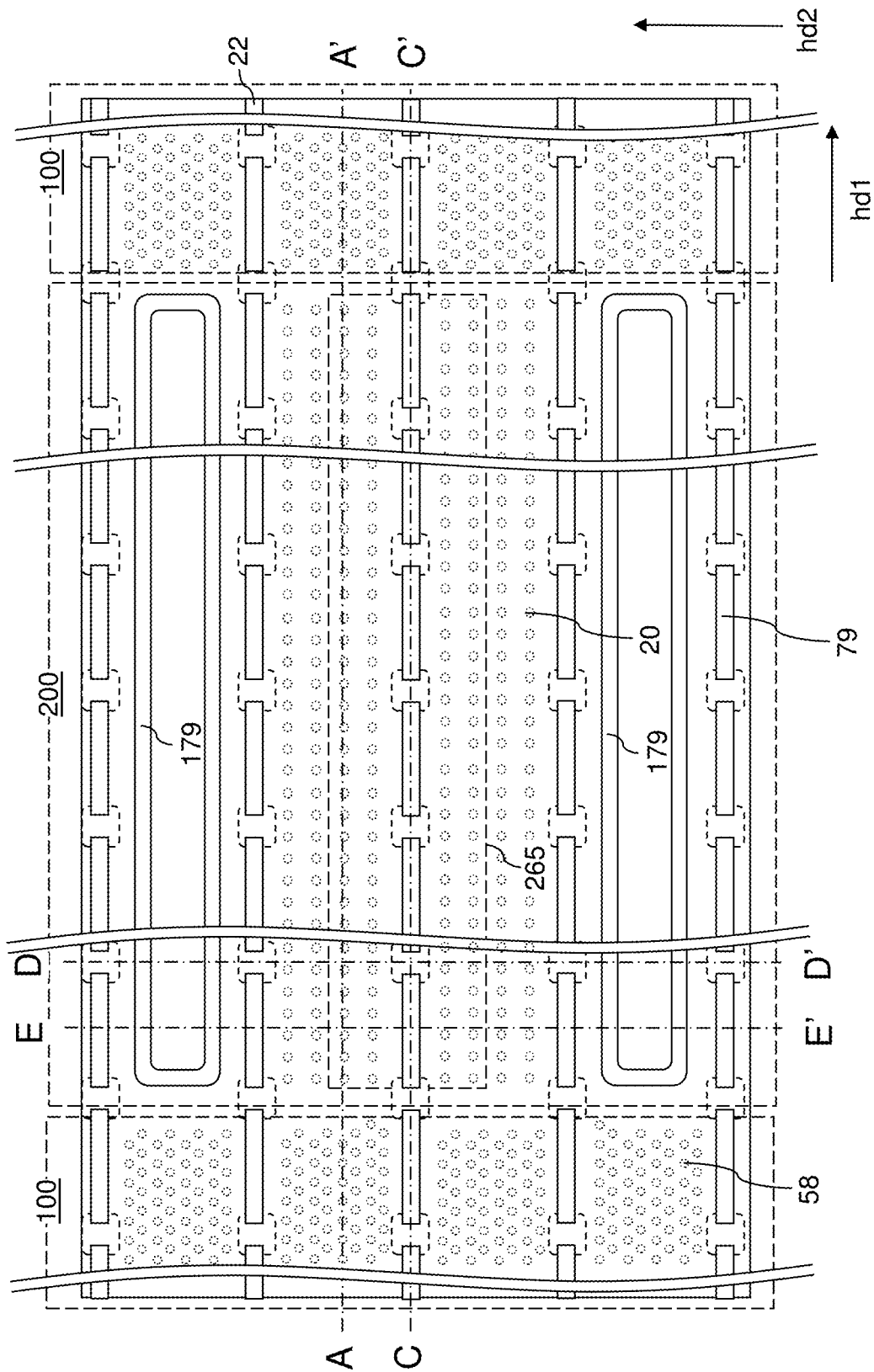
FIG. 16B is a top-down view of the exemplary structure of FIG. 16A. The vertical plane A-A' is the plane of the vertical cross-sectional view of FIG. 16A.
Figure 16E:
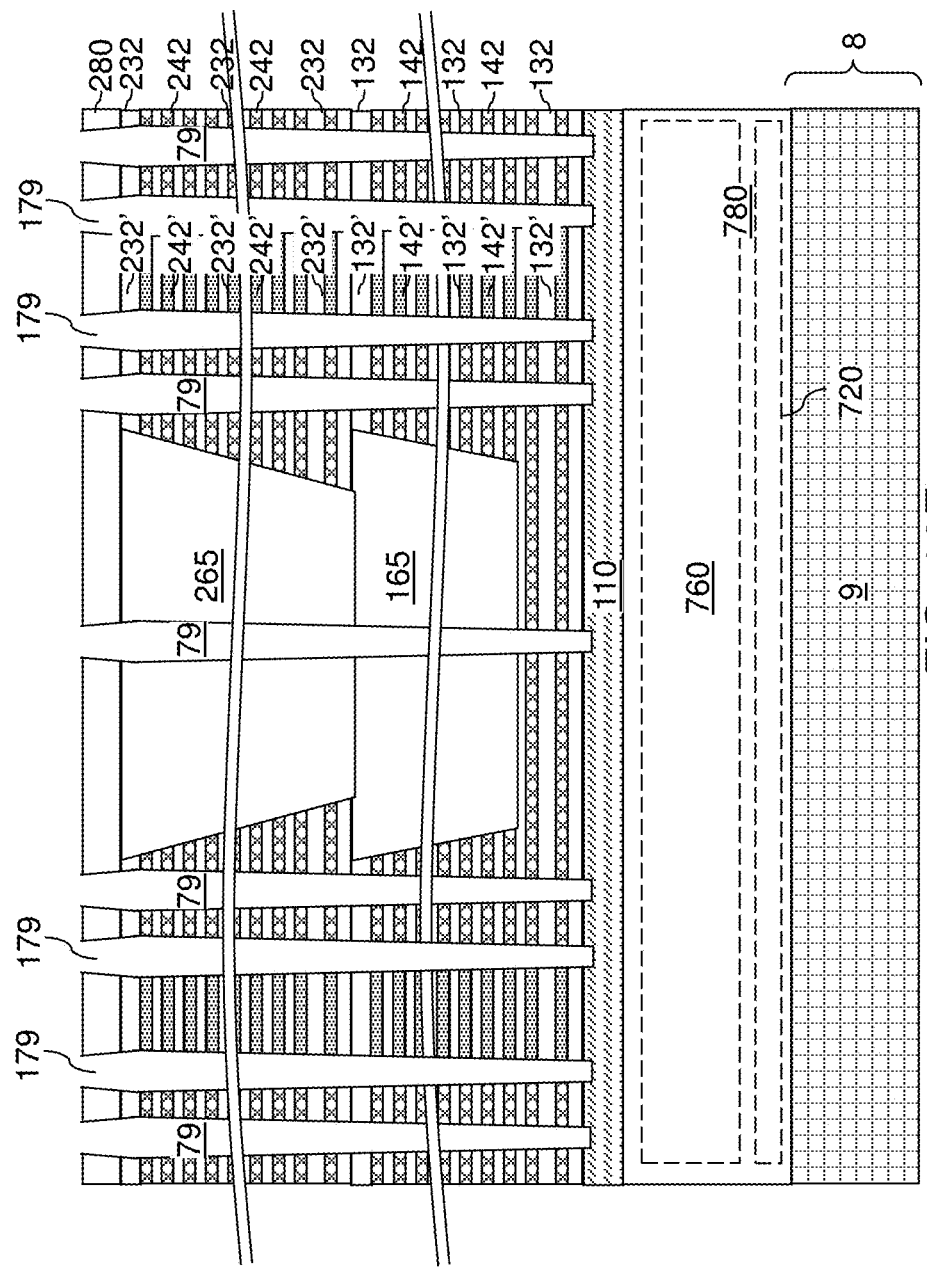
FIG. 16E is a vertical cross-sectional view of the exemplary structure along the vertical plane E-E' of FIG. 16B.

Each moat trench 179 has a moat configuration, and laterally surrounds a respective patterned portion of the at least one vertically alternating sequence {(132L, 142L), (232L, 242L)}. Each contiguous set of patterned portion of the at least one vertically alternating sequence {(132L, 142L), (232L, 242L)} that is laterally surrounded by a moat trench 179 constitutes a vertically alternating stack of insulating plates (132', 232') and dielectric material plates (142', 242'), as shown in FIGS. 14D and 14E. The insulating plates (132', 232') can include first insulating plates 132' that are patterned portions of the first continuous insulating layers 132L and second insulating plates 232' that are patterned portions of the second continuous insulating layers 232L. Each vertically alternating stack of insulating plates (132', 232') and dielectric material plates (142', 242') can be laterally surrounded by a respective moat trench 179.

Referring to FIGS. 15A-15E, a conformal dielectric liner 172 can be conformally deposited in the discrete backside trenches 79, in the moat trenches 179, and over the contact-level dielectric layer 280 by a conformal deposition process such as a chemical vapor deposition process. The conformal dielectric liner 172 includes a dielectric material that is different from the material of the sacrificial material layers (142, 242). In one embodiment, the insulating layers (132, 232) and the conformal dielectric liner 172 may include silicon oxide, and the sacrificial material layers (142, 242) may include silicon nitride. The thickness of the conformal dielectric liner 172 may be in a range from 3 nm to 30 nm, such as from 6 nm to 15 nm, although lesser and grater thicknesses may also be employed.

A photoresist layer (not shown) can be applied over the exemplary structure, and can be lithographically patterned to cover each area of the moat trenches 179. In one embodiment, each patterned portion of the photoresist layer can have a respective periphery that is located outside, and along, the outer periphery of a respective moat trench 179. An isotropic etch process can be performed to remove portions of the conformal dielectric liner 172 that are not masked by the photoresist layer. The conformal dielectric liner 172 can be divided into a plurality of disjoined conformal dielectric liners 172 that cover surfaces of a respective one of the moat trenches 179.

An isotropic etch process can be employed to remove the sacrificial material layers (142, 242) selective to the conformal dielectric liners 172, the insulating layers (132, 232), the contact-level dielectric layer 280, the backside support pillar structures 22, and the semiconductor material layer 110. In one embodiment, an etchant that selectively etches the materials of the sacrificial material layers (142, 242) with respect to the materials of the conformal dielectric liners 172, the insulating layers (132, 232), the backside support pillar structures 22, the retro-stepped dielectric material portions (165, 265), and the material of the outermost layer of the memory films 50 may be introduced into the backside trenches 79 during the isotropic etch process. For example, the sacrificial material layers (142, 242) may include silicon nitride, the materials of the conformal dielectric liners 172, the backside support pillar structures 22, the insulating layers (132, 232), the retro-stepped dielectric material portions (165, 265), and the outermost layer of the memory films 50 may include silicon oxide materials.

The isotropic etch process may be a wet etch process using a wet etch solution, or may be a gas phase (dry) etch process in which the etchant is introduced in a vapor phase into the backside trench 79. For example, if the sacrificial material layers (142, 242) include silicon nitride, the etch process may be a wet etch process in which the exemplary structure is immersed within a wet etch tank including phosphoric acid, which etches silicon nitride selective to silicon oxide, silicon, and various other materials used in the art.

Backside recesses (143, 243) are formed in volumes from which the sacrificial material layers (142, 242) are removed. The backside recesses (143, 243) include first backside recesses 143 that are formed in volumes from which the first sacrificial material layers 142 are removed and second backside recesses 243 that are formed in volumes from which the second sacrificial material layers 242 are removed. Each of the backside recesses (143, 243) may be a laterally extending cavity having a lateral dimension that is greater than the vertical extent of the cavity. In other words, the lateral dimension of each of the backside recesses (143, 243) may be greater than the height of the respective backside recess. A plurality of backside recesses (143, 243) may be formed in the volumes from which the material of the sacrificial material layers (142, 242) is removed. Each of the backside recesses (143, 243) may extend substantially parallel to the top surface of the substrate semiconductor layer 9. A backside recess (143, 243) may be vertically bounded by a top surface of an underlying insulating layer (132, 232) and a bottom surface of an overlying insulating layer (132, 232). In one embodiment, each of the backside recesses (143, 243) may have a uniform height throughout.

Generally, the backside recesses (143, 243) can be formed by removing the patterned portions of the first continuous sacrificial material layers 142L and the second sacrificial material layers 242L selective to patterned portions of the first continuous insulating layers 132L and the second continuous insulating layers 232L after formation of the backside trenches 79, the moat trenches 179, and the conformal dielectric liners 172. The backside recesses (143, 243) can be formed by performing an isotropic etch process that supplies an isotropic etchant that etches the patterned portions of the first continuous sacrificial material layers 142L and the second continuous sacrificial material layers 242L selective to patterned portions of the first continuous insulating layers 132L and the second continuous insulating layers 232L and selective to the backside support pillar structures 22. The backside support pillar structures 22 are physically exposed to the backside recesses (143, 243) after the isotropic etch process.

Referring to FIGS. 16A-16E, the conformal dielectric liners 172 may be optionally removed. An optional backside blocking dielectric layer (not shown) may be optionally deposited in the backside recesses (143, 243), at peripheral portions of the backside trenches 79 and the moat trenches 179, and over the contact-level dielectric layer 280. The backside blocking dielectric layer includes a dielectric material such as a dielectric metal oxide (e.g., aluminum oxide), silicon oxide, or a combination thereof.

At least one conductive material may be deposited in the plurality of backside recesses (143, 243), at peripheral regions of the backside trenches 79 and the moat trenches 179, and over the contact-level dielectric layer 280. The at least one conductive material may be deposited by a conformal deposition method, which may be, for example, chemical vapor deposition (CVD), atomic layer deposition (ALD), electroless plating, electroplating, or a combination thereof. The at least one conductive material may include an elemental metal, an intermetallic alloy of at least two elemental metals, a conductive nitride of at least one elemental metal, a conductive metal oxide, a conductive doped semiconductor material, a conductive metal-semiconductor alloy such as a metal silicide, alloys thereof, and combinations or stacks thereof.

In one embodiment, the at least one conductive material may include at least one metallic material, i.e., an electrically conductive material that includes at least one metallic element. Non-limiting exemplary metallic materials that may be deposited in the backside recesses (143, 243) include tungsten, tungsten nitride, titanium, titanium nitride, tantalum, tantalum nitride, cobalt, and ruthenium. For example, the at least one conductive material may include a conductive metallic nitride liner that includes a conductive metallic nitride material such as TiN, TaN, WN, or a combination thereof, and a conductive fill material such as W, Co, Ru, Mo, Cu, or combinations thereof. In one embodiment, the at least one conductive material for filling the backside recesses (143, 243) may be a combination of titanium nitride layer and a tungsten fill material.

Electrically conductive layers (146, 246) may be formed in the backside recesses (143, 243) by deposition of the at least one conductive material. A plurality of first electrically conductive layers 146 may be formed in the plurality of first backside recesses 143, a plurality of second electrically conductive layers 246 may be formed in the plurality of second backside recesses 243, and a continuous metallic material layer (not shown) may be formed on the sidewalls of each backside trench 79 and over the contact-level dielectric layer 280. Each of the first electrically conductive layers 146 and the second electrically conductive layers 246 may include a respective conductive metallic nitride liner and a respective conductive fill material. Thus, the first and second sacrificial material layers (142, 242) may be replaced with the first and second electrically conductive layers (146, 246), respectively. Specifically, each first sacrificial material layer 142 may be replaced with an optional portion of the backside blocking dielectric layer and a first electrically conductive layer 146, and each second sacrificial material layer 242 may be replaced with an optional portion of the backside blocking dielectric layer and a second electrically conductive layer 246. A backside cavity is present in the portion of each backside trench 79 that is not filled with the continuous metallic material layer.

Residual conductive material may be removed from inside the backside trenches 79 and from inside the moat trenches 179, and from above the contact-level dielectric layer 280 by an anisotropic process and/or an isotropic etch process. Each remaining portion of the deposited metallic material in the first backside recesses constitutes a first electrically conductive layer 146. Each remaining portion of the deposited metallic material in the second backside recesses constitutes a second electrically conductive layer 246. Sidewalls of the first electrically conductive layers 146 and the second electrically conductive layers 246 may be physically exposed to a respective backside trench 79. Each electrically conductive layer (146, 246) may be a conductive sheet including openings therein. Openings through each electrically conductive layer (146, 246) may be filled with memory opening fill structures 58.

A subset of the electrically conductive layers (146, 246) may comprise word lines for the memory elements. The semiconductor devices in the underlying semiconductor devices 720 may comprise word line switch devices configured to control a bias voltage to respective word lines, and/or bit line driver devices, such as sense amplifiers. The memory-level assembly is located over the substrate semiconductor layer 9. The memory-level assembly includes at least one alternating stack (132, 146, 232, 246) and memory stack structures 55 vertically extending through the at least one alternating stack (132, 146, 232, 246). Each of the memory stack structures 55 comprises a vertical stack of memory elements located at each level of the electrically conductive layers (146, 246).

Generally, the patterned portions of the first continuous sacrificial material layers 142L and the second continuous sacrificial material layers 242L are replaced with the electrically conductive layers (146, 246). A first-tier alternating stack of first insulating layers 132 and first electrically conductive layers 146 can be formed between each neighboring pair of backside trenches 79. The first insulating layers 132 comprise patterned portions of the first continuous insulating layers 132L, and the first electrically conductive layers 146 comprise the first subset of the electrically conductive layers (146, 246) and are interlaced with the first insulating layers 132. A second-tier alternating stack of second insulating layers 232 and second electrically conductive layers 246 is formed between the neighboring pair of backside trenches 79. The second insulating layers 232 comprise patterned portions of the second continuous insulating layers 232L, and the second electrically conductive layers 246 comprise a second subset of the electrically conductive layers (146, 246) that is interlaced with the second insulating layers 246.

Generally, the sacrificial material layers (142, 242) can be replaced with electrically conductive layers (146, 246) by providing an etchant that etches the sacrificial material layers (142, 242) into the backside trenches 79, and by providing a reactant that deposits the electrically conductive layers (146, 246) into the backside trenches 79 while the backside support pillar structures 22 and the support pillar structures 20 provide structural support to the insulating layers (132, 232). The backside support pillar structures 22 prevent the insulating layers (132, 232) from toppling into or leaning into the backside trenches 79 during and after formation of the backside recesses (143, 243).

FIGS. 17A-17F are horizontal cross-sectional views of various configurations of the exemplary structure of FIGS. 16A-16E at a height of a second insulating layer according to an aspect of the present disclosure.

Referring to FIG. 17A, the backside support pillar structures 22 may be formed at the processing steps of FIGS. 11A-11D with circular horizontal cross-sectional shapes, and two peripheral regions of each backside support pillar structure 22 may be etched during formation of the two-dimensional array of discrete backside trenches 79. The discrete backside trenches 79 may have a rectangular horizontal cross-sectional shape, and each backside support pillar structure 22 may have a pair of lateral recess regions in which the backside support pillar structures 22 is laterally recessed by a pair of discrete backside trenches 79.

Referring to FIG. 17B, the backside support pillar structures 22 may be formed at the processing steps of FIGS. 11A-11D with rectangular horizontal cross-sectional shapes, and two peripheral regions of each backside support pillar structure 22 may be etched during formation of the two-dimensional array of discrete backside trenches 79.

Referring to FIG. 17C, the backside support pillar structures 22 may be formed at the processing steps of FIGS. 11A-11D with elliptical horizontal cross-sectional shapes, and two peripheral regions of each backside support pillar structure 22 may be etched during formation of the two-dimensional array of discrete backside trenches 79.

Referring to FIG. 17D, the backside support pillar structures 22 may be formed at the processing steps of FIGS. 11A-11D with a lateral stagger along the second horizontal direction hd2 such that the geometrical centers of the backside support pillar structures 22 are alternately laterally offset in opposite directions along the second horizontal direction hd2 within each row of backside support pillar structures 22 that are arranged along the first horizontal direction hd1.

Figure 17E:
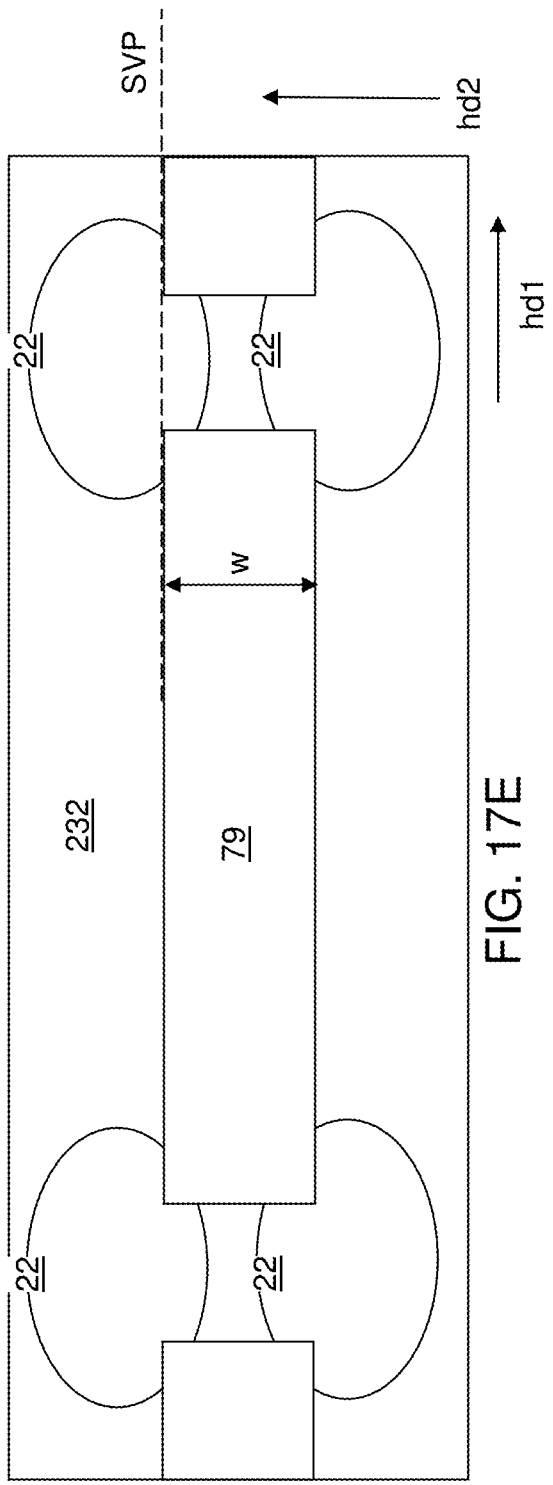

Referring to FIG. 17E, a pair of backside support pillar structures 22 that are laterally spaced apart along the second horizontal direction hd2 can be formed in lieu of each backside support pillar structure illustrated in FIGS. 17A-17D. In this case, each laterally alternating sequence of backside trenches 79 and backside support pillar structures 22 may comprise two rows of backside support pillar structures 22. Backside support pillar structures 22 within each row of backside support pillar structures 22 can be arranged along the first horizontal direction hd1, and the two rows of backside support pillar structures 22 are laterally spaced from each other along the second horizontal direction hd2. In one embodiment, each backside support pillar structure 22 may have a circular or elliptical horizontal cross-sectional shape at the processing steps of FIGS. 11A-11D, and may include a pair of latera recess regions upon formation of the discrete backside trenches 79.

Figure 17F:
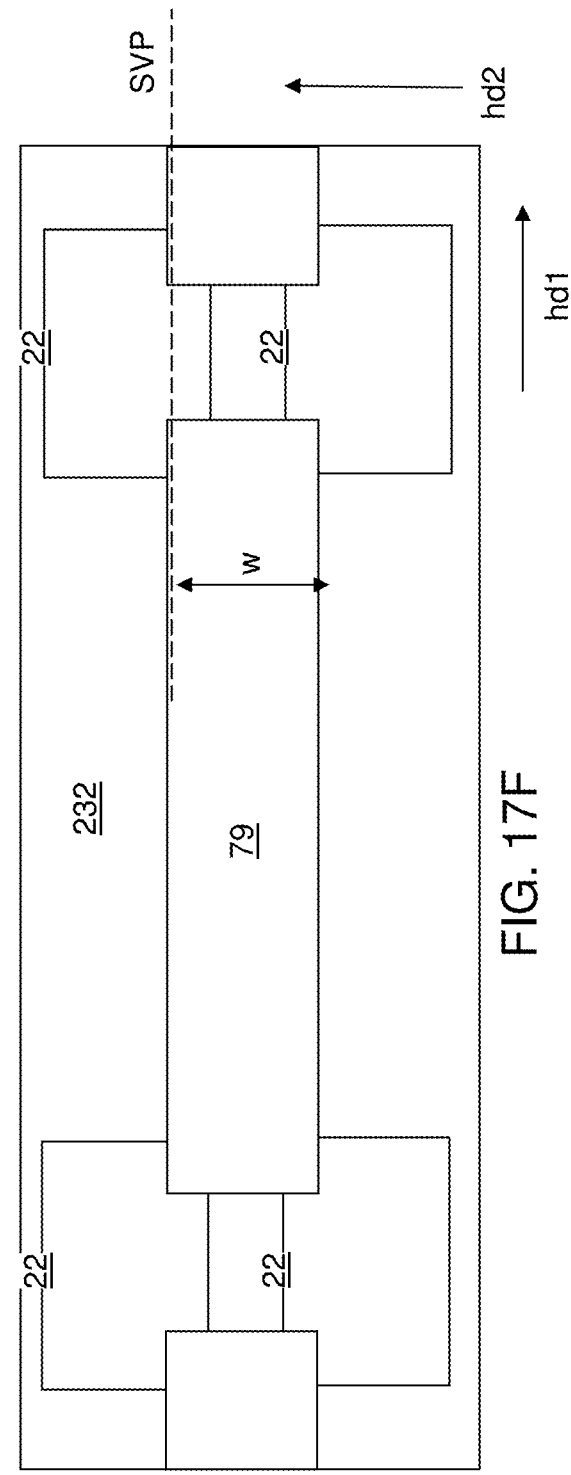
Figure 18A:
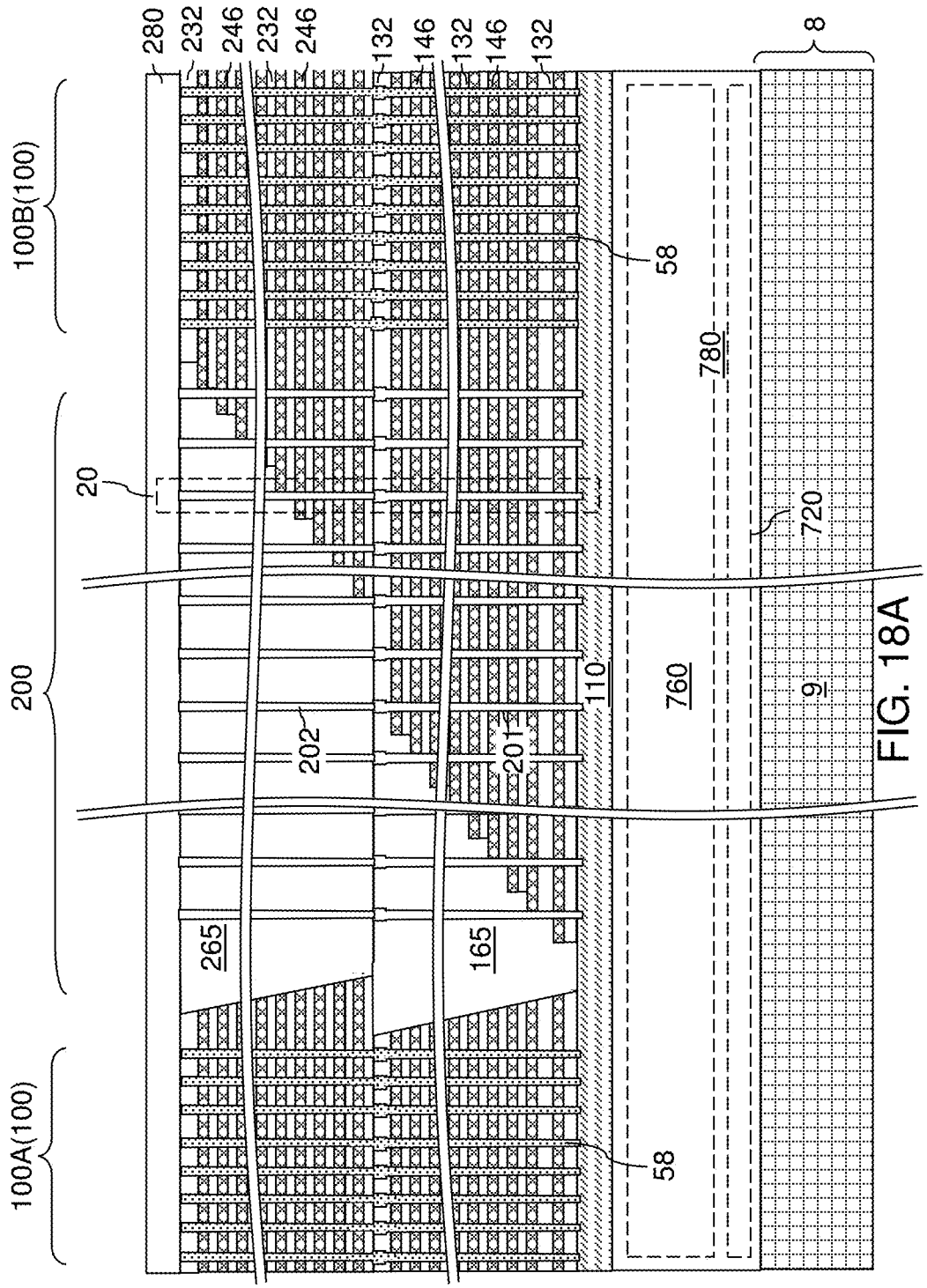
FIG. 18A is a vertical cross-sectional view of the exemplary structure after formation of backside dielectric isolation walls according to an embodiment of the present disclosure.
Figure 18B:
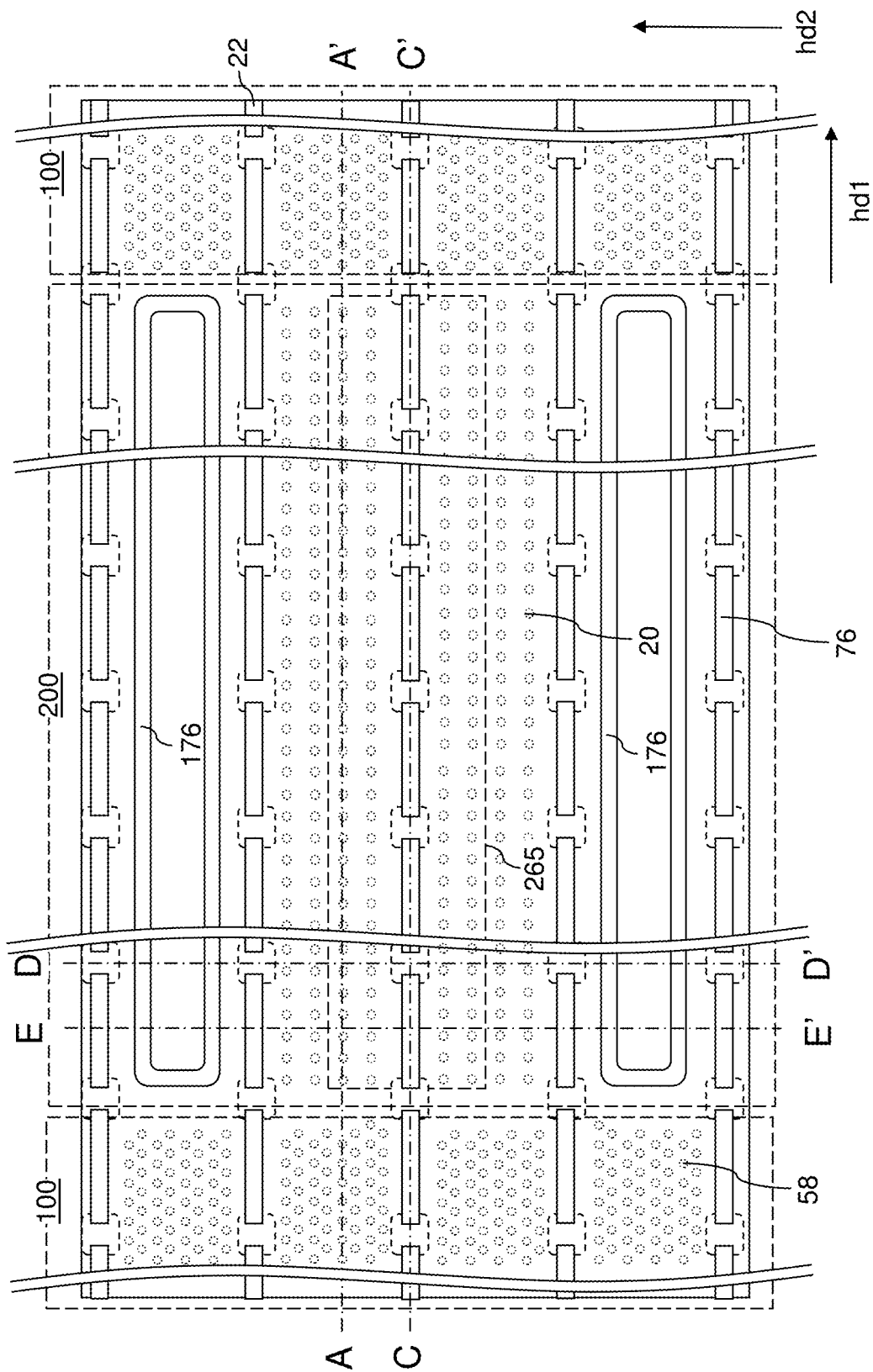
FIG. 18B is a top-down view of the exemplary structure of FIG. 18A. The vertical plane A-A' is the plane of the vertical cross-sectional view of FIG. 18A.
Figure 18C:
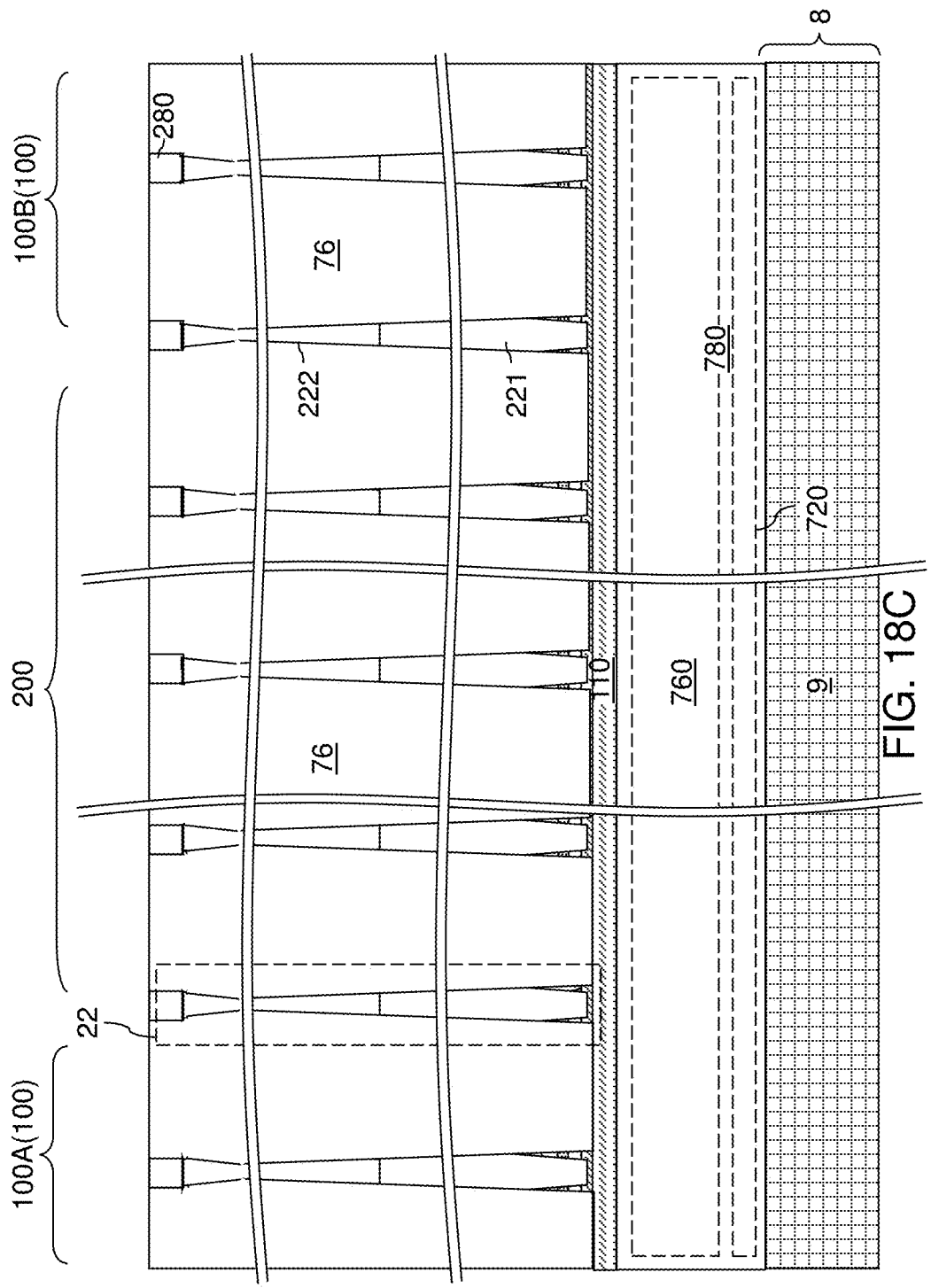
FIG. 18C is a vertical cross-sectional view of the exemplary structure along the vertical plane C-C' of FIG. 18B.
Figure 18D:
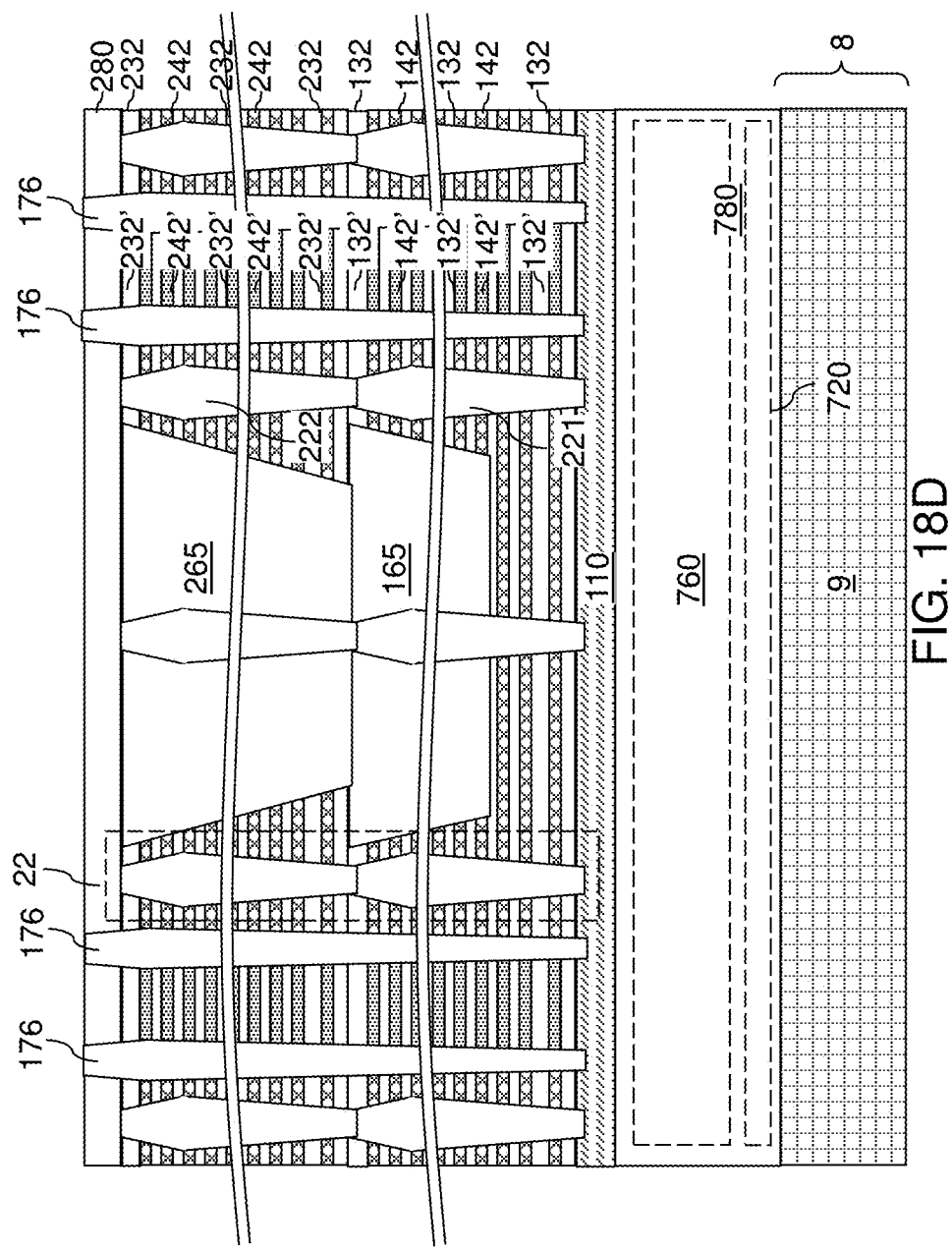
FIG. 18D is a vertical cross-sectional view of the exemplary structure along the vertical plane D-D' of FIG. 18B.
Figure 18E:
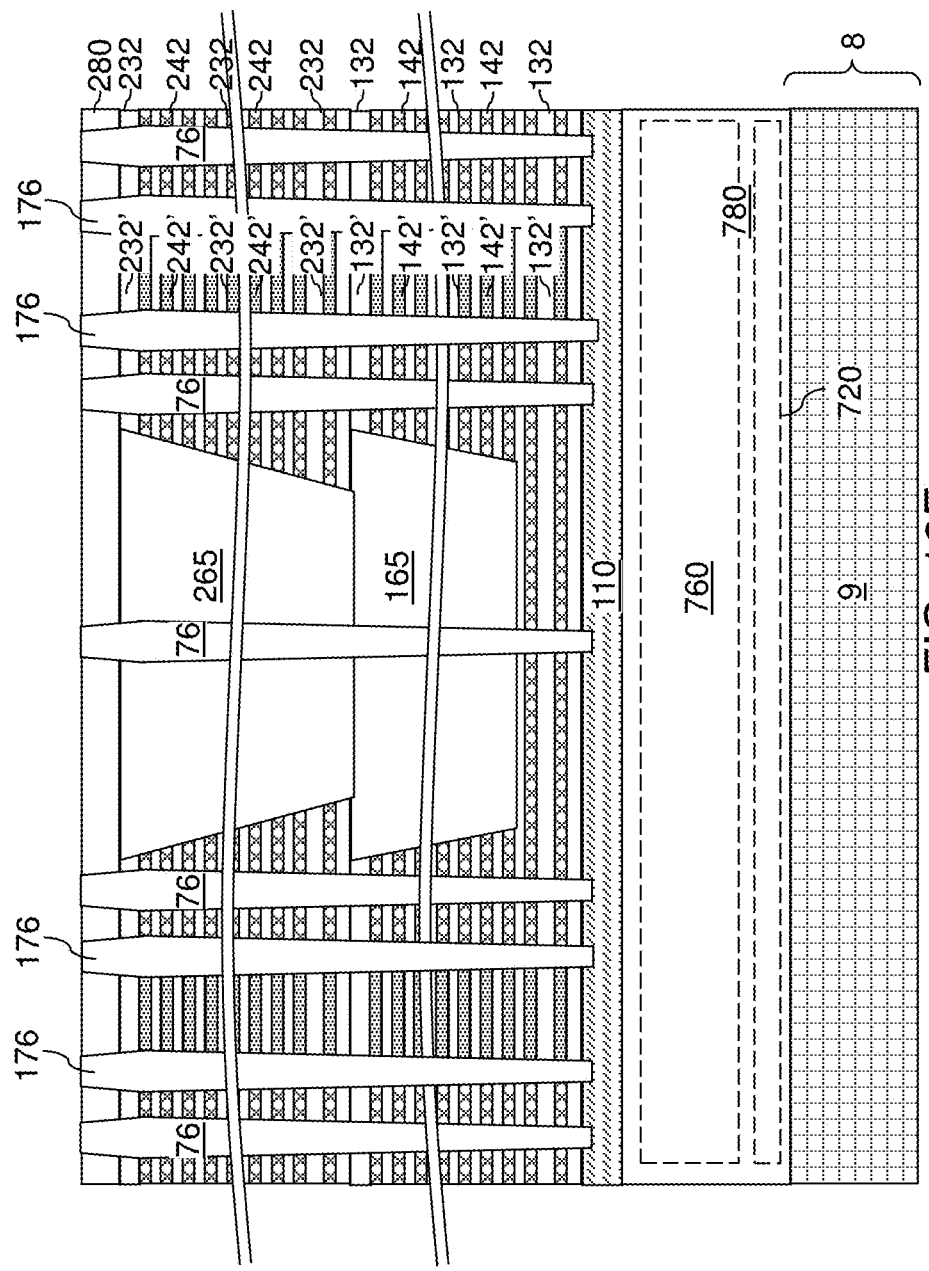
FIG. 18E is a vertical cross-sectional view of the exemplary structure along the vertical plane E-E' of FIG. 18B.
Figure 19A:
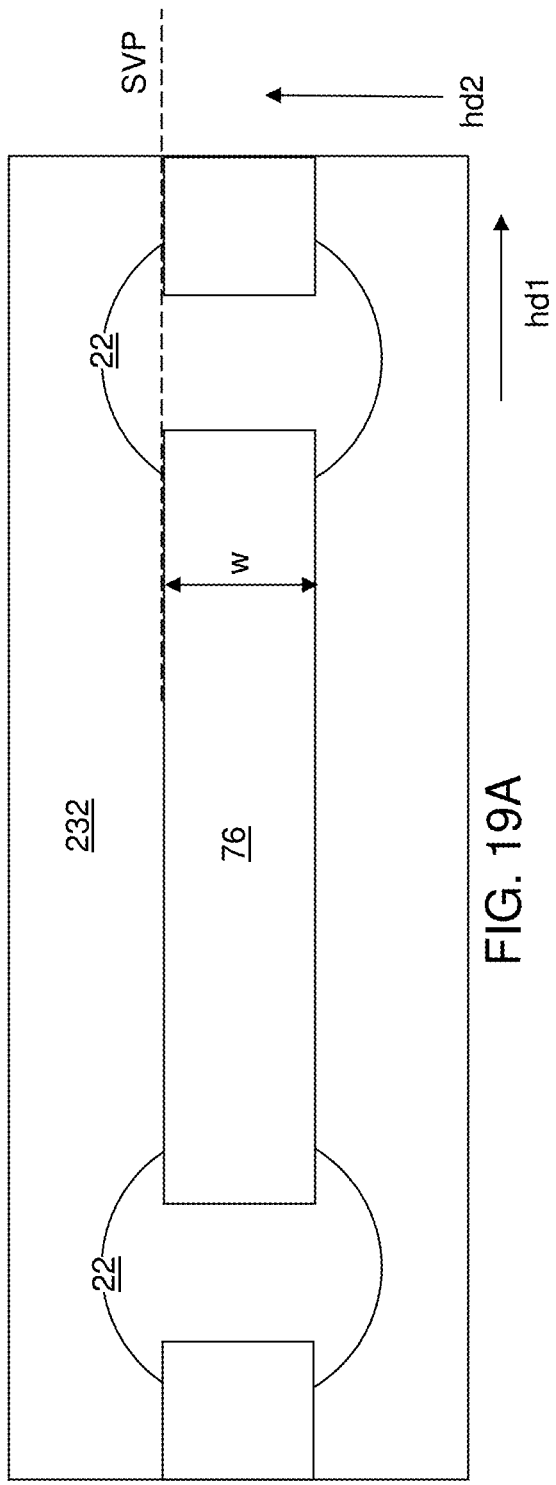
Figure 19B:
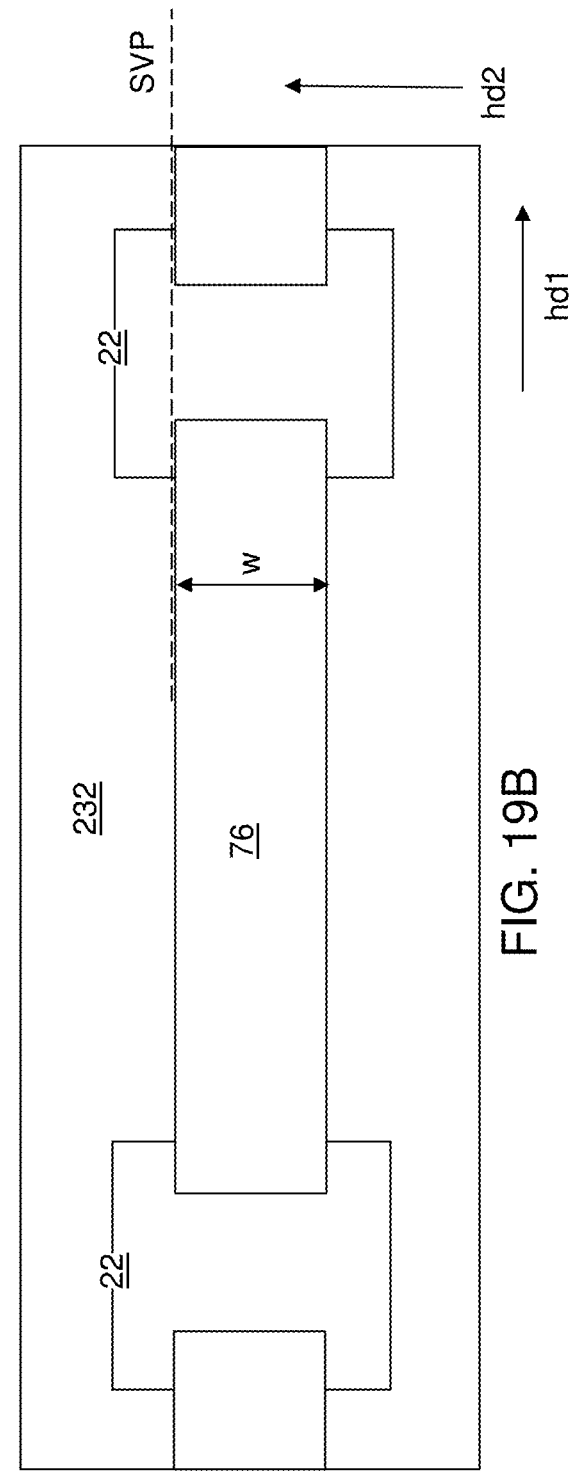
Figure 20A:
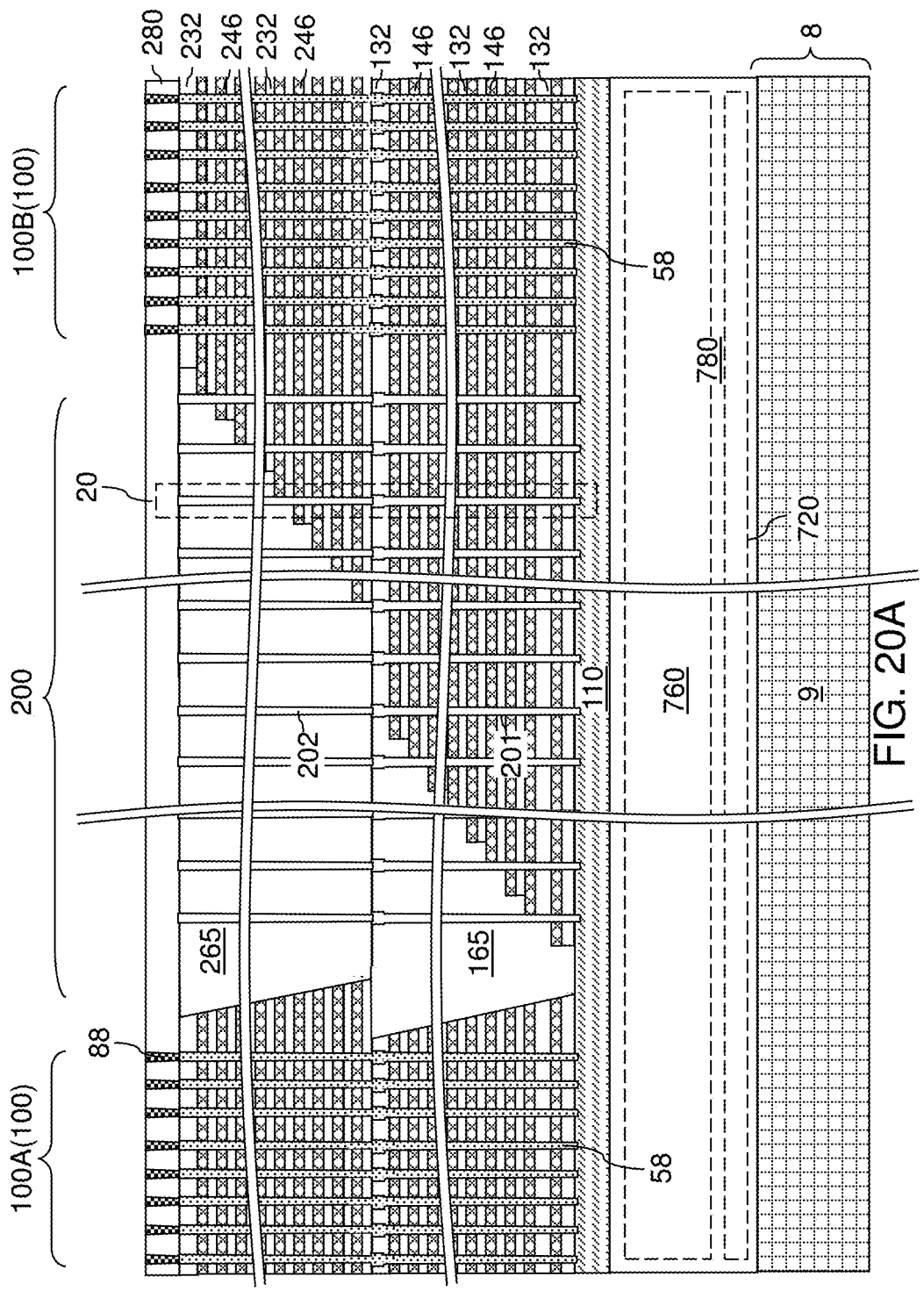
FIG. 20A is a vertical cross-sectional view of the exemplary structure after formation of various contact via structures according to an embodiment of the present disclosure.
Figure 20B:
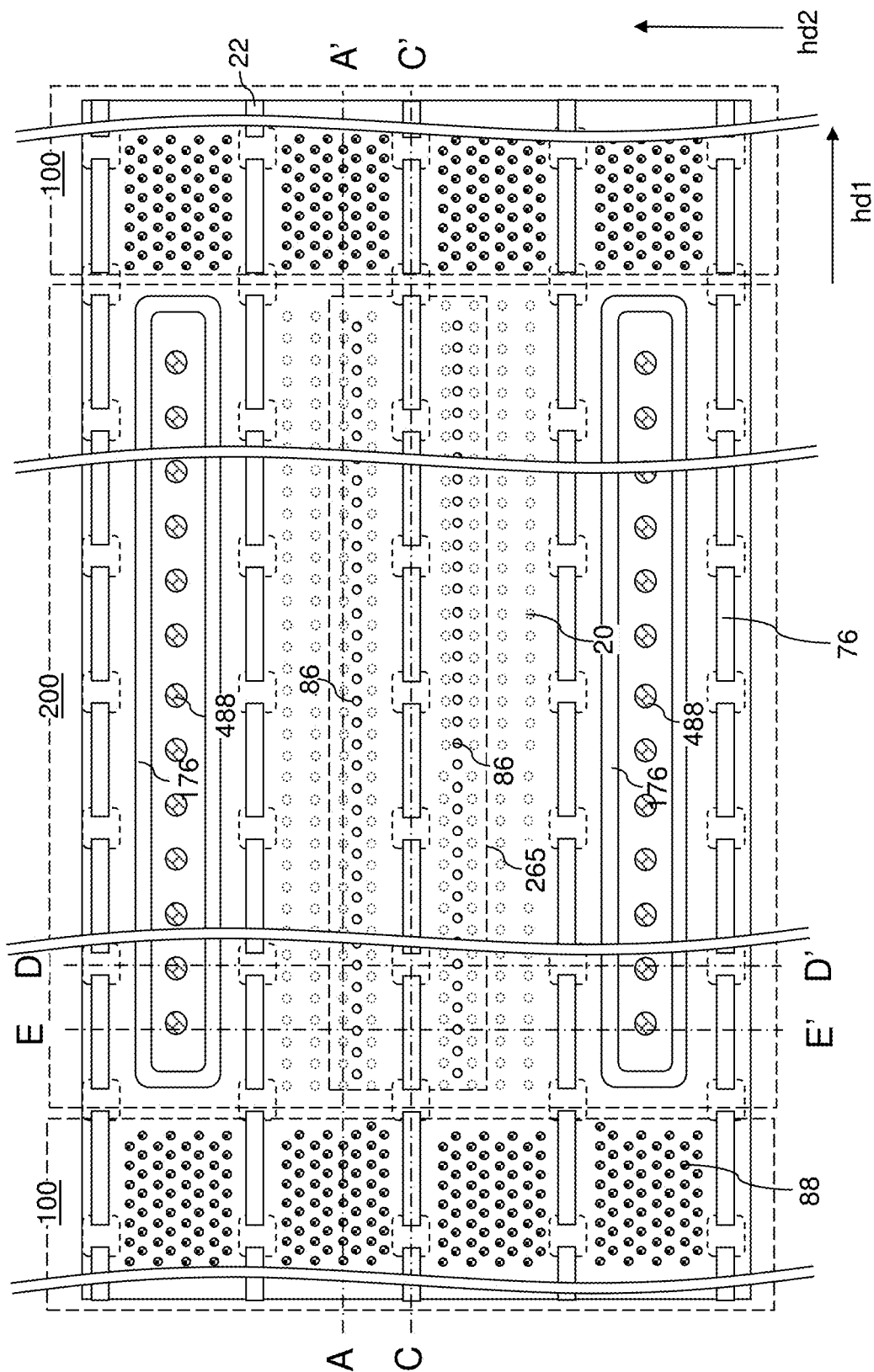
FIG. 20B is a top-down view of the exemplary structure of FIG. 20A. The vertical plane A-A' is the plane of the vertical cross-sectional view of FIG. 20A.
Figure 20D:
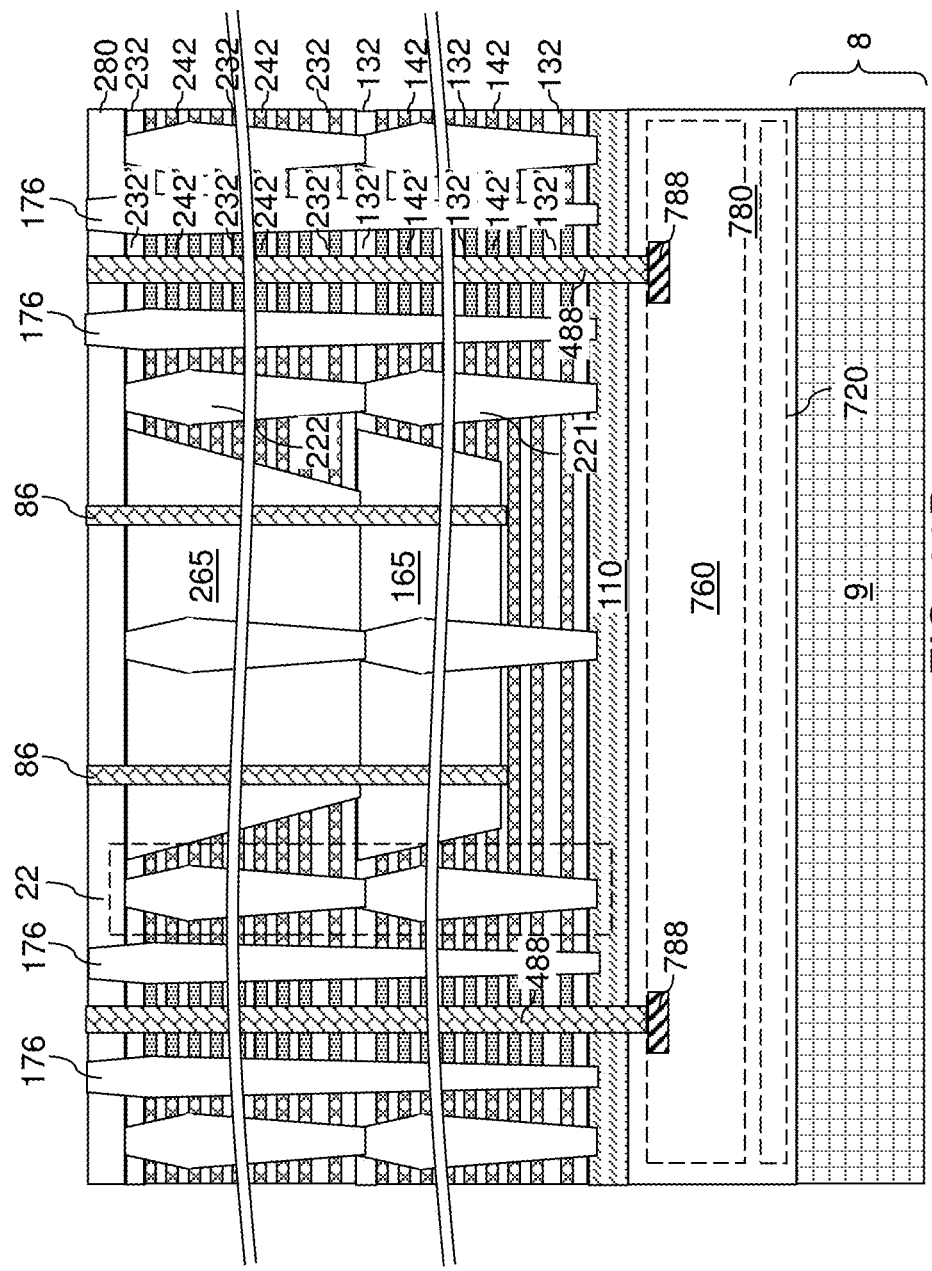
FIG. 20D is a vertical cross-sectional view of the exemplary structure along the vertical plane D-D' of FIG. 20B.
Figure 20E:
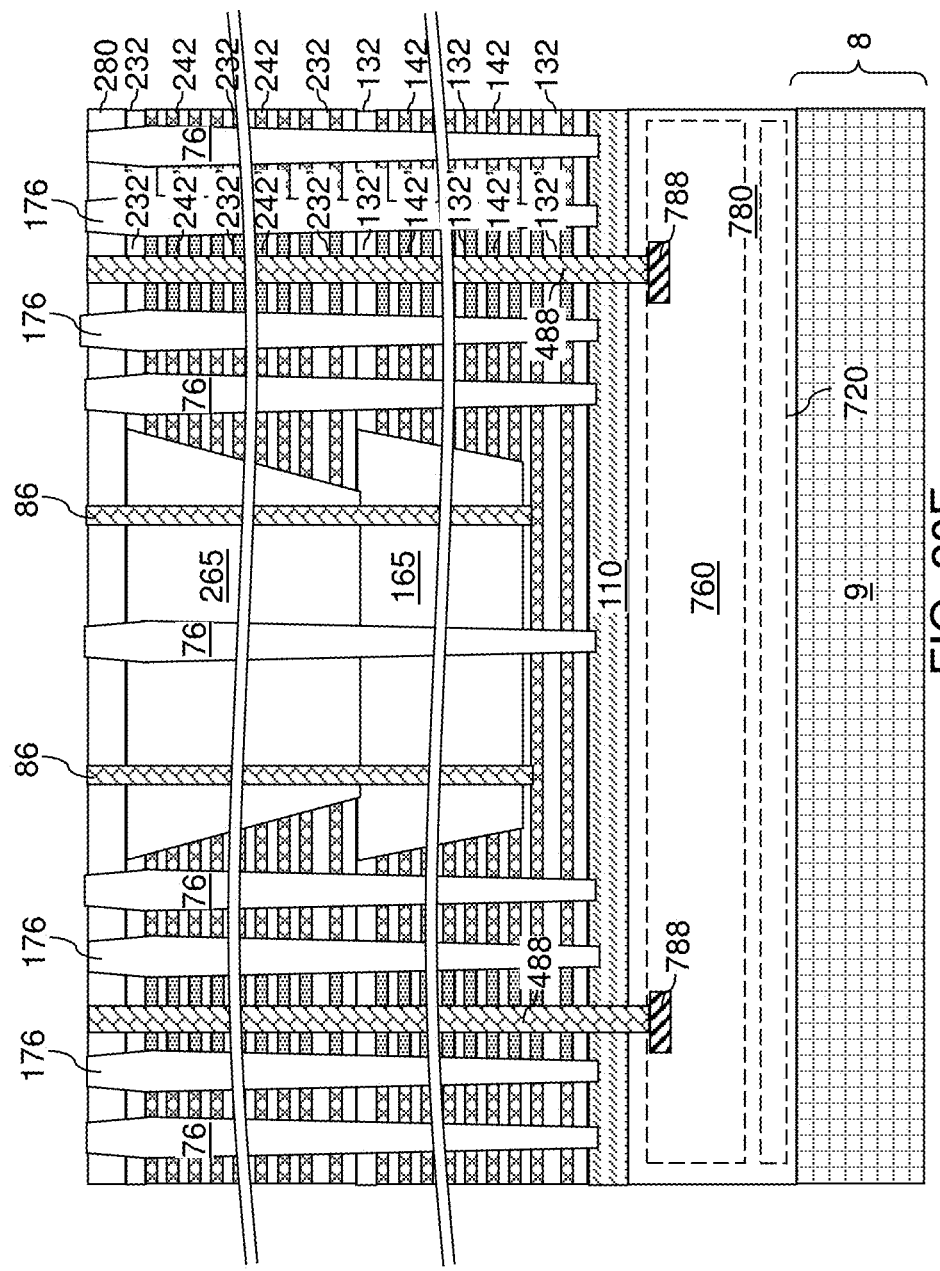
FIG. 20E is a vertical cross-sectional view of the exemplary structure along the vertical plane E-E' of FIG. 20B.

Referring to FIG. 17F, a pair of backside support pillar structures 22 that are laterally spaced apart along the second horizontal direction hd2 can be formed in lieu of each backside support pillar structure illustrated in FIGS. 17A-17D. In one embodiment, each backside support pillar structure 22 may have a rectangular horizontal cross-sectional shape at the processing steps of FIGS. 11A-11D, and may include a pair of latera recess regions upon formation of the discrete backside trenches 79.

Referring to FIGS. 18A-18E, a dielectric fill material such as silicon oxide can be deposited in the backside trenches 79 and the moat trenches 179 by a conformal deposition process such as a chemical vapor deposition process. Excess portions of the dielectric fill material may be removed from above the horizontal plane including the top surface of the contact-level dielectric layer 280 by a planarization process such as a recess etch process and/or a chemical mechanical polishing process. Each remaining portion of the dielectric fill material filling a respective backside trench comprises a backside dielectric isolation wall 76. Each remaining portion of the dielectric fill material filling a respective moat trench comprise a dielectric moat structure 176.

In one embodiment, top surfaces of the backside dielectric isolation walls 76 may be formed within a horizontal plane including a top surface of the contact-level dielectric layer 280. In one embodiment, each of the support pillar structures 20 may have a respective circular or elliptical horizontal cross-sectional shape, and each of the backside support pillar structures 22 may have a respective horizontal cross-sectional shape that contains two indentation regions in contact with a respective pair of backside dielectric isolation walls 76. Generally, the semiconductor material layer 110 may be located on, or within, the substrate 8, and can contact bottommost surfaces of the alternating stacks {(132, 146), (232, 246). Each of the backside dielectric isolation walls 76 and the backside support pillar structures 22 can contact the semiconductor material layer 110.

Generally, the backside dielectric isolation walls 76 and the dielectric moat structures 176 comprise a same dielectric material. The support pillar structures 20 and the backside support pillar structures 22 comprise a same dielectric material. The backside dielectric isolation walls 76 may comprise a different dielectric material than the backside support pillar structures 22, or may comprise a same dielectric material as the backside support pillar structures 22. In one embodiment, the contact-level dielectric layer 280 continuously extends over the alternating stacks {(132, 146), (232, 246)} as a continuous material layer. In one embodiment, each of the backside support pillar structures 22 has a top surface that contacts a respective portion of a bottom surface of the contact-level dielectric layer 280. In one embodiment, each of the backside dielectric isolation walls 76 has a top surface located within a horizontal plane including a top surface of the contact-level dielectric layer 280.

FIGS. 19A-19F are horizontal cross-sectional views of various configurations of the exemplary structure of FIGS. 18A-18E at a height of a second insulating layer according to an aspect of the present disclosure.

Referring collectively to FIGS. 19A-19E, each contiguous combination of backside dielectric isolation walls 76 and backside support pillar structures 22 constitutes a backside isolation assembly (76, 22) that divides, and is interposed between, a neighboring pair of alternating stacks of insulating layers (132, 232) and electrically conductive layers (146, 246). Each alternating stack may comprise a memory block, and the backside isolation assembly laterally separates adjacent memory blocks along the second horizontal direction hd2. Each of the backside isolation assemblies (76, 22) comprises a laterally alternating sequence of backside dielectric isolation walls 76 and backside support pillar structures 22. Each of the alternating stacks comprises a respective set of electrically conductive layers (146, 246) that laterally extend between a neighboring pair of backside isolation assemblies (76, 22) among the backside isolation assemblies (76, 22).

In some configurations, each laterally alternating sequence of backside dielectric isolation walls 76 and backside support pillar structures 22 comprises two rows of backside support pillar structures 22. In one embodiment, backside support pillar structures 22 within each row of backside support pillar structures 22 are arranged along the first horizontal direction hd1, and the two rows of backside support pillar structures 22 are laterally spaced from each other along the second horizontal direction hd2.

Referring to FIGS. 20A-20E, various contact via structures (88, 86, 488) can be formed in the exemplary structure. For example, drain contact via structures 88 can be formed through the contact-level dielectric layer 280 on a respective drain region 63. Layer contact via structures 86 can be formed through the contact-level dielectric layer 280 and the at least one retro-stepped dielectric material portion (165, 265) on a respective electrically conductive layer (146, 246). Through-memory-level contact via structures 488 can be formed through a respective vertically alternating stack of insulating plates (132', 232') and dielectric material plates (142', 242') on a respective metal pad 788, which is one of the lower-level metal interconnect structures 780. Bit lines (not shown for clarity) are then formed over and in electrical contact with the drain contact via structures 88. The bit lines may extend in the second horizontal direction hd2 and may be spaced apart along the first horizontal direction hd1.

Referring to all drawings and according to various embodiments of the present disclosure, a three-dimensional memory device is provided, which comprises: alternating stacks of insulating layers (132, 232) and electrically conductive layers (146, 246) located over a substrate 8, wherein the alternating stacks {(132, 146), (23, 246)} are laterally spaced apart from each other by backside isolation assemblies (76, 22) that laterally extend along a first horizontal direction hd1; and memory stack structures 55 that vertically extend through a respective one of the alternating stacks {(132, 146), (23, 246)}, and wherein each of the memory stack structures 55 comprises a respective vertical semiconductor channel 60 and a respective vertical stack of memory elements (such as portions of charge storage layers 54 located at levels of the electrically conductive layers (146, 246)), wherein: each of the backside isolation assemblies (76, 22) comprises a laterally alternating sequence of backside dielectric isolation walls 76 and backside support pillar structures 22; the backside dielectric isolation walls 76 have a respective pair of lengthwise sidewalls that are parallel to the first horizontal direction hd1 and laterally spaced apart along a second horizontal direction hd2 that is perpendicular to the first horizontal direction hd1; and the backside support pillar structures 22 contact indented sidewalls of a respective one of the alternating stacks {(132, 146), (23, 246)} that are laterally recessed along the second horizontal direction hd2 relative to a straight vertical plane SVP that includes interfaces between the backside dielectric isolation walls 76 and the respective one of the alternating stacks {(132, 146), (23, 246)} in the horizontal cross-sectional view.

In one embodiment, each of the backside support pillar structures 22 vertically extends at least between a first horizontal plane including bottommost surfaces of the alternating stacks {(132, 146), (23, 246)} and a second horizontal plane including topmost surfaces of the alternating stacks {(132, 146), (23, 246)}. In one embodiment, each of the backside dielectric isolation walls 76 vertically extends at least between the first horizontal plane and the second horizontal plane. Each of the backside dielectric isolation walls 76 has the respective pair of lengthwise sidewalls that are laterally spaced apart along the second horizontal direction by a uniform width W (which is invariant along the first horizontal direction hd1) in a horizontal cross-sectional view.

In one embodiment, each of the backside support pillar structures 22 has a lateral extent along the second horizontal direction hd2 that is greater than the uniform width W. In one embodiment, each of the backside support pillar structures 22 has a horizontal cross-sectional shape that includes: a pair of lateral protrusion regions that protrude outward along the second horizontal direction hd2; and a pair of lateral recess regions that are recessed inward along the first horizontal direction hd1 and contacting a respective pair of backside dielectric isolation walls 76. In one embodiment, each of the backside support pillar structures 22 contacts sidewalls of a neighboring pair of alternating stacks {(132, 146), (232, 246)} among the alternating stacks {(132, 146), (232, 246)}.

In one embodiment, each laterally alternating sequence of backside dielectric isolation walls 76 and backside support pillar structures 22 comprises two rows of backside support pillar structures 22; backside support pillar structures 22 within each row of backside support pillar structures 22 are arranged along the first horizontal direction hd1; and the two rows of backside support pillar structures 22 are laterally spaced from each other along the second horizontal direction hd2.

In one embodiment, each of the backside dielectric isolation walls 76 has a length along the first horizontal direction hd1 that is greater than its width (e.g., the uniform width W) along the second horizontal direction; and each of the alternating stacks {(132, 146), (232, 246)} comprises a respective set of electrically conductive layers (146, 246) that laterally extend between a neighboring pair of backside isolation assemblies (76, 22) among the backside isolation assemblies. (76, 22).

In one embodiment, the three-dimensional memory device comprises support pillar structures 20 vertically extending through a respective one of the alternating stacks {(132, 146), (232, 246)}, wherein the support pillar structures 200 comprise a same dielectric material as the backside support pillar structures 22. In one embodiment, each of the support pillar structures 20 has a respective circular or elliptical horizontal cross-sectional shape; and each of the backside support pillar structures 22 has a respective horizontal cross-sectional shape that contains two indentation regions in contact with a respective pair of backside dielectric isolation walls 76.

In one embodiment, the backside dielectric isolation walls 76 comprise a different dielectric material than the backside support pillar structures 22.

In one embodiment, the three-dimensional memory device comprises a semiconductor material layer 110 located on, or within, the substrate 8 and contacting bottommost surfaces of the alternating stacks {(132, 146), (232, 246)}, wherein each of the backside dielectric isolation walls 76 and the backside support pillar structures 22 contact the semiconductor material layer 110.

In one embodiment, the three-dimensional memory device comprise a contact-level dielectric layer 280 continuously extending over the alternating stacks {(132, 146), (232, 246)} as a continuous material layer, wherein: each of the backside support pillar structures 22 has a top surface that contacts a respective portion of a bottom surface of the contact-level dielectric layer 280; and each of the backside dielectric isolation walls 76 has a top surface located within a horizontal plane including a top surface of the contact-level dielectric layer 280.

Although the foregoing refers to particular embodiments, it will be understood that the disclosure is not so limited. It will occur to those of ordinary skill in the art that various modifications may be made to the disclosed embodiments and that such modifications are intended to be within the scope of the disclosure. Compatibility is presumed among all embodiments that are not alternatives of one another. The word "comprise" or "include" contemplates all embodiments in which the word "consist essentially of" or the word "consists of" replaces the word "comprise" or "include," unless explicitly stated otherwise. Where an embodiment using a particular structure and/or configuration is illustrated in the present disclosure, it is understood that the present disclosure may be practiced with any other compatible structures and/or configurations that are functionally equivalent provided that such substitutions are not explicitly forbidden or otherwise known to be impossible to one of ordinary skill in the art. All of the publications, patent applications and patents cited herein are incorporated herein by reference in their entirety.

What is claimed is:

1. A three-dimensional memory device, comprising:
alternating stacks of insulating layers and electrically conductive layers located over a substrate, wherein the alternating stacks are laterally spaced apart from each other by backside isolation assemblies that laterally extend along a first horizontal direction; and
memory stack structures that vertically extend through a respective one of the alternating stacks, and wherein each of the memory stack structures comprises a respective vertical semiconductor channel and a respective vertical stack of memory elements,
wherein:
each of the backside isolation assemblies comprises a laterally alternating sequence of backside dielectric isolation walls and backside support pillar structures;
the backside dielectric isolation walls have a respective pair of lengthwise sidewalls that are parallel to the first horizontal direction and laterally spaced apart along a second horizontal direction that is perpendicular to the first horizontal direction;
the backside support pillar structures contact indented sidewalls of a respective one of the alternating stacks that are laterally recessed along the second horizontal direction relative to a straight vertical plane that includes interfaces between the backside dielectric isolation walls and the respective one of the alternating stacks in the horizontal cross-sectional view;
each of the backside support pillar structures vertically extends at least between a first horizontal plane including bottommost surfaces of the alternating stacks and a second horizontal plane including topmost surfaces of the alternating stacks;
each of the backside dielectric isolation walls vertically extends at least between the first horizontal plane and the second horizontal plane;
each of the backside dielectric isolation walls has the respective pair of lengthwise sidewalls that are laterally spaced apart along the second horizontal direction by a uniform width in a horizontal cross-sectional view;
each of the backside support pillar structures has a lateral extent along the second horizontal direction that is greater than the uniform width; and
each of the backside support pillar structures has a horizontal cross-sectional shape that includes:
a pair of lateral protrusion regions that protrude outward along the second horizontal direction; and
a pair of lateral recess regions that are recessed inward along the first horizontal direction.

2. The three-dimensional memory device of claim 1, wherein each of the backside support pillar structures contacts sidewalls of a neighboring pair of alternating stacks of the alternating stacks.

3. A three-dimensional memory device, comprising:
alternating stacks of insulating layers and electrically conductive layers located over a substrate, wherein the alternating stacks are laterally spaced apart from each other by backside isolation assemblies that laterally extend along a first horizontal direction;
memory stack structures that vertically extend through a respective one of the alternating stacks, and wherein each of the memory stack structures comprises a respective vertical semiconductor channel and a respective vertical stack of memory elements; and
support pillar structures vertically extending through a respective one of the alternating stacks,
wherein:
each of the backside isolation assemblies comprises a laterally alternating sequence of backside dielectric isolation walls and backside support pillar structures;
the backside dielectric isolation walls have a respective pair of lengthwise sidewalls that are parallel to the first horizontal direction and laterally spaced apart along a second horizontal direction that is perpendicular to the first horizontal direction;
the backside support pillar structures contact indented sidewalls of a respective one of the alternating stacks that are laterally recessed along the second horizontal direction relative to a straight vertical plane that includes interfaces between the backside dielectric isolation walls and the respective one of the alternating stacks in the horizontal cross-sectional view;
the support pillar structures comprise a same dielectric material as the backside support pillar structures;
each of the support pillar structures has a respective circular or elliptical horizontal cross-sectional shape; and
each of the backside support pillar structures has a respective horizontal cross-sectional shape that contains two indentation regions in contact with a respective pair of backside dielectric isolation walls.

* * * * *